(12) United States Patent
Becker et al.

(10) Patent No.: US 8,207,053 B2
(45) Date of Patent: *Jun. 26, 2012

(54) ELECTRODES OF TRANSISTORS WITH AT LEAST TWO LINEAR-SHAPED CONDUCTIVE STRUCTURES OF DIFFERENT LENGTH

(75) Inventors: Scott T. Becker, San Jose, CA (US); Michael C. Smayling, San Jose, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 12/567,623

(22) Filed: Sep. 25, 2009

(65) Prior Publication Data

US 2010/0017767 A1     Jan. 21, 2010

Related U.S. Application Data

(63) Continuation of application No. 12/212,562, filed on Sep. 17, 2008, now Pat. No. 7,842,975, which is a continuation of application No. 11/683,402, filed on Mar. 7, 2007, now Pat. No. 7,446,352.

(60) Provisional application No. 60/781,288, filed on Mar. 9, 2006.

(51) Int. Cl.
*H01L 21/3205* (2006.01)
(52) U.S. Cl. .................. 438/587; 257/E21.176
(58) Field of Classification Search .................. 257/202, 257/204, 206, 211, 390, 909, E27.099, E21.661, 257/E21.176, E21.621, E21.635; 438/157, 438/176, 193, 275, 587, 622
See application file for complete search history.

(56) References Cited

U.S. PATENT DOCUMENTS

| | | | |
|---|---|---|---|
| 4,197,555 A | 4/1980 | Uehara et al. | 357/70 |
| 4,417,161 A | 11/1983 | Uya | |
| 4,424,460 A | 1/1984 | Best | |
| 4,682,202 A * | 7/1987 | Tanizawa | 257/204 |
| 5,097,422 A | 3/1992 | Corbin et al. | |

(Continued)

FOREIGN PATENT DOCUMENTS

EP         1394858         3/2004

(Continued)

OTHER PUBLICATIONS

Acar, et al., "A Linear-Centric Simulation Framework for Parametric Fluctuations", 2002, IEEE.

(Continued)

*Primary Examiner* — Quoc Hoang
(74) *Attorney, Agent, or Firm* — Martine Penilla Group, LLP

(57) ABSTRACT

A layout of a cell of a semiconductor device is disclosed to include a diffusion level layout including a plurality of diffusion region layout shapes. The layout of the cell also includes a gate electrode level layout is defined to include a number of linear-shaped layout features placed to extend in only a first parallel direction. Each of the number of the linear-shaped layout features within the gate electrode level layout of the restricted layout region is rectangular-shaped. The gate electrode level layout includes linear-shaped layout features defined along at least four different lines of extent in the first parallel direction. The layout of the cell also includes a number of interconnect level layouts each of which is defined to pattern conductive features within corresponding interconnect levels above the gate electrode level.

56 Claims, 21 Drawing Sheets

U.S. PATENT DOCUMENTS

| | | | |
|---|---|---|---|
| 5,121,186 A | 6/1992 | Wong et al. | |
| 5,208,765 A | 5/1993 | Turnbull | 364/552 |
| 5,224,057 A | 6/1993 | Igarashi. | |
| 5,242,770 A | 9/1993 | Chen et al. | |
| 5,378,649 A | 1/1995 | Huang | 437/52 |
| 5,471,403 A | 11/1995 | Fujimaga | 364/488 |
| 5,497,334 A | 3/1996 | Russell et al. | 364/489 |
| 5,497,337 A | 3/1996 | Ponnapalli et al. | 364/489 |
| 5,581,098 A | 12/1996 | Chang | 257/211 |
| 5,636,002 A | 6/1997 | Garofalo | |
| 5,682,323 A | 10/1997 | Pasch et al. | 364/491 |
| 5,684,733 A | 11/1997 | Wu et al. | 365/100 |
| 5,705,301 A | 1/1998 | Garza et al. | 430/5 |
| 5,723,883 A | 3/1998 | Gheewalla | |
| 5,740,068 A | 4/1998 | Liebmann et al. | |
| 5,745,374 A | 4/1998 | Matsumoto | |
| 5,790,417 A | 8/1998 | Chao et al. | 364/491 |
| 5,796,624 A | 8/1998 | Sridhar et al. | |
| 5,825,203 A | 10/1998 | Kusunoki et al. | 326/41 |
| 5,838,594 A | 11/1998 | Kojima | 364/578 |
| 5,841,663 A | 11/1998 | Sharma et al. | 364/490 |
| 5,847,421 A | 12/1998 | Yamaguchi | 257/207 |
| 5,852,562 A | 12/1998 | Shinomiya et al. | |
| 5,858,580 A | 1/1999 | Wang et al. | 430/5 |
| 5,898,194 A | 4/1999 | Gheewala | 257/206 |
| 5,900,340 A | 5/1999 | Reich et al. | 430/22 |
| 5,908,827 A | 6/1999 | Sirna | 514/12 |
| 5,923,059 A | 7/1999 | Gheewala | 257/204 |
| 5,929,469 A | 7/1999 | Mimoto et al. | |
| 5,935,763 A | 8/1999 | Caterer et al. | 430/313 |
| 5,973,507 A | 10/1999 | Yamazaki | |
| 5,977,305 A | 11/1999 | Wigler et al. | 530/350 |
| 6,009,251 A | 12/1999 | Ho et al. | 395/500 |
| 6,026,223 A | 2/2000 | Scepanovic et al. | |
| 6,037,617 A | 3/2000 | Kumagai | |
| 6,044,007 A | 3/2000 | Capodieci | 365/120 |
| 6,063,132 A | 5/2000 | DeCamp et al. | 716/5 |
| 6,084,437 A | 7/2000 | Sako | |
| 6,091,845 A | 7/2000 | Pierrat et al. | 382/144 |
| 6,099,584 A | 8/2000 | Arnold et al. | 716/19 |
| 6,100,025 A | 8/2000 | Wigler et al. | 435/6 |
| 6,114,071 A | 9/2000 | Chen et al. | |
| 6,166,415 A | 12/2000 | Sakemi et al. | |
| 6,174,742 B1 | 1/2001 | Sudhindranath et al. | 438/14 |
| 6,182,272 B1 | 1/2001 | Andreev et al. | 716/13 |
| 6,194,104 B1 | 2/2001 | Hsu | 430/5 |
| 6,194,252 B1 | 2/2001 | Yamaguchi | 438/129 |
| 6,194,912 B1 | 2/2001 | Or-Bach | 326/38 |
| 6,209,123 B1 | 3/2001 | Maziasz et al. | 716/14 |
| 6,230,299 B1 | 5/2001 | McSherry et al. | 716/1 |
| 6,232,173 B1 | 5/2001 | Hsu et al. | |
| 6,240,542 B1 | 5/2001 | Kapur | 716/12 |
| 6,249,902 B1 | 6/2001 | Igusa et al. | |
| 6,255,600 B1 | 7/2001 | Schaper | 174/255 |
| 6,262,487 B1 | 7/2001 | Igarashi et al. | 257/758 |
| 6,269,472 B1 | 7/2001 | Garza et al. | 716/21 |
| 6,275,973 B1 | 8/2001 | Wein | 716/10 |
| 6,282,696 B1 | 8/2001 | Garza et al. | 716/19 |
| 6,303,252 B1 | 10/2001 | Lin | |
| 6,331,733 B1 | 12/2001 | Or-Bach et al. | 257/758 |
| 6,335,250 B1 | 1/2002 | Egi | 438/300 |
| 6,338,972 B1 | 1/2002 | Sudhindranath et al. | 438/14 |
| 6,356,112 B1 | 3/2002 | Tran et al. | |
| 6,370,679 B1 | 4/2002 | Chang et al. | 716/19 |
| 6,378,110 B1 | 4/2002 | Ho | 716/5 |
| 6,388,296 B1 | 5/2002 | Hsu | 257/377 |
| 6,393,601 B1 | 5/2002 | Tanaka et al. | 716/2 |
| 6,415,421 B2 | 7/2002 | Anderson et al. | 716/4 |
| 6,416,907 B1 | 7/2002 | Winder et al. | 430/5 |
| 6,421,820 B1 | 7/2002 | Mansfield et al. | 716/21 |
| 6,425,112 B1 | 7/2002 | Bula et al. | 716/5 |
| 6,425,117 B1 | 7/2002 | Pasch et al. | 716/21 |
| 6,426,269 B1 | 7/2002 | Haffner et al. | 438/401 |
| 6,436,805 B1 | 8/2002 | Trivedi | |
| 6,470,489 B1 | 10/2002 | Chang et al. | 716/21 |
| 6,476,493 B2 | 11/2002 | Or-Bach et al. | 257/758 |
| 6,477,695 B1 | 11/2002 | Gandhi | 716/17 |
| 6,480,989 B2 | 11/2002 | Chan et al. | 716/8 |
| 6,492,066 B1 | 12/2002 | Capodieci et al. | 430/5 |
| 6,496,965 B1 | 12/2002 | van Ginneken et al. | 716/10 |
| 6,505,327 B2 | 1/2003 | Lin | 716/5 |
| 6,505,328 B1 | 1/2003 | van Ginneken et al. | 716/7 |
| 6,509,952 B1 | 1/2003 | Govil et al. | 355/52 |
| 6,514,849 B1 | 2/2003 | Hui et al. | 438/618 |
| 6,516,459 B1 | 2/2003 | Sahouria | 716/21 |
| 6,523,156 B2 | 2/2003 | Cirit | 716/9 |
| 6,525,350 B1 | 2/2003 | Kinoshita et al. | 257/202 |
| 6,536,028 B1 | 3/2003 | Katsioulas et al. | 716/17 |
| 6,543,039 B1 | 4/2003 | Watanabe | |
| 6,553,544 B2 | 4/2003 | Tanaka et al. | 716/3 |
| 6,553,559 B2 | 4/2003 | Liebmann et al. | 716/19 |
| 6,571,140 B1 | 5/2003 | Wewalaarachchi et al. | 700/83 |
| 6,571,379 B2 | 5/2003 | Takayama | 716/10 |
| 6,578,190 B2 | 6/2003 | Ferguson et al. | 716/21 |
| 6,588,005 B1 | 7/2003 | Kobayashi et al. | |
| 6,590,289 B2 | 7/2003 | Shively | 257/758 |
| 6,591,207 B2 | 7/2003 | Naya et al. | 702/81 |
| 6,609,235 B2 | 8/2003 | Ramaswamy et al. | 716/8 |
| 6,610,607 B1 | 8/2003 | Armbrust et al. | 438/717 |
| 6,620,561 B2 | 9/2003 | Winder et al. | 430/5 |
| 6,633,182 B2 | 10/2003 | Pileggi et al. | 326/41 |
| 6,635,935 B2 | 10/2003 | Makino | |
| 6,643,831 B2 | 11/2003 | Chang et al. | 716/4 |
| 6,650,014 B2 | 11/2003 | Kariyazaki | |
| 6,661,041 B2 | 12/2003 | Keeth | 257/211 |
| 6,662,350 B2 | 12/2003 | Fried et al. | |
| 6,673,638 B1 | 1/2004 | Bendik et al. | 438/14 |
| 6,687,895 B2 | 2/2004 | Zhang | 716/19 |
| 6,691,297 B1 | 2/2004 | Misaka et al. | 716/21 |
| 6,700,405 B1 | 3/2004 | Hirairi | |
| 6,714,903 B1 | 3/2004 | Chu et al. | 703/19 |
| 6,732,338 B2 | 5/2004 | Crouse et al. | 716/4 |
| 6,737,199 B1 | 5/2004 | Hsieh | 430/5 |
| 6,737,347 B1 | 5/2004 | Houston et al. | 438/633 |
| 6,745,372 B2 | 6/2004 | Cote et al. | 716/2 |
| 6,745,380 B2 | 6/2004 | Bodendorf et al. | |
| 6,749,972 B2 | 6/2004 | Yu | 430/5 |
| 6,760,269 B2 | 7/2004 | Nakase et al. | 365/210 |
| 6,765,245 B2 | 7/2004 | Bansal | |
| 6,777,138 B2 | 8/2004 | Pierrat et al. | 430/5 |
| 6,777,146 B1 | 8/2004 | Samuels | |
| 6,789,244 B1 | 9/2004 | Dasasathyan et al. | |
| 6,789,246 B1 | 9/2004 | Mohan et al. | 716/11 |
| 6,792,593 B2 | 9/2004 | Takashima et al. | 716/21 |
| 6,794,914 B2 | 9/2004 | Sani et al. | |
| 6,795,952 B1 | 9/2004 | Stine et al. | 716/5 |
| 6,795,953 B2 | 9/2004 | Bakarian et al. | 716/5 |
| 6,807,663 B2 | 10/2004 | Cote et al. | 716/21 |
| 6,819,136 B2 | 11/2004 | Or-Bach | 326/41 |
| 6,826,738 B2 | 11/2004 | Cadouri | 716/8 |
| 6,834,375 B1 | 12/2004 | Stine et al. | 716/2 |
| 6,841,880 B2 | 1/2005 | Matsumoto et al. | 257/773 |
| 6,850,854 B2 | 2/2005 | Naya et al. | 702/81 |
| 6,854,096 B2 | 2/2005 | Eaton et al. | 716/2 |
| 6,854,100 B1 | 2/2005 | Chuang et al. | 716/5 |
| 6,877,144 B1 | 4/2005 | Rittman et al. | 716/10 |
| 6,884,712 B2 | 4/2005 | Yelehanka et al. | 438/622 |
| 6,898,770 B2 | 5/2005 | Boluki et al. | 716/6 |
| 6,904,582 B1 | 6/2005 | Rittman et al. | 716/10 |
| 6,918,104 B2 | 7/2005 | Pierrat et al. | 716/19 |
| 6,920,079 B2 * | 7/2005 | Shibayama | 365/230.06 |
| 6,928,635 B2 | 8/2005 | Pramanik et al. | 716/21 |
| 6,931,617 B2 | 8/2005 | Sanie et al. | 716/18 |
| 6,953,956 B2 | 10/2005 | Or-Bach et al. | 257/203 |
| 6,954,918 B2 | 10/2005 | Houston | 716/10 |
| 6,957,402 B2 | 10/2005 | Templeton et al. | 716/2 |
| 6,968,527 B2 | 11/2005 | Pierrat | 716/19 |
| 6,978,436 B2 | 12/2005 | Cote et al. | 716/19 |
| 6,978,437 B1 | 12/2005 | Rittman et al. | 716/21 |
| 6,992,394 B2 | 1/2006 | Park | |
| 6,992,925 B2 | 1/2006 | Peng | 365/177 |
| 6,993,741 B2 | 1/2006 | Liebmann et al. | 716/19 |
| 6,994,939 B1 | 2/2006 | Ghandehari et al. | |
| 7,016,214 B2 | 3/2006 | Kawamata | |
| 7,028,285 B2 | 4/2006 | Cote et al. | 716/21 |
| 7,041,568 B2 | 5/2006 | Goldbach et al. | 438/387 |
| 7,052,972 B2 | 5/2006 | Sandhu et al. | 438/445 |

| Patent No. | Date | Inventor | Class |
|---|---|---|---|
| 7,063,920 B2 | 6/2006 | Baba-Ali | 430/5 |
| 7,064,068 B2 | 6/2006 | Chou et al. | 438/687 |
| 7,065,731 B2 | 6/2006 | Jacques et al. | 716/13 |
| 7,079,989 B2 | 7/2006 | Wimer | 703/1 |
| 7,093,208 B2 | 8/2006 | Williams et al. | 716/3 |
| 7,093,228 B2 | 8/2006 | Andreev et al. | 716/21 |
| 7,103,870 B2 | 9/2006 | Misaka et al. | 716/21 |
| 7,105,871 B2 | 9/2006 | Or-Bach et al. | 257/203 |
| 7,107,551 B1 | 9/2006 | de Dood et al. | 716/2 |
| 7,115,343 B2 | 10/2006 | Gordon et al. | |
| 7,115,920 B2 | 10/2006 | Bernstein et al. | |
| 7,120,882 B2 | 10/2006 | Kotani et al. | 716/5 |
| 7,124,386 B2 | 10/2006 | Smith et al. | 716/10 |
| 7,132,203 B2 | 11/2006 | Pierrat | 430/5 |
| 7,137,092 B2 | 11/2006 | Maeda | 716/8 |
| 7,149,999 B2 | 12/2006 | Kahng et al. | 716/19 |
| 7,152,215 B2 | 12/2006 | Smith et al. | 716/4 |
| 7,155,685 B2 | 12/2006 | Mori et al. | 716/2 |
| 7,155,689 B2 | 12/2006 | Pierrat et al. | 716/4 |
| 7,159,197 B2 | 1/2007 | Falbo et al. | 716/4 |
| 7,174,520 B2 | 2/2007 | White et al. | 716/4 |
| 7,175,940 B2 | 2/2007 | Laidig et al. | 430/5 |
| 7,185,294 B2 | 2/2007 | Zhang | 716/2 |
| 7,188,322 B2 | 3/2007 | Cohn et al. | |
| 7,194,712 B2 | 3/2007 | Wu | 716/5 |
| 7,200,835 B2 | 4/2007 | Zhang et al. | |
| 7,202,517 B2 | 4/2007 | Dixit et al. | |
| 7,219,326 B2 | 5/2007 | Reed et al. | 716/18 |
| 7,225,423 B2 | 5/2007 | Bhattacharya et al. | 716/18 |
| 7,227,183 B2 | 6/2007 | Donze et al. | 257/48 |
| 7,231,628 B2 | 6/2007 | Pack et al. | 716/19 |
| 7,243,316 B2 | 7/2007 | White et al. | |
| 7,252,909 B2 | 8/2007 | Shin et al. | 430/5 |
| 7,264,990 B2 | 9/2007 | Rueckes et al. | 438/99 |
| 7,278,118 B2 | 10/2007 | Pileggi et al. | 716/1 |
| 7,287,320 B2 | 10/2007 | Wang et al. | 29/834 |
| 7,294,534 B2 | 11/2007 | Iwaki | 438/129 |
| 7,302,651 B2 | 11/2007 | Allen et al. | 716/3 |
| 7,308,669 B2 | 12/2007 | Buehler et al. | |
| 7,335,966 B2 | 2/2008 | Ihme et al. | 257/532 |
| 7,338,896 B2 | 3/2008 | Vanhaelemeersch et al. | 438/638 |
| 7,346,885 B2 | 3/2008 | Semmler | |
| 7,350,183 B2 | 3/2008 | Cui et al. | 716/21 |
| 7,353,492 B2 | 4/2008 | Gupta et al. | 716/19 |
| 7,360,179 B2 | 4/2008 | Smith et al. | 716/2 |
| 7,360,198 B2 | 4/2008 | Rana et al. | 716/18 |
| 7,366,997 B1 | 4/2008 | Rahmat et al. | 716/1 |
| 7,367,008 B2 | 4/2008 | White et al. | 716/19 |
| 7,376,931 B2 | 5/2008 | Kokubun | |
| 7,383,521 B2 | 6/2008 | Smith et al. | 716/6 |
| 7,397,260 B2 | 7/2008 | Chanda et al. | |
| 7,400,627 B2 | 7/2008 | Wu et al. | 370/392 |
| 7,404,173 B2 | 7/2008 | Wu et al. | 716/19 |
| 7,411,252 B2 | 8/2008 | Anderson et al. | |
| 7,421,678 B2 | 9/2008 | Barnes et al. | 716/21 |
| 7,423,298 B2 | 9/2008 | Mariyama et al. | |
| 7,424,694 B2 | 9/2008 | Ikeda | 716/6 |
| 7,426,710 B2 | 9/2008 | Zhang et al. | 716/17 |
| 7,434,185 B2 | 10/2008 | Dooling et al. | |
| 7,441,211 B1 | 10/2008 | Gupta et al. | 716/2 |
| 7,444,609 B2 | 10/2008 | Charlebois et al. | 716/10 |
| 7,446,352 B2 * | 11/2008 | Becker et al. | 257/296 |
| 7,449,371 B2 | 11/2008 | Kemerling et al. | 438/128 |
| 7,458,045 B2 | 11/2008 | Cote et al. | 716/5 |
| 7,465,973 B2 | 12/2008 | Chang et al. | 257/206 |
| 7,466,607 B2 | 12/2008 | Hollis et al. | 365/189.19 |
| 7,480,880 B2 | 1/2009 | Visweswariah et al. | 716/6 |
| 7,480,891 B2 | 1/2009 | Sezginer | |
| 7,484,197 B2 | 1/2009 | Allen et al. | 716/10 |
| 7,487,475 B1 | 2/2009 | Kriplani et al. | 716/4 |
| 7,506,300 B2 | 3/2009 | Sezginer et al. | 716/19 |
| 7,509,621 B2 | 3/2009 | Melvin, III | 716/21 |
| 7,509,622 B2 | 3/2009 | Sinha et al. | 716/21 |
| 7,512,921 B2 | 3/2009 | Shibuya | |
| 7,514,959 B2 | 4/2009 | Or-Bach et al. | 326/39 |
| 7,523,429 B2 | 4/2009 | Kroyan et al. | 716/9 |
| 7,563,701 B2 | 7/2009 | Chang et al. | 438/597 |
| 7,568,174 B2 | 7/2009 | Sezginer et al. | |
| 7,569,310 B2 | 8/2009 | Wallace et al. | |
| 7,614,030 B2 | 11/2009 | Hsu | |
| 7,632,610 B2 | 12/2009 | Wallace et al. | |
| 7,665,051 B2 | 2/2010 | Ludwig et al. | |
| 7,712,056 B2 | 5/2010 | White et al. | |
| 7,770,144 B2 | 8/2010 | Dellinger | |
| 7,802,219 B2 | 9/2010 | Tomar et al. | |
| 7,825,437 B2 | 11/2010 | Pillarisetty et al. | |
| 7,898,040 B2 | 3/2011 | Nawaz | |
| 7,917,877 B2 | 3/2011 | Singh et al. | |
| 7,923,266 B2 | 4/2011 | Thijs et al. | |
| 7,923,337 B2 | 4/2011 | Chang et al. | |
| 7,962,867 B2 | 6/2011 | White et al. | |
| 7,971,160 B2 | 6/2011 | Osawa et al. | |
| 7,992,122 B1 | 8/2011 | Burstein et al. | |
| 7,994,583 B2 | 8/2011 | Inaba | |
| 8,004,042 B2 | 8/2011 | Yang et al. | |
| 2003/0042930 A1 | 3/2003 | Pileggi et al. | |
| 2003/0061592 A1 | 3/2003 | Agrawal et al. | 716/19 |
| 2003/0088839 A1 | 5/2003 | Watanabe | |
| 2003/0088842 A1 | 5/2003 | Cirit | 716/9 |
| 2003/0145299 A1 | 7/2003 | Fried et al. | |
| 2003/0229868 A1 | 12/2003 | White et al. | |
| 2003/0229875 A1 | 12/2003 | Smith et al. | 716/10 |
| 2004/0049754 A1 | 3/2004 | Liao et al. | 716/8 |
| 2004/0145028 A1 | 7/2004 | Matsumoto et al. | |
| 2004/0153979 A1 | 8/2004 | Chang | |
| 2004/0161878 A1 | 8/2004 | Or-Bach et al. | |
| 2004/0229135 A1 | 11/2004 | Wang et al. | |
| 2004/0243966 A1 | 12/2004 | Dellinger | 716/17 |
| 2005/0055828 A1 | 3/2005 | Wang et al. | |
| 2005/0087806 A1 | 4/2005 | Hokazono | |
| 2005/0093147 A1 | 5/2005 | Tu | |
| 2005/0101112 A1 | 5/2005 | Rueckes et al. | |
| 2005/0136340 A1 | 6/2005 | Baselmans et al. | |
| 2005/0138598 A1 | 6/2005 | Kokubun | |
| 2005/0185325 A1 | 8/2005 | Hur | |
| 2005/0189614 A1 | 9/2005 | Ihme et al. | |
| 2005/0196685 A1 | 9/2005 | Wang et al. | |
| 2005/0224982 A1 | 10/2005 | Kemerling et al. | |
| 2005/0229130 A1 | 10/2005 | Wu et al. | |
| 2005/0251771 A1 | 11/2005 | Robles | 716/5 |
| 2005/0268256 A1 | 12/2005 | Tsai et al. | 716/4 |
| 2006/0070018 A1 | 3/2006 | Semmler | |
| 2006/0084261 A1 | 4/2006 | Iwaki | |
| 2006/0101370 A1 | 5/2006 | Cui et al. | 716/19 |
| 2006/0112355 A1 | 5/2006 | Pileggi et al. | |
| 2006/0121715 A1 | 6/2006 | Chang et al. | |
| 2006/0125024 A1 | 6/2006 | Ishigaki | 257/390 |
| 2006/0151810 A1 | 7/2006 | Ohshige | 257/207 |
| 2006/0158270 A1 | 7/2006 | Gibet et al. | |
| 2006/0177744 A1 | 8/2006 | Bodendorf et al. | |
| 2006/0181310 A1 | 8/2006 | Rhee | |
| 2006/0197557 A1 | 9/2006 | Chung | |
| 2006/0206854 A1 | 9/2006 | Barnes et al. | 716/21 |
| 2006/0223302 A1 | 10/2006 | Chang et al. | |
| 2006/0248495 A1 | 11/2006 | Sezginer | |
| 2007/0038973 A1 | 2/2007 | Li et al. | 716/21 |
| 2007/0074145 A1 | 3/2007 | Tanaka | 716/21 |
| 2007/0094634 A1 | 4/2007 | Seizginer et al. | |
| 2007/0101305 A1 | 5/2007 | Smith et al. | 716/8 |
| 2007/0106971 A1 | 5/2007 | Lien et al. | |
| 2007/0113216 A1 | 5/2007 | Zhang | |
| 2007/0209029 A1 | 9/2007 | Ivonin et al. | 716/19 |
| 2007/0210391 A1 | 9/2007 | Becker et al. | |
| 2007/0234252 A1 | 10/2007 | Visweswariah et al. | 716/6 |
| 2007/0256039 A1 | 11/2007 | White | 716/4 |
| 2007/0274140 A1 | 11/2007 | Joshi et al. | |
| 2007/0294652 A1 | 12/2007 | Bowen | |
| 2008/0005712 A1 | 1/2008 | Charlebois et al. | 716/10 |
| 2008/0046846 A1 | 2/2008 | Chew et al. | 716/2 |
| 2008/0082952 A1 | 4/2008 | O'Brien | |
| 2008/0098334 A1 | 4/2008 | Pileggi et al. | 716/1 |
| 2008/0099795 A1 | 5/2008 | Bernstein et al. | |
| 2008/0127029 A1 | 5/2008 | Graur et al. | 716/21 |
| 2008/0144361 A1 | 6/2008 | Wong | 365/154 |
| 2008/0148216 A1 | 6/2008 | Chan et al. | 716/19 |
| 2008/0163141 A1 | 7/2008 | Scheffer et al. | 716/5 |
| 2008/0168406 A1 | 7/2008 | Rahmat et al. | 716/2 |
| 2008/0216207 A1 | 9/2008 | Tsai | |

| | | | | | |
|---|---|---|---|---|---|
| 2008/0276105 A1 | 11/2008 | Hoberman et al. ............ 713/300 | 2011/0154281 A1 | 6/2011 | Zach |
| 2008/0283910 A1 | 11/2008 | Dreeskornfeld et al. | 2011/0207298 A1 | 8/2011 | Anderson et al. |
| 2008/0308848 A1 | 12/2008 | Inaba | 2011/0260253 A1 | 10/2011 | Inaba |
| 2009/0014811 A1 | 1/2009 | Becker et al. | | | |
| 2009/0024974 A1 | 1/2009 | Yamada ........................... 716/6 | | | |
| 2009/0031261 A1 | 1/2009 | Smith et al. | | | |
| 2009/0032898 A1 | 2/2009 | Becker et al. | | | |
| 2009/0032967 A1 | 2/2009 | Becker et al. | | | |
| 2009/0037864 A1 | 2/2009 | Becker et al. | | | |
| 2009/0077524 A1 | 3/2009 | Nagamura ...................... 716/19 | | | |
| 2009/0101940 A1 | 4/2009 | Barrows et al. | | | |
| 2009/0106714 A1 | 4/2009 | Culp et al. ......................... 716/5 | | | |
| 2009/0228853 A1 | 9/2009 | Hong et al. | | | |
| 2009/0280582 A1 | 11/2009 | Thijs et al. | | | |
| 2009/0302372 A1 | 12/2009 | Chang et al. | | | |
| 2010/0001321 A1 | 1/2010 | Becker et al. | | | |
| 2010/0006897 A1 | 1/2010 | Becker et al. | | | |
| 2010/0006898 A1 | 1/2010 | Becker et al. | | | |
| 2010/0006899 A1 | 1/2010 | Becker et al. | | | |
| 2010/0006900 A1 | 1/2010 | Becker et al. | | | |
| 2010/0006901 A1 | 1/2010 | Becker et al. | | | |
| 2010/0006902 A1 | 1/2010 | Becker et al. | | | |
| 2010/0006903 A1 | 1/2010 | Becker et al. | | | |
| 2010/0006947 A1 | 1/2010 | Becker et al. | | | |
| 2010/0006948 A1 | 1/2010 | Becker et al. | | | |
| 2010/0006950 A1 | 1/2010 | Becker et al. | | | |
| 2010/0006951 A1 | 1/2010 | Becker et al. | | | |
| 2010/0006986 A1 | 1/2010 | Becker et al. | | | |
| 2010/0011327 A1 | 1/2010 | Becker et al. | | | |
| 2010/0011328 A1 | 1/2010 | Becker et al. | | | |
| 2010/0011329 A1 | 1/2010 | Becker et al. | | | |
| 2010/0011330 A1 | 1/2010 | Becker et al. | | | |
| 2010/0011331 A1 | 1/2010 | Becker et al. | | | |
| 2010/0011332 A1 | 1/2010 | Becker et al. | | | |
| 2010/0011333 A1 | 1/2010 | Becker et al. | | | |
| 2010/0012981 A1 | 1/2010 | Becker et al. | | | |
| 2010/0012982 A1 | 1/2010 | Becker et al. | | | |
| 2010/0012983 A1 | 1/2010 | Becker et al. | | | |
| 2010/0012984 A1 | 1/2010 | Becker et al. | | | |
| 2010/0012985 A1 | 1/2010 | Becker et al. | | | |
| 2010/0012986 A1 | 1/2010 | Becker et al. | | | |
| 2010/0017766 A1 | 1/2010 | Becker et al. | | | |
| 2010/0017767 A1 | 1/2010 | Becker et al. | | | |
| 2010/0017768 A1 | 1/2010 | Becker et al. | | | |
| 2010/0017769 A1 | 1/2010 | Becker et al. | | | |
| 2010/0017770 A1 | 1/2010 | Becker et al. | | | |
| 2010/0017771 A1 | 1/2010 | Becker et al. | | | |
| 2010/0017772 A1 | 1/2010 | Becker et al. | | | |
| 2010/0019280 A1* | 1/2010 | Becker et al. ................. 257/208 | | | |
| 2010/0019281 A1* | 1/2010 | Becker et al. ................. 257/208 | | | |
| 2010/0019282 A1* | 1/2010 | Becker et al. ................. 257/208 | | | |
| 2010/0019283 A1 | 1/2010 | Becker et al. | | | |
| 2010/0019284 A1 | 1/2010 | Becker et al. | | | |
| 2010/0019285 A1 | 1/2010 | Becker et al. | | | |
| 2010/0019286 A1 | 1/2010 | Becker et al. | | | |
| 2010/0019287 A1 | 1/2010 | Becker et al. | | | |
| 2010/0019288 A1 | 1/2010 | Becker et al. | | | |
| 2010/0019308 A1 | 1/2010 | Chan et al. | | | |
| 2010/0023906 A1 | 1/2010 | Becker et al. | | | |
| 2010/0023907 A1 | 1/2010 | Becker et al. | | | |
| 2010/0023908 A1 | 1/2010 | Becker et al. | | | |
| 2010/0023911 A1 | 1/2010 | Becker et al. | | | |
| 2010/0025731 A1 | 2/2010 | Becker et al. | | | |
| 2010/0025732 A1 | 2/2010 | Becker et al. | | | |
| 2010/0025733 A1 | 2/2010 | Becker et al. | | | |
| 2010/0025734 A1 | 2/2010 | Becker et al. | | | |
| 2010/0025735 A1 | 2/2010 | Becker et al. | | | |
| 2010/0025736 A1 | 2/2010 | Becker et al. | | | |
| 2010/0032722 A1 | 2/2010 | Becker et al. | | | |
| 2010/0032723 A1 | 2/2010 | Becker et al. | | | |
| 2010/0032724 A1 | 2/2010 | Becker et al. | | | |
| 2010/0032726 A1 | 2/2010 | Becker et al. | | | |
| 2010/0037194 A1 | 2/2010 | Becker et al. | | | |
| 2010/0037195 A1 | 2/2010 | Becker et al. | | | |
| 2010/0096671 A1 | 4/2010 | Becker et al. | | | |
| 2010/0203689 A1 | 8/2010 | Bernstein et al. | | | |
| 2010/0232212 A1 | 9/2010 | Anderson et al. | | | |

FOREIGN PATENT DOCUMENTS

| | | |
|---|---|---|
| EP | 1670062 | 6/2006 |
| FR | 2860920 | 4/2005 |
| JP | 10-116911 | 5/1998 |
| JP | 2002-258463 | 9/2002 |
| KR | 10-1999-0057943 A | 7/1999 |
| KR | 10-2000-0028830 A | 5/2000 |
| KR | 10-2005-0030347 A | 3/2005 |
| WO | WO 2005/104356 | 11/2005 |
| WO | WO 2006/014849 | 2/2006 |
| WO | WO 2006/052738 | 5/2006 |
| WO | WO 2007/103587 | 9/2007 |

OTHER PUBLICATIONS

Amazawa, et al., "Fully Planarized Four-Level Interconnection with Stacked VLAS Using CMP of Selective CVD-A1 and Insulator and its Application to Quarter Micron Gate Array LSIs", 1995, IEEE.

Axelrad et al. "Efficient Fuoo-Chip Yield Analysis Methodology for OPC-Corrected VLSI Design", 2000, International Symposium on Quality Electronic Design (ISQED).

Balasinski et al. "Impact of Subwavelength CD Tolerance on Device Performance", 2002, SPIE.

Burkhardt, et al., "Dark Field Double Dipole Lithography (DDL) for Back-End-Of-Line Processes", 2007, SPIE proceeding Series.

Capetti, et al., "Sub k1 = 0.25 Lithography with Double Patterning Technique for 45nm Technology Node Flash Memory Devices at λ= 193nm", 2007, SPIE Proceeding Seriees.

Chandra, et al., "An Interconnect Channel Design Methodology for High Performance Integrated Circuits", 2004, IEEE.

Cheng, et al., "Feasibility Study of Splitting Pitch Technology on 45nm Contact Paterning with 0.93 NA", 2007, SPIE Proceeding Series.

Chow, et al., "The Design of a SRAM-Based Field-Programmable Gate Array—Part II: Circuit Design and Layout", 1999, IEEE.

Clark et al. "Managing Standby and Active Mode Leakage Power in Deep Sub-Micron Design", Aug. 9-11, 2004, ACM.

Cobb et al. "Using OPC to Optimize for Image Slope and Improve Process Window", 2003, SPIE.

Devgan "Leakage Issues in IC Design: Part 3", 2003, CCAD.

DeVor, et al., "Statistical Quality Design and Control", 1992 Macmillian Publishing Company.

Dusa, et al., "Pitch Doubling Through Dual Patterning Lithography Challenges in Integration and Litho Budgets", 2007, SPIE Proceeding Series.

El-Gamal, "Fast, Cheap and Under Control: The Next Implementation Fabric", Jun. 2-6, 2003, ACM Press.

Frankel, "Quantum State Control Interference Lithography and Trim Double Patterning for 32-16nm Lithography", 2007, SPIE Proceeding Series.

Grobman et al. "Reticle Enhancement Technology Trends: Resource and Manufacturability Implications for the Implementation of Physical Designs" Apr. 1-4, 2001, ACM.

Grobman et al. "Reticle Enhancement Technology: Implications and Challenges for Physical Design" Jun. 18-22, 2001, ACM.

Gupta et al. "Enhanced Resist and Etch CD Control by Design Perturbation", Oct. 4-7, 2006, Society of Photo-Optical Instrumentation Engineers.

Gupta et al. "A Practical Transistor-Level Dual Threshold Voltage Assignment Methodology", 2005, Sixth International Symposium on Quality Electronic Design (ISQED).

Gupta et al. "Detailed Placement for Improved Depthof Focus and CD Control", 2005, ACM.

Gupta et al. "Joining the Design and Mask Flows for Better and Cheaper Masks", Oct. 14-17, 2004, Society of Photo-Optical Instrumentation Engineers.

Gupta et al. "Manufacturing-Aware Physical Design", 2003, ACM.

Gupta et al. "Selective Gate-Length Biasing for Cost-Effective Runtime Leakage Control", Jun. 7-11, 2004, ACM.

Gupta et al. "Wafer Topography-Aware Optical Proximity Correction for Better DOF Margin and CD Control", Apr. 13-15, 2005, SPIE.

Hayashida, et al., "Manufactuable Local Interconnect technology Fully Compatible with Titanium Salicide Process", Jun. 11-12, 1991, VMIC Conference.

Heng, et al., "A VLSI Artwork Legalization Technique Base on a New Criterion of Minimum Layout Perturbation", 1997, ACM Press.

Heng, et al., "Toward Through-Process Layout Quality Metrics", Mar. 3-4, 2005, Society of Photo-Optical Instrumentation Engineers.

Hu, et al., "Synthesis and Placemant Flow for Gain-Based Programmable Regular Fabrics", Apr. 6-9, 2003, ACM Press.

Hutton, et al., "A Methodology for FPGA to Structured-ASIC Synthesis and Verification", 2006, EDAA.

Jayakumar, et al., "A Metal and VIA Maskset Programmable VLSI Design Methodology using PLAs", 2004, IEEE.

Jhaveri et al., "Maximization of Payout Printability / Manufacturability by Extreme Layout Regularity", Proc. of the SPIE, Apr. 2006.

Kang, "Metal-Metal Matrix (M3) for High-Speed MOS VLSI Layout", IEEE Trans. on CAD, vol. CAD-6, No. 5, Sep. 1987.

Kheterpal, et al., "Design Methodology for IC Manufacturability Based on Regular Logic-Bricks", Jun. 7-11, 2004, DAC ACM Press.

Kheterpal, et al., "Routing Architecture Exploration for Regular Fabrics", Jun. 13-17, 2005, DAC IEEE/ACM Press.

Kim, et al., "Double Exposure Using 193nm Negative Tone Photoresist", 2007, SPIE Proceeding Series.

Kim, et al., "Issues and Challenges of Double Patterning Lithography in DRAM", 2007, SPIE Proceeding Series.

Koorapaty, et al., "Exploring Logic Block Granularity for Regular Fabrics", 2004, IEEE.

Koorapaty, et al., "Heterogeneous Logic Block Architectures for Via-Patterned Programmable Fabric, 13th International Conference on Field Programmable Logic and Applications (FPL) 2003, Lecture Notes in Computer Science (LNCS)", Sep. 1, 2003, Springer-Verlag.

Koorapaty, et al., "Modular, Fabric-Specific Synthesis for Progammable Architectures, 12th International Conference on Field Programmable Logic and Applications (FPL_2002, Lecture Notes in Computer Science (LNCS)", Sep. 1, 2002, IEEE.

Lavin et al. "Backend DAC Flows for "Restrictive Design Rules"", 2004, IEEE.

Li, et al., "A Linear-Centric Modeling Approach to Harmonic Balance Analysis", 2002, IEEE.

Li, et al., "Nonlinear Distortion Analysis Via Linear-Centric Models", 2003, IEEE.

Liebmann et al., "Integrating DfM Components Into a Cohesive Design-To-Silicon Solution", date unkown, IBM Systems and Technoloy Group, b IBM Research.

Liebmann, "Layout Impact of Resolution Enhancement Techniques: Impediment or Opportunity", International Symposium on Physical Design, 2003.

Liebmann, et al., "High-Performance Circuit Design for the RET-Enabled 65nm Technology Node", Feb. 26-27, 2004, SPIE Proceeding Series.

Liu, et al., "Double Patterning with Multilayer Hard Misk Shrinkage for Sub-0.25 kl Lithography", 2007, SPIE Proceeding Series.

Miller, "Manufacturing-Aware Design Helps Boost IC Yield", Sep. 9, 2004, http://www.eetimes.com/showArticle.jhtml?articleID=47102054.

Mo, et al., "Checkerboard: A Regular Structure and its Synthesis, International Workshop on Logic and Synthesis", 2003, Department of Electrical Engineering and Computer Sciences, UC Berkeley.

Mo, et al., "PLA-Based Regular Structures and Their Synthesis", 2003, Department of Electrical Engineering and Computer Sciences, UC Berkeley, IEEE.

Mo, et al., "Regular Farbrics in Deep Sub-Micron Integrated-Circuit Design", 2004, Kluwer Academic Publishers.

Mutoh et al. "1-V Power Supply High-Speed Digital Circuit Technology with Multithreshold-Voltage CMOS", 1995, IEEE.

Op de Beek, et al., "Manufacturability issues with Double Patterning for 50nm half pitch damscene applications, using RELACS® shrink and corresponding OPC", 2007, SPIE Proceeding Series.

Or-Bach, "Programmable Circuit Fabrics", Sep. 18, 2001, e-ASIC.

Otten, et al., "Planning for Performance", 1998, DAC, ACM Inc.

Pack et al. "Physical & Timing Verification of Subwavelength-Scale Designs—Part I: Lithography Impact on MOSFETs", 2003, SPIE.

Pandini, et al., "Congestion-Aware Logic Synthesis", 2002, IEEE.

Pandini, et al., "Understanding and Addressing the Impact of Wiring Congestion During Technology Mapping", Apr. 7-10, 2002, ISPD/ACM Press.

Patel, et al., "An Architectural Exploration of Via Patterned Gate Arrays, ISPD 2003", Apr. 6, 2003.

Pileggi, et al., "Exploring Regular Fabrics to Optimize the Performance-Cost Trade-Offs, Proceedings of the 40th ACM/IEEE Design Automation Conference (DAC) 2003", Jun. 1, 2003, ACM Press.

Poonawala, et al., "ILT for Double Exposure Lithography with Conventional and Novel Materials", 2007, SPIE Proceeding Series.

Qian et al. "Advanced Physical Models for Makd Data Verification and iMpacts on Physical Layout Synthesis" 2003. IEEE.

Ran, et al., "An Integrated Design Flow for a Via-Configurable Gate Array", 2004, IEEE.

Ran, et al., "Designing a Via-Configurable Regular Fabric", Custom Integrated Circuits Coference (CICC), Oct. 1, 2004, IEEE.

Ran, et al., "On Designing Via-Configurable Cell Blocks for Regular Fabrics", Jun. 1, 2004, Proceedings of the Design Automation Conference, (DAC), ACM Press.

Ran, et al., "The Magic of a Via-Configurable Regular Fabric", Oct. 1, 2004, Proceedings of the IEEE International Conference on Computer Design (ICCD).

Ran, et al., "Via-Configurable Routing Architectures and Fast Design Mappability Estimation for Regular Fabrics", 2005, IEEE.

Reis, et al., "Physical Design Methodologies for Performance Predictability and Manufacturability", Apr. 14-16, 2004, ACM Press.

Robertson, et al., "The Modeling of Double Patterning Lithographic Processes", 2007, SPIE Proceedin Series.

Rovner, "Design for Manufacturability in Via Programmable Gate Arrays", May 1, 2003, Graduate School of Carnegie Mellon University.

Sengupta, "An Integrated CAD Framework Linking VLSI Layout Editors and Process Simulators", 1998, Thesis for Rice University.

Sengupta, et al., "An Integrated CAD Framework Linking VLSI Layout Editors and Process Simulators", 1996, SPIE Proceeding Series.

Sherlekar, "Design Considerations for Regular Fabrics", Apr. 18-21, 2004, ACM Press.

Sreedhar et al. "Statistical Yield Modeling for Sub-Wavelength Lithography", 2008, IEEE.

Stapper, "Modeling of Defects in Integrated Circuit Photolithographic Patterns", Jul. 1, 1984, IBM.

Taylor, et al., "Enabling Energy Efficiency in Via-Patterned Gate Array Devices", Jun. 7-11, 2004, ACM Press.

Tian et al. "Model-Based Bummy Feature Placement for Oxide Chemical_Mechanical Polishing Manufacturability" 2000, ACM.

Tong, et al., "Regular Logic Fabrics for a Via Patterned Gate Array (VPGA), Custom Integrated Circuits Conference", Sep. 1, 2003, Proceedings of the IEEE.

Vanleenhove, et al., "A Litho-Only Approach to Double Patterning", 2007, SPIE Proceeding Series.

Wang et al., "Standard Cell Layout with Regular Contact Placement", IEEE Trans. On Semicon Mfg. vol. 17, No. 3, Aug. 2004.

Wenren, et al., "The Improvement of Photolithographic Fidelity of Two-dimensional Structures Though Double Exposure Method", 2007, SPIE Proceeding Series.

Wilcox, et al., "Design for Manufacturability: A Key to Semiconductor Manufacturing Excellence", 1998, IEEE.

Wu, et al., "A Study of Process Window Capabilities for Two-dimensional Structures under Double Exposure Condition", 2007, SPIE Proceeding Series.

Xiong, et al., "The Constrained Via Minimization Problem for PCB and VLSI Design", 1998, ACM Press/IEEE.

Yamamaoto, et al., "New Double Exposure Technique without Alternating Phase Shift Mask", 2007, SPIE Proceeding Series.

Yang, et al., "Interconnection Driven VLSI Module Placement Based on Quadratic Programming and Considering Congestion Using LFF Principles", 2004, IEEE.

Yao, et al., "Multilevel Routing With Redundant Via Insertion", Oct. 1, 2006, IEEE.

Zheng, et al., "Modeling and Analysis of Regular Symmetrically Structured Power/Ground Distribution Networks", DAC, Jun. 10-14, 2002, ACM Press.

Zhu, et al., "A Stochastic Integral Equation Method for Modeling the Rough Surface Effect on Interconnect Capacitance", 2004, IEEE.

Zhu, et al., "A Study of Double Exposure Process Design with Balanced Performance Parameters for Line/Space Applications", 2007, SPIE Proceeding Series.

Zuchowski, et al., "A Hybrid ASIC and FPGA Architecture", 2003, IEEE.

Wang, et al., "Performance Optimization for Gridded-Layout Standard Cells", 2004, vol. 5567 SPIE.

Garg, et al. "Lithography Driven Layout Design", 2005, IEEE.

Webb, Clair, "Layout Rule Trends and Affect upon CPU Design", 2006, vol. 6156 SPIE.

U.S. Appl. No. 60/625,342, filed May 25, 2006, Pileggi et al.

Intel Core Microarchitecture White Paper "Introducing the 45 nm Next-Generation Intel Core Microarchitecture," 2007, Intel Corporation.

Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.

Webb, Clair, "45nm Design for Manufacturing," Intel Technology Journal, vol. 12, Issue 02, Jun. 17, 2008, ISSN 1535-864X, pp. 121-130.

Capodieci, L., et al., "Toward a Methodology for Manufacturability-Driven Design Rule Exploration," DAC 2004, Jun. 7-11, 2004, San Diego, CA.

Gupta, Puneet, et al., "Manufacturing-aware Design Methodology for Assist Feature Correctness," 2005.

Ha et al., "Reduction in the Mask Error Factor by Optimizing the Diffraction Order of a Scattering Bar in Lithography," Journal of the Korean Physical Society, vol. 46, No. 5, May 2005, pp. 1213-1217.

Halpin et al., "Detailed Placement with Net Length Constraints," Publication Year 2003, Proceedings of the 3rd IEEE International Workshop on System-on-Chip for Real-Time Applications, pp. 22-27.

Hur et al., "Mongrel: Hybrid Techniques for Standard Cell Placement," Publication Year 2000, IEEE/ACM International Conference on Computer Aided Design, ICCAD-2000, pp. 165-170.

Kuh et al., "Recent Advances in VLSI Layout," Publication Year 1990, Proceedings of the IEEE, vol. 78, Issue 2, pp. 237-263.

Liebmann et al., "Optimizing Style Options for Sub-Resolution Assist Features," Proc. of SPIE vol. 4346, 2001, pp. 141-152.

Mansfield et al., "Lithographic Comparison of Assist Feature Design Strategies," Proc. of SPIE vol. 4000, 2000, pp. 63-76.

Shi et al., "Understanding the Forbidden Pitch and Assist Feature Placement," Proc. of SPIE vol. 4562, 2002, pp. 968-979.

Smayling et al., "APF Pitch Halving for 22 nm Logic Cells Using Gridded Design Rules," Proceedings of SPIE, USA, vol. 69251E-1-69251E-7.

Dictionary.com, "channel," in Collins English Dictionary—Complete & Unabridged 10th Edition. Source location: HarperCollins Publishers. http://dictionary.reference.com/browse/channel. Available: http://dictionary.reference.com. Accessed:Dec. 19, 2011.

Mishra, P., et al., "FinFET Circuit Design," Nanoelectronic Circuit Design, pp. 23-54, 2011.

Pham, D., et al., "FINFET Device Junction Formation Challenges," 2006 International Workshop on Junction Technology, pp. 73-77, Aug. 2006.

* cited by examiner

| Additional Interconnect Layers (225) |  |
|---|---|
| Metal 4 (223) | |
| Via 3 (221) | |
| Metal 3 (219) | |
| Via 2 (217) | |
| Metal 2 (215) | |
| Via 1 (213) | |
| Metal 1 (211) | |
| Diffusion Contacts (205) | Gate Electrode Contacts (209) |
| | Gate Electrode Features (207) |
| Diffusion Regions (203) | |

Substrate (201)

Fig. 2

ELECTRODES OF TRANSISTORS WITH AT LEAST TWO LINEAR-SHAPED CONDUCTIVE STRUCTURES OF DIFFERENT LENGTH

CLAIM OF PRIORITY

This application is a continuation application under 35 U.S.C. 120 of prior U.S. application Ser. No. 12/212,562, filed Sep. 17, 2008 now U.S. Pat. No. 7,842,975, and entitled "Dynamic Array Architecture," which is a continuation application under 35 U.S.C. 120 of prior U.S. application Ser. No. 11/683,402, filed Mar. 7, 2007 now U.S. Pat. No. 7,446,352, and entitled "Dynamic Array Architecture," which claims priority under 35 U.S.C. 119(e) to U.S. Provisional Patent Application No. 60/781,288, filed Mar. 9, 2006. Each of the above-identified applications is incorporated herein by reference in its entirety.

CROSS-REFERENCE TO RELATED APPLICATIONS

This application is related to each application identified in the table below. The disclosure of each application identified in the table below is incorporated herein by reference in its entirety.

| Attorney Docket No. | Title | Application No. | Filing Date |
|---|---|---|---|
| BECKP004B | Semiconductor Device with Dynamic Array Section | 12/013,342 | Jan. 11, 2008 |
| BECKP004C | Methods for Designing Semiconductor Device with Dynamic Array Section | 12/013,356 | Jan. 11, 2008 |
| BECKP004D | Methods for Defining Dynamic Array Section with Manufacturing Assurance Halo and Apparatus Implementing the Same | 12/013,366 | Jan. 11, 2008 |
| TELAP014 | Enforcement of Semiconductor Structure Regularity for Localized Transistors and Interconnect | 12/363,705 | Jan. 30, 2009 |
| TELAP015A | Cross-Coupled Transistor Layouts Using Linear Gate Level Features | 12/402,465 | Mar. 11, 2009 |
| TELAP016 | Defining and Using Contact Grids in Circuit Using Dynamic Array Architecture | 12/399,948 | Mar. 7, 2009 |
| TELAP017 | Methods for Multi-Wire Routing and Apparatus Implementing Same | 12/411,249 | Mar. 25, 2009 |
| TELAP018 | Co-Optimized Nano-Patterns for Integrated Circuit Design | 12/484,130 | Jun. 12, 2009 |
| TELAP019 | Methods for Defining and Utilizing Sub-Resolution Features in Linear Topology | 12/479,674 | Jun. 5, 2009 |
| TELAP020 | Optimizing Layout of Irregular Structures in Regular Layout Context | 12/481,445 | Jun. 9, 2009 |
| TELAP021 | Methods for Cell Phasing in Grid-Based Architecture and Apparatus Implementing Same | 12/497,052 | Jul. 2, 2009 |
| TELAP022A | Use of Oversized Contacts and Vias in a Linearly Constrained Topology | 12/466,335 | May 14, 2009 |
| TELAP022B | Use of Oversized Contacts and Vias in a Linearly Constrained Topology | 12/466,341 | May 14, 2009 |
| TELAP023 | Methods for Controlling Microloading Variation in Semiconductor Wafer Layout and Fabrication | 12/512,932 | Jul. 30, 2009 |
| TELAP048 | Circuitry and Layouts for XOR and XNOR Logic | 12/435,672 | May 5, 2009 |
| TELAP004AC2 | Semiconductor Device Layout Having Restricted Layout Region Including Rectangular Shaped Gate Electrode Layout Features Defined Along At Least Four Gate Electrode Tracks with Corresponding Non-Symmetric Diffusion Regions | 12/561,207 | Sep. 16, 2009 |
| TELAP004AC3 | Semiconductor Device Layout Including Cell Layout Having Restricted Gate Electrode Level Layout with Rectangular Shaped Gate Electrode Layout Features Defined Along At Least Four Gate Electrode Tracks with Corresponding Non-Symmetric Diffusion Regions | 12/561,216 | Sep. 16, 2009 |
| TELAP004AC4 | Semiconductor Device Layout Having Restricted Layout Region Including Rectangular Shaped Gate Electrode Layout Features and Equal Number of PMOS and NMOS Transistors | 12/561,220 | Sep. 16, 2009 |
| TELAP004AC5 | Semiconductor Device Layout Including Cell Layout Having Restricted Gate Electrode Level Layout with Rectangular Shaped Gate Electrode Layout Features | 12/561,224 | Sep. 16, 2009 |

-continued

| Attorney Docket No. | Title | Application No. | Filing Date |
|---|---|---|---|
| | and Equal Number of PMOS and NMOS Transistors | | |
| TELAP004AC6 | Semiconductor Device Layout Having Restricted Layout Region Including Rectangular Shaped Gate Electrode Layout Features and At Least Eight Transistors | 12/561,229 | Sep. 16, 2009 |
| TELAP004AC7 | Semiconductor Device Layout Including Cell Layout Having Restricted Gate Electrode Level Layout with Rectangular Shaped Gate Electrode Layout Features and At Least Eight Transistors | 12/561,229 | Sep. 16, 2009 |
| TELAP004AC8 | Semiconductor Device Portion Having Gate Electrode Conductive Structures Formed from Rectangular Shaped Gate Electrode Layout Features Defined Along At Least Four Gate Electrode Tracks and Having Corresponding Non-Symmetric Diffusion Regions | 12/561,238 | Sep. 16, 2009 |
| TELAP004AC9 | Semiconductor Device Portion Having Sub-Wavelength-Sized Gate Electrode Conductive Structures Formed from Rectangular Shaped Gate Electrode Layout Features Defined Along At Least Four Gate Electrode Tracks and Having Corresponding Non-Symmetric Diffusion Regions | 12/561,243 | Sep. 16, 2009 |
| TELAP004AC10 | Semiconductor Device Portion Having Sub-193 Nanometers-Sized Gate Electrode Conductive Structures Formed from Rectangular Shaped Gate Electrode Layout Features Defined Along At Least Four Gate Electrode Tracks and Having Corresponding Non-Symmetric Diffusion Regions | 12/561,246 | Sep. 16, 2009 |
| TELAP004AC11 | Semiconductor Device Portion Having Gate Electrode Conductive Structures Formed from Rectangular Shaped Gate Electrode Layout Features and Having Equal Number of PMOS and NMOS Transistors | 12/561,247 | Sep. 16, 2009 |
| TELAP004AC12 | Semiconductor Device Portion Having Sub-Wavelength-Sized Gate Electrode Conductive Structures Formed from Rectangular Shaped Gate Electrode Layout Features and Having Equal Number of PMOS and NMOS Transistors | 12/563,031 | Sep. 16, 2009 |
| TELAP004AC13 | Semiconductor Device Portion Having Sub-193 Nanometers-Sized Gate Electrode Conductive Structures Formed from Rectangular Shaped Gate Electrode Layout Features and Having Equal Number of PMOS and NMOS Transistors | 12/563,042 | Sep. 16, 2009 |
| TELAP004AC14 | Semiconductor Device Portion Having Gate Electrode Conductive Structures Formed from Rectangular Shaped Gate Electrode Layout Features and Having At Least Eight Transistors | 12/563,051 | Sep. 16, 2009 |
| TELAP004AC15 | Semiconductor Device Portion Having Sub-Wavelength-Sized Gate Electrode Conductive Structures Formed from Rectangular Shaped Gate Electrode Layout Features and Having At Least Eight Transistors | 12/563,056 | Sep. 18, 2009 |
| TELAP004AC16 | Semiconductor Device Portion Having Sub-193 Nanometers-Sized Gate Electrode Conductive Structures Formed from Rectangular Shaped Gate Electrode Layout Features and Having At Least Eight Transistors | 12/563,061 | Sep. 18, 2009 |
| TELAP004AC17 | Semiconductor Device Layout Having Restricted Layout Region Including Linear Shaped Gate Electrode Layout Features Defined Along At Least Four Gate Electrode Tracks with Minimum | 12/563,063 | Sep. 18, 2009 |

-continued

| Attorney Docket No. | Title | Application No. | Filing Date |
|---|---|---|---|
| | End-to-End Spacing with Corresponding Non-Symmetric Diffusion Regions | | |
| TELAP004AC18 | Semiconductor Device Layout Including Cell Layout Having Restricted Gate Electrode Level Layout with Linear Shaped Gate Electrode Layout Features Defined Along At Least Four Gate Electrode Tracks with Minimum End-to-End Spacing with Corresponding Non-Symmetric Diffusion Regions | 12/563,066 | Sep. 18, 2009 |
| TELAP004AC19 | Semiconductor Device Layout Having Restricted Layout Region Including Linear Shaped Gate Electrode Layout Features Defined with Minimum End-to-End Spacing and Equal Number of PMOS and NMOS Transistors | 12/563,074 | Sep. 18, 2009 |
| TELAP004AC20 | Semiconductor Device Layout Including Cell Layout Having Restricted Gate Electrode Level Layout with Linear Shaped Gate Electrode Layout Features Defined with Minimum End-to-End Spacing and Equal Number of PMOS and NMOS Transistors | 12/563,076 | Sep. 18, 2009 |
| TELAP004AC21 | Semiconductor Device Layout Having Restricted Layout Region Including Linear Shaped Gate Electrode Layout Features Defined with Minimum End-to-End Spacing and At Least Eight Transistors | 12/563,077 | Sep. 18, 2009 |
| TELAP004AC22 | Semiconductor Device Layout Including Cell Layout Having Restricted Gate Electrode Level Layout with Linear Shaped Gate Electrode Layout Features Defined with Minimum End-to-End Spacing and At Least Eight Transistors | 12/567,528 | Sep. 25, 2009 |
| TELAP004AC23 | Semiconductor Device Portion Having Gate Electrode Conductive Structures Formed from Linear Shaped Gate Electrode Layout Features Defined Along At Least Four Gate Electrode Tracks with Minimum End-to-End Spacing and Having Corresponding Non-Symmetric Diffusion Regions | 12/567,542 | Sep. 25, 2009 |
| TELAP004AC24 | Semiconductor Device Portion Having Sub-Wavelength-Sized Gate Electrode Conductive Structures Formed from Linear Shaped Gate Electrode Layout Features Defined Along At Least Four Gate Electrode Tracks with Minimum End-to-End Spacing and Having Corresponding Non-Symmetric Diffusion Regions | 12/567,555 | Sep. 25, 2009 |
| TELAP004AC25 | Semiconductor Device Portion Having Sub-193 Nanometers-Sized Gate Electrode Conductive Structures Formed from Linear Shaped Gate Electrode Layout Features Defined Along At Least Four Gate Electrode Tracks with Minimum End-to-End Spacing and Having Corresponding Non-Symmetric Diffusion Regions | 12/567,565 | Sep. 25, 2009 |
| TELAP004AC26 | Semiconductor Device Portion Having Gate Electrode Conductive Structures Formed from Linear Shaped Gate Electrode Layout Features Defined with Minimum End-to-End Spacing and Having Equal Number of PMOS and NMOS Transistors | 12/567,574 | Sep. 25, 2009 |
| TELAP004AC27 | Semiconductor Device Portion Having Sub-Wavelength-Sized Gate Electrode Conductive Structures Formed from Linear Shaped Gate Electrode Layout Features Defined with Minimum End-to-End Spacing and Having Equal Number of PMOS and NMOS Transistors | 12/567,586 | Sep. 25, 2009 |
| TELAP004AC28 | Semiconductor Device Portion Having Sub-193 Nanometers-Sized Gate | 12/567,597 | Sep. 25, 2009 |

| Attorney Docket No. | Title | Application No. | Filing Date |
|---|---|---|---|
| | Electrode Conductive Structures Formed from Linear Shaped Gate Electrode Layout Features Defined with Minimum End-to-End Spacing and Having Equal Number of PMOS and NMOS Transistors | | |
| TELAP004AC29 | Semiconductor Device Portion Having Gate Electrode Conductive Structures Formed from Linear Shaped Gate Electrode Layout Features Defined with Minimum End-to-End Spacing and Having At Least Eight Transistors | 12/567,602 | Sep. 25, 2009 |
| TELAP004AC30 | Semiconductor Device Portion Having Sub-Wavelength-Sized Gate Electrode Conductive Structures Formed from Linear Shaped Gate Electrode Layout Features Defined with Minimum End-to-End Spacing and Having At Least Eight Transistors | 12/567,609 | Sep. 25, 2009 |
| TELAP004AC31 | Semiconductor Device Portion Having Sub-193 Nanometers-Sized Gate Electrode Conductive Structures Formed from Linear Shaped Gate Electrode Layout Features Defined with Minimum End-to-End Spacing and Having At Least Eight Transistors | 12/567,616 | Sep. 25, 2009 |
| TELAP004AC33 | Layout of Cell of Semiconductor Device Having Rectangular Shaped Gate Electrode Layout Features Defined Along At Least Four Gate Electrode Tracks with Corresponding p-type and n-type Diffusion Regions Separated by Central Inactive Region | 12/567,630 | Sep. 25, 2009 |
| TELAP004AC34 | Layout of Cell of Semiconductor Device Having Rectangular Shaped Gate Electrode Layout Features and Equal Number of PMOS and NMOS Transistors | 12/567,634 | Sep. 25, 2009 |
| TELAP004AC35 | Layout of Cell of Semiconductor Device Having Rectangular Shaped Gate Electrode Layout Features and Equal Number of PMOS and NMOS Transistors with Corresponding p-type and n-type Diffusion Regions Separated by Central Inactive Region | 12/567,641 | Sep. 25, 2009 |
| TELAP004AC36 | Layout of Cell of Semiconductor Device Having Rectangular Shaped Gate Electrode Layout Features and At Least Eight Transistors | 12/567,648 | Sep. 25, 2009 |
| TELAP004AC37 | Layout of Cell of Semiconductor Device Having Rectangular Shaped Gate Electrode Layout Features and At Least Eight Transistors with Corresponding p-type and n-type Diffusion Regions Separated by Central Inactive Region | 12/567,654 | Sep. 25, 2009 |
| TELAP004AC38 | Cell of Semiconductor Device Having Gate Electrode Conductive Structures Formed from Rectangular Shaped Gate Electrode Layout Features Defined Along At Least Four Gate Electrode Tracks | 12/571,343 | Sep. 30, 2009 |
| TELAP004AC39 | Cell of Semiconductor Device Having Sub-Wavelength-Sized Gate Electrode Conductive Structures Formed from Rectangular Shaped Gate Electrode Layout Features Defined Along At Least Four Gate Electrode Tracks | 12/571,351 | Sep. 30, 2009 |
| TELAP004AC40 | Cell of Semiconductor Device Having Sub-193 Nanometers-Sized Gate Electrode Conductive Structures Formed from Rectangular Shaped Gate Electrode Layout Features Defined Along At Least Four Gate Electrode Tracks | 12/571,357 | Sep. 30, 2009 |
| TELAP004AC41 | Cell of Semiconductor Device Having Gate Electrode Conductive Structures Formed from Rectangular Shaped Gate Electrode Layout Features and Equal | 12/571,998 | Oct. 1, 2009 |

-continued

| Attorney Docket No. | Title | Application No. | Filing Date |
|---|---|---|---|
| TELAP004AC42 | Cell of Semiconductor Device Having Sub-Wavelength-Sized Gate Electrode Conductive Structures Formed from Rectangular Shaped Gate Electrode Layout Features and Equal Number of PMOS and NMOS Transistors | 12/572,011 | Oct. 1, 2009 |
| TELAP004AC43 | Cell of Semiconductor Device Having Sub-193 Nanometers-Sized Gate Electrode Conductive Structures Formed from Rectangular Shaped Gate Electrode Layout Features and Equal Number of PMOS and NMOS Transistors | 12/572,022 | Oct. 1, 2009 |
| TELAP004AC44 | Cell of Semiconductor Device Having Gate Electrode Conductive Structures Formed from Rectangular Shaped Gate Electrode Layout Features and At Least Eight Transistors | 12/572,046 | Oct. 1, 2009 |
| TELAP004AC45 | Cell of Semiconductor Device Having Sub-Wavelength-Sized Gate Electrode Conductive Structures Formed from Rectangular Shaped Gate Electrode Layout Features and At Least Eight Transistors | 12/572,055 | Oct. 1, 2009 |
| TELAP004AC46 | Cell of Semiconductor Device Having Sub-193 Nanometers-Sized Gate Electrode Conductive Structures Formed from Rectangular Shaped Gate Electrode Layout Features and At Least Eight Transistors | 12/572,061 | Oct. 1, 2009 |
| TELAP004AC47 | Layout of Cell of Semiconductor Device Having Linear Shaped Gate Electrode Layout Features Defined Along At Least Four Gate Electrode Tracks with Minimum End-to-End Spacing | 12/572,068 | Oct. 1, 2009 |
| TELAP004AC48 | Layout of Cell of Semiconductor Device Having Linear Shaped Gate Electrode Layout Features Defined Along At Least Four Gate Electrode Tracks with Minimum End-to-End Spacing and Having Corresponding p-type and n-type Diffusion Regions Separated by Central Inactive Region | 12/572,077 | Oct. 1, 2009 |
| TELAP004AC49 | Layout of Cell of Semiconductor Device Having Linear Shaped Gate Electrode Layout Features Defined with Minimum End-to-End Spacing and Having Equal Number of PMOS and NMOS Transistors | 12/572,091 | Oct. 1, 2009 |
| TELAP004AC50 | Layout of Cell of Semiconductor Device Having Linear Shaped Gate Electrode Layout Features Defined with Minimum End-to-End Spacing and Having Equal Number of PMOS and NMOS Transistors and Having Corresponding p-type and n-type Diffusion Regions Separated by Central Inactive Region | 12/572,194 | Oct. 1, 2009 |
| TELAP004AC51 | Layout of Cell of Semiconductor Device Having Linear Shaped Gate Electrode Layout Features Defined with Minimum End-to-End Spacing and Having At Least Eight Transistors | 12/572,201 | Oct. 1, 2009 |
| TELAP004AC52 | Layout of Cell of Semiconductor Device Having Linear Shaped Gate Electrode Layout Features Defined with Minimum End-to-End Spacing and Having At Least Eight Transistors and Having Corresponding p-type and n-type Diffusion Regions Separated by Central Inactive Region | 12/572,212 | Oct. 1, 2009 |
| TELAP004AC53 | Cell of Semiconductor Device Having Gate Electrode Conductive Structures Formed from Linear Shaped Gate Electrode Layout Features Defined Along At Least Four Gate Electrode | 12/572,218 | Oct. 1, 2009 |

-continued

| Attorney Docket No. | Title | Application No. | Filing Date |
|---|---|---|---|
| | Tracks with Minimum End-to-End Spacing | | |
| TELAP004AC54 | Cell of Semiconductor Device Having Sub-Wavelength-Sized Gate Electrode Conductive Structures Formed from Linear Shaped Gate Electrode Layout Features Defined Along At Least Four Gate Electrode Tracks with Minimum End-to-End Spacing | 12/572,221 | Oct. 1, 2009 |
| TELAP004AC55 | Cell of Semiconductor Device Having Sub-193 Nanometers-Sized Gate Electrode Conductive Structures Formed from Linear Shaped Gate Electrode Layout Features Defined Along At Least Four Gate Electrode Tracks with Minimum End-to-End Spacing | 12/572,225 | Oct. 1, 2009 |
| TELAP004AC56 | Cell of Semiconductor Device Having Gate Electrode Conductive Structures Formed from Linear Shaped Gate Electrode Layout Features Defined with Minimum End-to-End Spacing and Equal Number of PMOS and NMOS Transistors | 12/572,228 | Oct. 1, 2009 |
| TELAP004AC57 | Cell of Semiconductor Device Having Sub-Wavelength-Sized Gate Electrode Conductive Structures Formed from Linear Shaped Gate Electrode Layout Features Defined with Minimum End-to-End Spacing and Equal Number of PMOS and NMOS Transistors | 12/572,229 | Oct. 1, 2009 |
| TELAP004AC58 | Cell of Semiconductor Device Having Sub-193 Nanometers-Sized Gate Electrode Conductive Structures Formed from Linear Shaped Gate Electrode Layout Features Defined with Minimum End-to-End Spacing and Equal Number of PMOS and NMOS Transistors | 12/572,232 | Oct. 1, 2009 |
| TELAP004AC59 | Cell of Semiconductor Device Having Gate Electrode Conductive Structures Formed from Linear Shaped Gate Electrode Layout Features Defined with Minimum End-to-End Spacing and At Least Eight Transistors | 12/572,237 | Oct. 1, 2009 |
| TELAP004AC60 | Cell of Semiconductor Device Having Sub-Wavelength-Sized Gate Electrode Conductive Structures Formed from Linear Shaped Gate Electrode Layout Features Defined with Minimum End-to-End Spacing and At Least Eight Transistors | 12/572,239 | Oct. 1, 2009 |
| TELAP004AC61 | Cell of Semiconductor Device Having Sub-193 Nanometers-Sized Gate Electrode Conductive Structures Formed from Linear Shaped Gate Electrode Layout Features Defined with Minimum End-to-End Spacing and At Least Eight Transistors | 12/572,243 | Oct. 1, 2009 |

BACKGROUND

A push for higher performance and smaller die size drives the semiconductor industry to reduce circuit chip area by approximately 50% every two years. The chip area reduction provides an economic benefit for migrating to newer technologies. The 50% chip area reduction is achieved by reducing the feature sizes between 25% and 30%. The reduction in feature size is enabled by improvements in manufacturing equipment and materials. For example, improvement in the lithographic process has enabled smaller feature sizes to be achieved, while improvement in chemical mechanical polishing (CMP) has in-part enabled a higher number of interconnect layers.

In the evolution of lithography, as the minimum feature size approached the wavelength of the light source used to expose the feature shapes, unintended interactions occurred between neighboring features. Today minimum feature sizes are approaching 45 nm (nanometers), while the wavelength of the light source used in the photolithography process remains at 193 nm. The difference between the minimum feature size and the wavelength of light used in the photolithography process is defined as the lithographic gap. As the lithographic gap grows, the resolution capability of the lithographic process decreases.

An interference pattern occurs as each shape on the mask interacts with the light. The interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. The quality of the light interaction prediction is declining as process geometries shrink and as the light interactions become more complex.

In view of the foregoing, a solution is needed for managing lithographic gap issues as technology continues to progress toward smaller semiconductor device features sizes.

SUMMARY

In one embodiment, a layout of a cell of a semiconductor device is disclosed. The layout includes a diffusion level layout including a plurality of diffusion region layout shapes to be formed within a portion of a substrate corresponding to the cell of the semiconductor device. The plurality of diffusion region layout shapes respectively correspond to active areas of the portion of the substrate within which one or more processes are applied to modify one or more electrical characteristics of the active areas of the portion of the substrate. The plurality of diffusion region layout shapes are separated from each other by one or more non-active regions of the portion of the substrate.

Also in this embodiment, the layout includes a gate electrode level layout defined to pattern conductive features within a gate electrode level of the cell. The gate electrode level layout includes a number of linear-shaped layout features placed to extend in only a first parallel direction. Each of the number of the linear-shaped layout features within the gate electrode level layout of the cell is rectangular-shaped. The gate electrode level layout of the cell includes linear-shaped layout features defined along at least four different lines of extent in the first parallel direction across the gate electrode level layout of the cell. Some of the linear-shaped layout features within the gate electrode level layout of the cell are defined to include one or more gate electrode portions which extend over one or more of the active areas of the portion of the substrate corresponding to the plurality of diffusion region layout shapes. Each gate electrode portion and a corresponding active area of the portion of the substrate over which it extends together define a respective transistor device.

Also in this embodiment, the layout includes a number of interconnect level layouts each defined to pattern conductive features within corresponding interconnect levels of the cell above the gate electrode level of the cell. Each of the diffusion level layout, the gate electrode level layout, and the number of interconnect level layouts is indexed to align within each other such that structures fabricated according to each of the diffusion level layout, the gate electrode level layout, and the number of interconnect level layouts will spatially relate to connect as required to form one or more functional electronic devices of the cell.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 2 is an illustration showing a generalized stack of layers used to define a dynamic array architecture, in accordance with one embodiment of the present invention;

DETAILED DESCRIPTION

Figure 1:
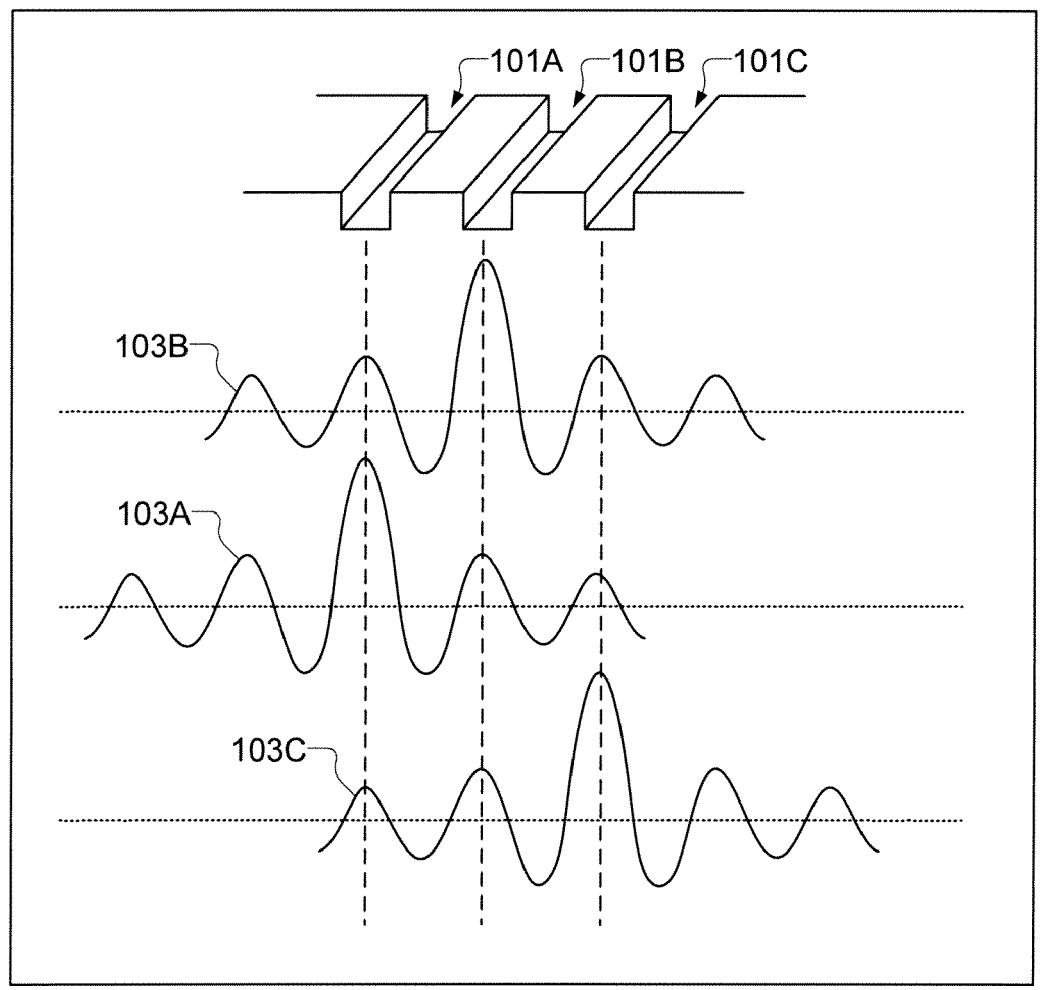
FIG. 1 is an illustration showing a number of neighboring layout features and a representation of light intensity used to render each of the layout features, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Generally speaking, a dynamic array architecture is provided to address semiconductor manufacturing process variability associated with a continually increasing lithographic gap. In the area of semiconductor manufacturing, lithographic gap is defined as the difference between the minimum size of a feature to be defined and the wavelength of light used to render the feature in the lithographic process, wherein the feature size is less than the wavelength of the light. Current lithographic processes utilize a light wavelength of 193 nm. However, current feature sizes are as small as 65 nm and are expected to soon approach sizes as small as 45 nm. With a size of 65 nm, the shapes are three times smaller than the wavelength of the light used to define the shapes. Also, considering that the interaction radius of light is about five light wavelengths, it should be appreciated that shapes exposed with a 193 nm light source will influence the exposure of shapes approximately 5*193 nm (965 nm) away. When considering the 65 nm sized features with respect to 90 nm sized features, it should be appreciated that approximately two times as many 65 nm sizes features may be within the 965 nm interaction radius of the 193 nm light source as compared to the 90 nm sized features.

Due to the increased number of features within the interaction radius of the light source, the extent and complexity of light interference contributing to exposure of a given feature is significant. Additionally, the particular shapes associated with the features within the interaction radius of the light source weighs heavily on the type of light interactions that occur. Traditionally, designers were allowed to define essentially any two-dimensional topology of feature shapes so long as a set of design rules were satisfied. For example, in a given layer of the chip, i.e., in a given mask, the designer may have defined two-dimensionally varying features having bends that wrap around each other. When such two-dimensionally varying features are located in neighboring proximity to each other, the light used to expose the features will interact in a complex and generally unpredictable manner. The light interaction becomes increasingly more complex and unpredictable as the feature sizes and relative spacing become smaller.

Traditionally, if a designer follows the established set of design rules, the resulting product will be manufacturable with a specified probability associated with the set of design rules. Otherwise, for a design that violates the set of design rules, the probability of successful manufacture of the resulting product is unknown. To address the complex light interaction between neighboring two-dimensionally varying features, in the interest of successful product manufacturing, the set of design rules is expanded significantly to adequately address the possible combinations of two-dimensionally varying features. This expanded set of design rules quickly becomes so complicated and unwieldy that application of the expanded set of design rules becomes prohibitively time consuming, expensive, and prone to error. For example, the expanded set of design rules requires complex verification. Also, the expanded set of design rules may not be universally applied. Furthermore, manufacturing yield is not guaranteed even if all design rules are satisfied.

It should be appreciated that accurate prediction of all possible light interactions when rendering arbitrarily-shaped two-dimensional features is generally not feasible. Moreover, as an alternative to or in combination with expansion of the set of design rules, the set of design rules may also be modified to include increased margin to account for unpredictable light interaction between the neighboring two-dimensionally varying features. Because the design rules are established in an attempt to cover the random two-dimensional feature topology, the design rules may incorporate a significant amount of margin. While addition of margin in the set of design rules assists with the layout portions that include the neighboring two-dimensionally varying features, such global addition of margin causes other portions of the layout that do not include the neighboring two-dimensionally varying features to be overdesigned, thus leading to decreased optimization of chip area utilization and electrical performance.

In view of the foregoing, it should be appreciated that semiconductor product yield is reduced as a result of parametric failures that stem from variability introduced by design-dependent unconstrained feature topologies, i.e., arbitrary two-dimensionally varying features disposed in proximity to each other. By way of example, these parametric failures may result from failure to accurately print contacts and vias and from variability in fabrication processes. The variability in fabrication processes may include CMP dishing, layout feature shape distortion due to photolithography, gate distortion, oxide thickness variability, implant variability, and other fabrication related phenomena. The dynamic array architecture of the present invention is defined to address the above-mentioned semiconductor manufacturing process variability.

FIG. 1 is an illustration showing a number of neighboring layout features and a representation of light intensity used to render each of the layout features, in accordance with one embodiment of the present invention. Specifically, three neighboring linear-shaped layout features (101A-101C) are depicted as being disposed in a substantially parallel relationship within a given mask layer. The distribution of light intensity from a layout feature shape is represented by a sinc function. The sinc functions (103A-103C) represent the distribution of light intensity from each of the layout features (101A-101C, respectively). The neighboring linear-shaped layout features (101A-101C) are spaced apart at locations corresponding to peaks of the sinc functions (103A-103C). Thus, constructive interference between the light energy associated with the neighboring layout features (101A-101C), i.e., at the peaks of the sinc functions (103A-103C), serves to reinforce the exposure of the neighboring shapes (101A-101C) for the layout feature spacing illustrated. In accordance with the foregoing, the light interaction represented in FIG. 1 represents a synchronous case.

As illustrated in FIG. 1, when linear-shaped layout features are defined in a regular repeating pattern at an appropriate spacing, constructive interference of the light energy associated with the various layout features serves to enhance the exposure of each layout feature. The enhanced exposure of the layout features provided by the constructive light interference can dramatically reduce or even eliminate a need to utilize optical proximity correction (OPC) and/or reticle enhancement technology (RET) to obtain sufficient rendering of the layout features.

A forbidden pitch, i.e., forbidden layout feature spacing, occurs when the neighboring layout features (101A-101C) are spaced such that peaks of the sinc function associated with one layout feature align with valleys of the sinc function associated with another layout feature, thus causing destructive interference of the light energy. The destructive interference of the light energy causes the light energy focused at a given location to be reduced. Therefore, to realize the beneficial constructive light interference associated with neighboring layout features, it is necessary to predict the layout feature spacing at which the constructive overlap of the sinc function peaks will occur. Predictable constructive overlap of the sinc function peaks and corresponding layout feature shape enhancement can be realized if the layout feature shapes are rectangular, near the same size, and are oriented in the same direction, as illustrated by the layout features (101A-101C) in FIG. 1. In this manner, resonant light energy from neighboring layout feature shapes is used to enhance the exposure of a particular layout feature shape.

FIG. 2 is an illustration showing a generalized stack of layers used to define a dynamic array architecture, in accordance with one embodiment of the present invention. It should be appreciated that the generalized stack of layers used to define the dynamic array architecture, as described with respect to FIG. 2, is not intended to represent an exhaustive description of the CMOS manufacturing process. However, the dynamic array is to be built in accordance with standard CMOS manufacturing processes. Generally speaking, the dynamic array architecture includes both the definition of the underlying structure of the dynamic array and the techniques for assembling the dynamic array for optimization of area utilization and manufacturability. Thus, the dynamic array is designed to optimize semiconductor manufacturing capabilities.

With regard to the definition of the underlying structure of the dynamic array, the dynamic array is built-up in a layered manner upon a base substrate 201, e.g., upon a silicon substrate, or silicon-on-insulator (SOI) substrate. Diffusion regions 203 are defined in the base substrate 201. The diffusion regions 203 represent selected regions of the base substrate 201 within which impurities are introduced for the purpose of modifying the electrical properties of the base substrate 201. Above the diffusion regions 203, diffusion contacts 205 are defined to enable connection between the diffusion regions 203 and conductor lines. For example, the diffusion contacts 205 are defined to enable connection between source and drain diffusion regions 203 and their respective conductor nets. Also, gate electrode features 207 are defined above the diffusion regions 203 to form transistor gates. Gate electrode contacts 209 are defined to enable connection between the gate electrode features 207 and conductor lines. For example, the gate electrode contacts 209 are defined to enable connection between transistor gates and their respective conductor nets.

Interconnect layers are defined above the diffusion contact 205 layer and the gate electrode contact layer 209. The interconnect layers include a first metal (metal 1) layer 211, a first via (via 1) layer 213, a second metal (metal 2) layer 215, a second via (via 2) layer 217, a third metal (metal 3) layer 219, a third via (via 3) layer 221, and a fourth metal (metal 4) layer 223. The metal and via layers enable definition of the desired circuit connectivity. For example, the metal and via layers enable electrical connection of the various diffusion contacts 205 and gate electrode contacts 209 such that the logic function of the circuitry is realized. It should be appreciated that the dynamic array architecture is not limited to a specific number of interconnect layers, i.e., metal and via layers. In one embodiment, the dynamic array may include additional interconnect layers 225, beyond the fourth metal (metal 4) layer 223. Alternatively, in another embodiment, the dynamic array may include less than four metal layers.

The dynamic array is defined such that layers (other than the diffusion region layer 203) are restricted with regard to layout feature shapes that can be defined therein. Specifically, in each layer other than the diffusion region layer 203, only linear-shaped layout features are allowed. A linear-shaped layout feature in a given layer is characterized as having a consistent vertical cross-section shape and extending in a single direction over the substrate. Thus, the linear-shaped layout features define structures that are one-dimensionally varying. The diffusion regions 203 are not required to be one-dimensionally varying, although they are allowed to be if necessary. Specifically, the diffusion regions 203 within the substrate can be defined to have any two-dimensionally varying shape with respect to a plane coincident with a top surface of the substrate. In one embodiment, the number of diffusion bend topologies is limited such that the interaction between the bend in diffusion and the conductive material, e.g., polysilicon, that forms the gate electrode of the transistor is predictable and can be accurately modeled. The linear-shaped layout features in a given layer are positioned to be parallel with respect to each other. Thus, the linear-shaped layout features in a given layer extend in a common direction over the substrate and parallel with the substrate.

The underlying layout methodology of the dynamic array uses constructive light interference of light waves in the lithographic process to reinforce exposure of neighboring shapes in a given layer. Therefore, the spacing of the parallel, linear-shaped layout features in a given layer is designed around the constructive light interference of the standing light waves such that lithographic correction (e.g., OPC/RET) is minimized or eliminated. Thus, in contrast to conventional OPC/RET-based lithographic processes, the dynamic array defined herein exploits the light interaction between neighboring features, rather than attempting to compensate for the light interaction between neighboring features.

Because the standing light wave for a given linear-shaped layout feature can be accurately modeled, it is possible to predict how the standing light waves associated with the neighboring linear-shaped layout features disposed in parallel in a given layer will interact. Therefore, it is possible to predict how the standing light wave used to expose one linear-shaped feature will contribute to the exposure of its neighboring linear-shaped features. Prediction of the light interaction between neighboring linear-shaped features enables the identification of an optimum feature-to-feature spacing such that light used to render a given shape will reinforce its neighboring shapes. The feature-to-feature spacing in a given layer is defined as the feature pitch, wherein the pitch is the center-to-center separation distance between adjacent linear-shaped features in a given layer.

To provide the desired exposure reinforcement between neighboring features, the linear-shaped layout features in a given layer are spaced such that constructive and destructive interference of the light from neighboring features will be optimized to produce the best rendering of all features in the neighborhood. The feature-to-feature spacing in a given layer is proportional to the wavelength of the light used to expose the features. The light used to expose each feature within about a five light wavelength distance from a given feature will serve to enhance the exposure of the given feature to some extent. The exploitation of constructive interference of the standing light waves used to expose neighboring features enables the manufacturing equipment capability to be maximized and not be limited by concerns regarding light interactions during the lithography process.

As discussed above, the dynamic array incorporates a restricted topology in which the features within each layer (other than diffusion) are required to be linear-shaped features that are oriented in a parallel manner to traverse over the substrate in a common direction. With the restricted topology of the dynamic array, the light interaction in the photolithography process can be optimized such that the printed image on the mask is essentially identical to the drawn shape in the layout, i.e., essentially a 100% accurate transfer of the layout onto the resist is achieved.

Figure 3A:
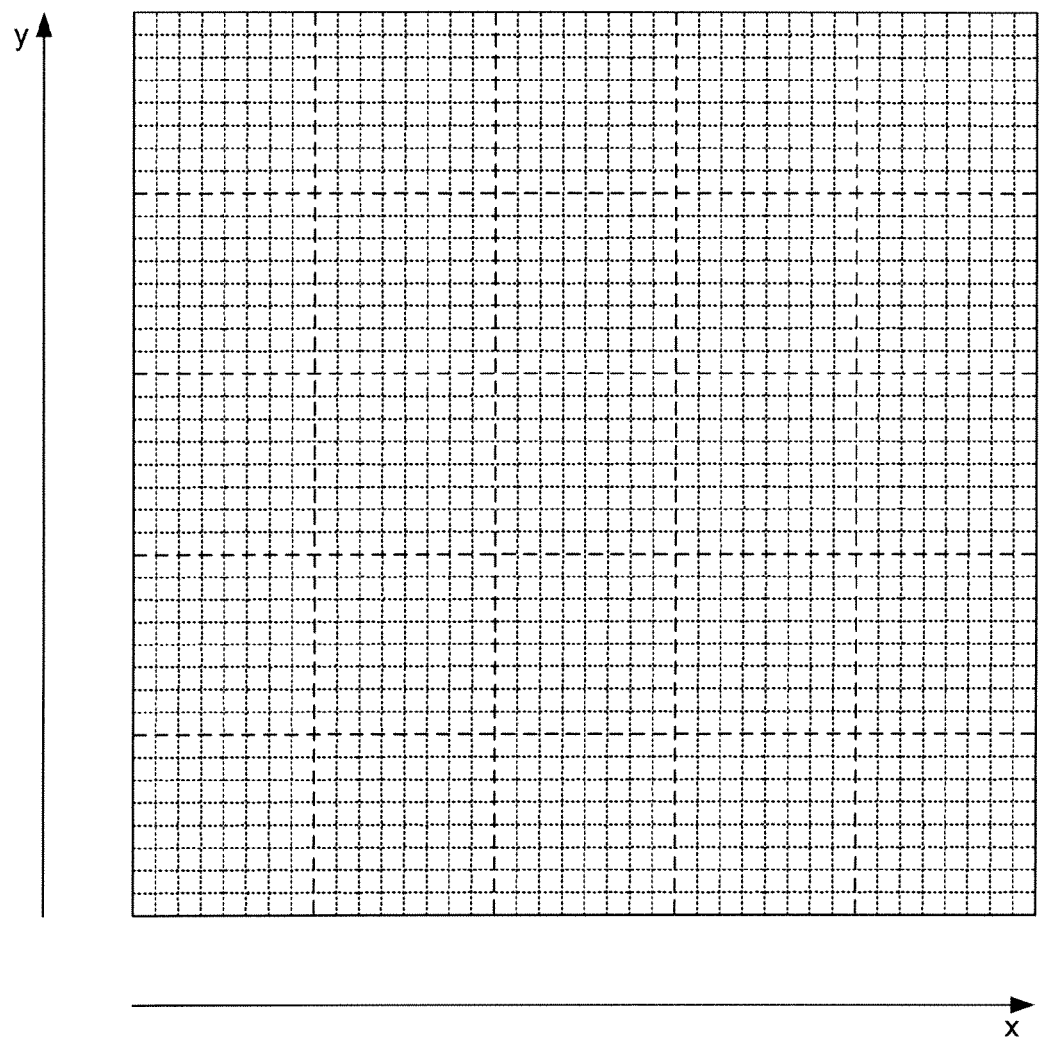
FIG. 3A is an illustration showing an exemplary base grid to be projected onto the dynamic array to facilitate definition of the restricted topology, in accordance with one embodiment of the present invention.

FIG. 3A is an illustration showing an exemplary base grid to be projected onto the dynamic array to facilitate definition of the restricted topology, in accordance with one embodiment of the present invention. The base grid can be used to facilitate parallel placement of the linear-shaped features in each layer of the dynamic array at the appropriate optimized pitch. Although not physically defined as part of the dynamic array, the base grid can be considered as a projection on each layer of the dynamic array. Also, it should be understood that the base grid is projected in a substantially consistent manner with respect to position on each layer of the dynamic array, thus facilitating accurate feature stacking and alignment.

Figure 3B:
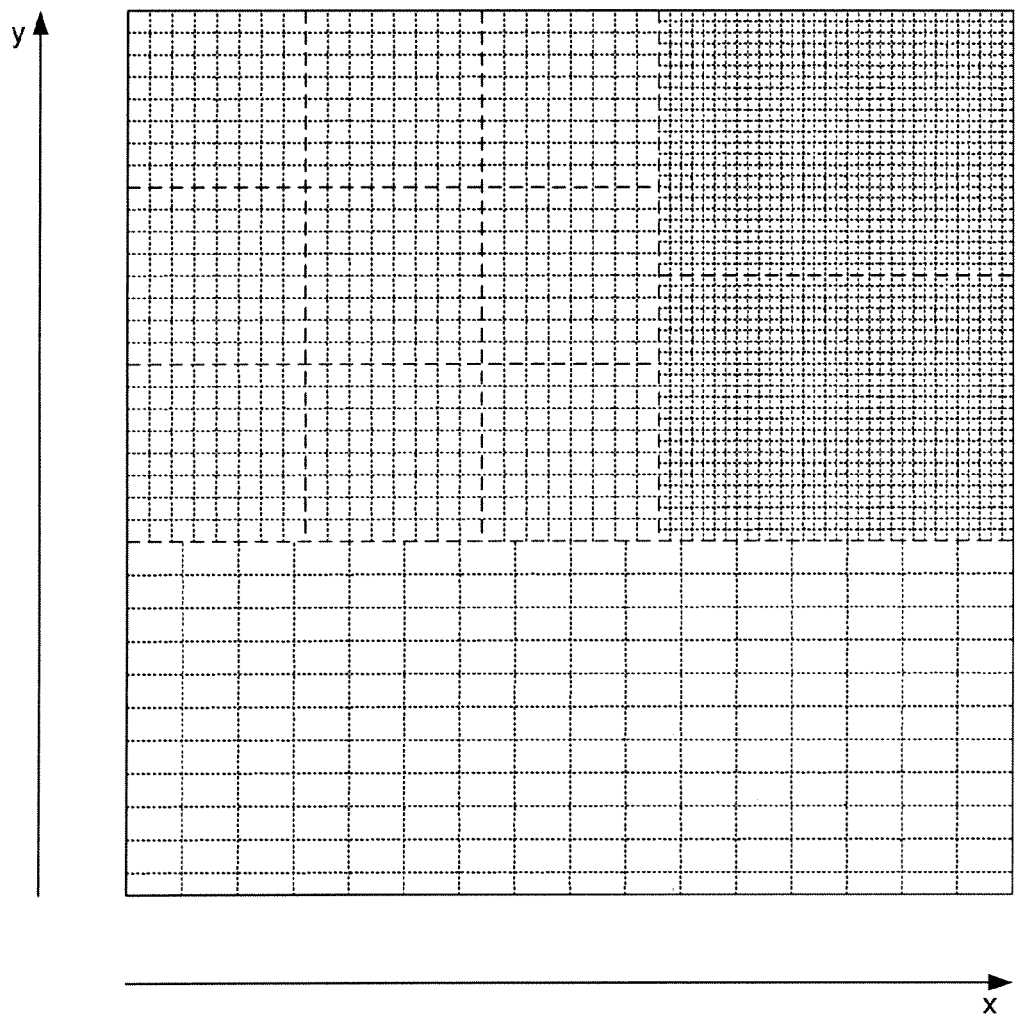
FIG. 3B is an illustration showing separate base grids projected across separate regions of the die, in accordance with an exemplary embodiment of the present invention.

In the exemplary embodiment of FIG. 3A, the base grid is defined as a rectangular grid, i.e., Cartesian grid, in accordance with a first reference direction (x) and a second reference direction (y). The gridpoint-to-gridpoint spacing in the first and second reference directions can be defined as necessary to enable definition of the linear-shaped features at the optimized feature-to-feature spacing. Also, the gridpoint spacing in the first reference direction (x) can be different than the gridpoint spacing in the second reference direction (y). In one embodiment, a single base grid is projected across the entire die to enable location of the various linear-shaped features in each layer across the entire die. However, in other embodiments, separate base grids can be projected across separate regions of the die to support different feature-to-feature spacing requirements within the separate regions of the die. FIG. 3B is an illustration showing separate base grids projected across separate regions of the die, in accordance with an exemplary embodiment of the present invention.

The base grid is defined with consideration for the light interaction function, i.e., the sinc function, and the manufacturing capability, wherein the manufacturing capability is defined by the manufacturing equipment and processes to be utilized in fabricating the dynamic array. With regard to the light interaction function, the base grid is defined such that the spacing between gridpoints enables alignment of peaks in the sinc functions describing the light energy projected upon neighboring gridpoints. Therefore, linear-shaped features optimized for lithographic reinforcement can be specified by drawing a line from a first gridpoint to a second gridpoint, wherein the line represents a rectangular structure of a given width. It should be appreciated that the various linear-shaped features in each layer can be specified according to their endpoint locations on the base grid and their width.

Figure 3C:
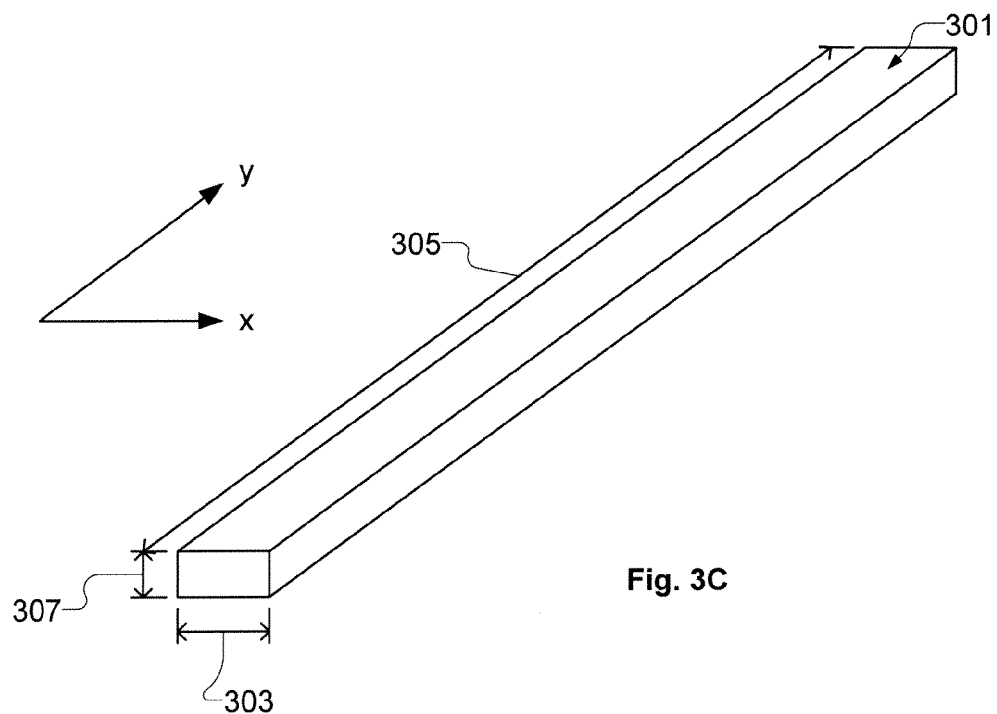
FIG. 3C is an illustration showing an exemplary linear-shaped feature defined to be compatible with the dynamic array, in accordance with one embodiment of the present invention.

FIG. 3C is an illustration showing an exemplary linear-shaped feature 301 defined to be compatible with the dynamic array, in accordance with one embodiment of the present invention. The linear-shaped feature 301 has a substantially rectangular cross-section defined by a width 303 and a height 307. The linear-shaped feature 301 extends in a linear direction to a length 305. In one embodiment, a cross-section of the linear-shaped feature, as defined by its width 303 and height 307, is substantially uniform along its length 305. It should be understood, however, that lithographic effects may cause a rounding of the ends of the linear-shaped feature 301. The first and second reference directions (x) and (y), respectively, of FIG. 3A are shown to illustrate an exemplary orientation of the linear-shaped feature on the dynamic array. It should be appreciated that the linear-shaped feature may be oriented to have its length 305 extend in either the first reference direction (x), the second reference direction (y), or in diagonal direction defined relative to the first and second reference directions (x) and (y). Regardless of the linear-shaped features' particular orientation with respect to the first and second reference directions (x) and (y), it should be understood that the linear-shaped feature is defined in a plane that is substantially parallel to a top surface of the substrate upon which the dynamic array is built. Also, it should be understood that the linear-shaped feature is free of bends, i.e., change in direction, in the plane defined by the first and second reference directions.

Figure 3D:
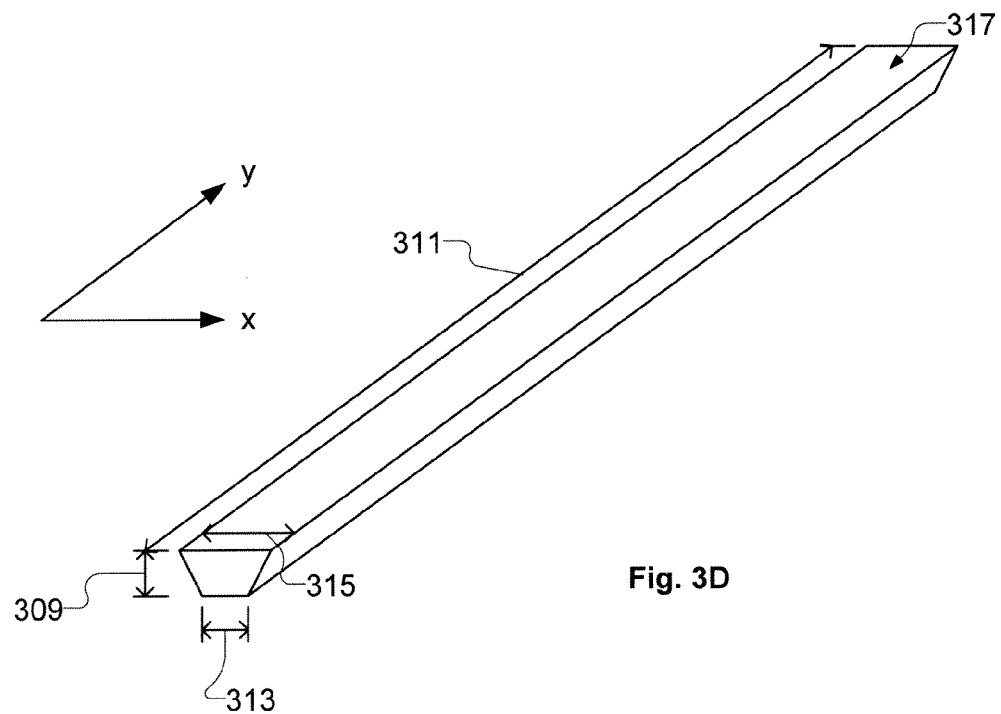
FIG. 3D is an illustration showing another exemplary linear-shaped feature defined to be compatible with the dynamic array, in accordance with one embodiment of the present invention.

FIG. 3D is an illustration showing another exemplary linear-shaped feature 317 defined to be compatible with the dynamic array, in accordance with one embodiment of the present invention. The linear-shaped feature 317 has a trapezoidal cross-section defined by a lower width 313, an upper width 315, and a height 309. The linear-shaped feature 317 extends in a linear direction to a length 311. In one embodiment, the cross-section of the linear-shaped feature 317 is substantially uniform along its length 311. It should be understood, however, that lithographic effects may cause a rounding of the ends of the linear-shaped feature 317. The first and second reference directions (x) and (y), respectively, of FIG. 3A are shown to illustrate an exemplary orientation of the linear-shaped feature on the dynamic array. It should be appreciated that the linear-shaped feature 317 may be oriented to have its length 311 extend in either the first reference direction (x), the second reference direction (y), or in diagonal direction defined relative to the first and second reference directions (x) and (y). Regardless of the particular orientation of the linear-shaped feature 317 with regard to the first and second reference directions (x) and (y), it should be understood that the linear-shaped feature 317 is defined in a plane that is substantially parallel to a top surface of the substrate upon which the dynamic array is built. Also, it should be understood that the linear-shaped feature 317 is free of bends, i.e., change in direction, in the plane defined by the first and second reference directions.

Although FIGS. 3C and 3D explicitly discuss linear shaped features having rectangular and trapezoidal cross-sections, respectively, it should be understood that the linear shaped features having other types of cross-sections can be defined within the dynamic array. Therefore, essentially any suitable cross-sectional shape of the linear-shaped feature can be utilized so long as the linear-shaped feature is defined to have a length that extends in one direction, and is oriented to have its length extend in either the first reference direction (x), the second reference direction (y), or in diagonal direction defined relative to the first and second reference directions (x) and (y).

The layout architecture of the dynamic array follows the base grid pattern. Thus, it is possible to use grid points to represent where changes in direction occur in diffusion, wherein gate electrode and metal linear-shaped features are placed, where contacts are placed, where opens are in the linear-shaped gate electrode and metal features, etc. The pitch of the gridpoints, i.e., the gridpoint-to-gridpoint spacing, should be set for a given feature line width, e.g., width 303 in FIG. 3C, such that exposure of neighboring linear-shaped features of the given feature line width will reinforce each other, wherein the linear-shaped features are centered on gridpoints. With reference to the dynamic array stack of FIG. 2 and the exemplary base grid of FIG. 3A, in one embodiment, the gridpoint spacing in the first reference direction (x) is set by the required gate electrode gate pitch. In this same embodiment, the gridpoint pitch in the second reference direction (y) is set by the metal 1 and metal 3 pitch. For example, in a 90 nm process technology, i.e., minimum feature size equal to 90 nm, the gridpoint pitch in the second reference direction (y) is about 0.24 micron. In one embodiment, metal 1 and metal 2 layers will have a common spacing and pitch. A different spacing and pitch may be used above the metal 2 layer.

The various layers of the dynamic array are defined such that the linear-shaped features in adjacent layers extend in a crosswise manner with respect to each other. For example, the linear-shaped features of adjacent layers may extend orthogonally, i.e., perpendicularly with respect to each other. Also, the linear-shaped features of one layer may extend across the linear-shaped features of an adjacent layer at an angle, e.g., at about 45 degrees. For example, in one embodiment the linear-shaped feature of one layer extend in the first reference direction (x) and the linear-shaped features of the adjacent layer extend diagonally with respect to the first (x) and second (y) reference directions. It should be appreciated that to route a design in the dynamic array having the linear-shaped features positioned in the crosswise manner in adjacent layers, opens can be defined in the linear-shaped features, and contacts and vias can be defined as necessary.

The dynamic array minimizes the use of bends in layout shapes to eliminate unpredictable lithographic interactions. Specifically, prior to OPC or other RET processing, the dynamic array allows bends in the diffusion layer to enable control of device sizes, but does not allow bends in layers above the diffusion layer. The layout features in each layer above the diffusion layer are linear in shape, e.g., FIG. 3C, and disposed in a parallel relationship with respect to each other. The linear shapes and parallel positioning of layout features are implemented in each stack layer of the dynamic array where predictability of constructive light interference is necessary to ensure manufacturability. In one embodiment, the linear shapes and parallel positioning of layout features are implemented in the dynamic array in each layer above diffusion through metal 2. Above metal 2, the layout features may be of sufficient size and shape that constructive light interference is not required to ensure manufacturability. However, the presence of constructive light interference in patterning layout features above metal 2 may be beneficial.

An exemplary buildup of dynamic array layers from diffusion through metal 2 are described with respect to FIGS. 4 through 14. It should be appreciated that the dynamic array described with respect to FIGS. 4 through 14 is provided by way of example only, and is not intended to convey limitations of the dynamic array architecture. The dynamic array can be used in accordance with the principles presented herein to define essentially any integrated circuit design.

Figure 4:
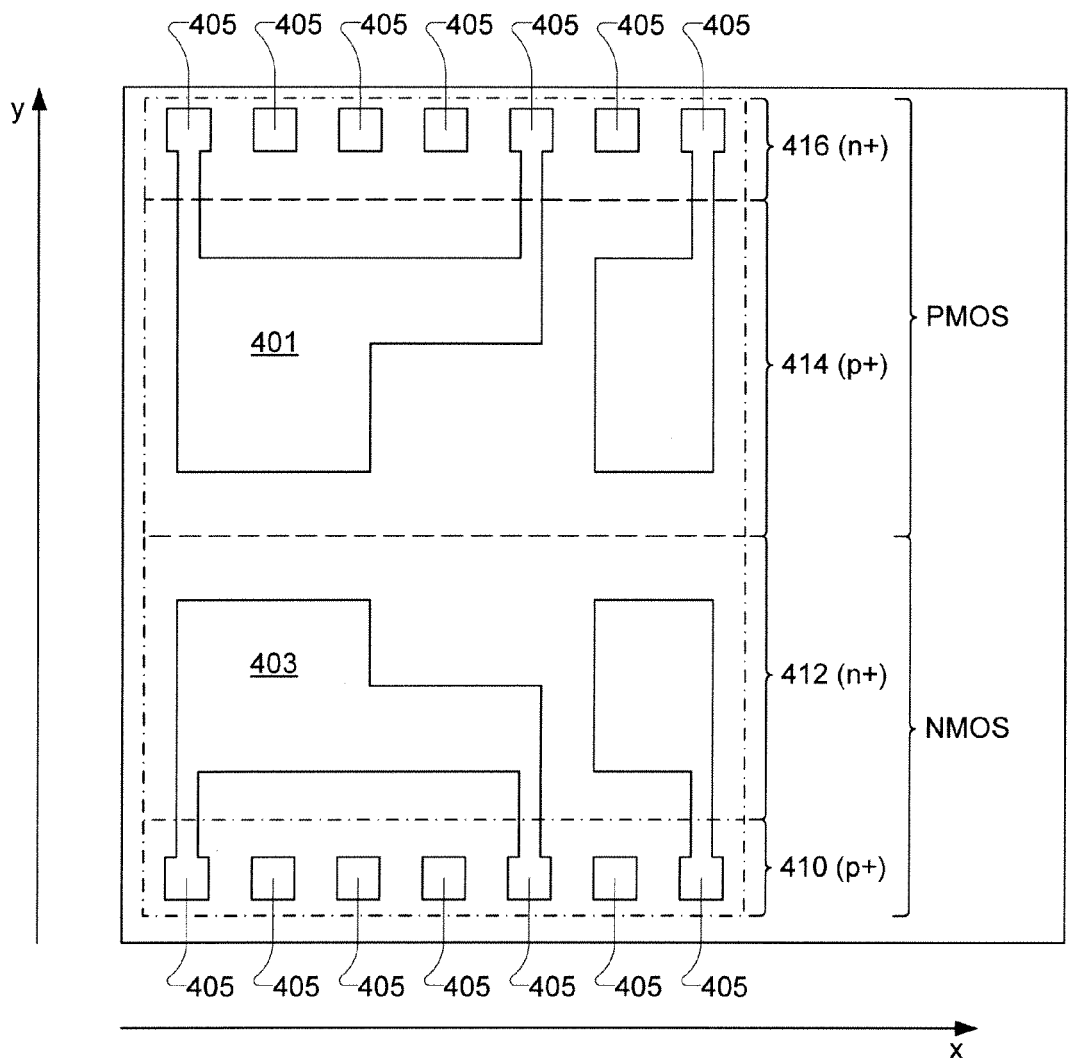
FIG. 4 is an illustration showing a diffusion layer layout of an exemplary dynamic array, in accordance with one embodiment of the present invention.

FIG. 4 is an illustration showing a diffusion layer layout of an exemplary dynamic array, in accordance with one embodiment of the present invention. The diffusion layer of FIG. 4 shows a p-diffusion region 401 and an n-diffusion region 403. While the diffusion regions are defined according to the underlying base grid, the diffusion regions are not subject to the linear-shaped feature restrictions associated with the layers above the diffusion layer. The diffusion regions 401 and 403 include diffusion squares 405 defined where diffusion contacts will be located. The diffusion regions 401 and 403 do not include extraneous jogs or corners, thus improving the use of lithographic resolution and enabling more accurate device extraction. Additionally, n+ mask regions (412 and 416) and p+ mask regions (410 and 414) are defined as rectangles on the (x), (y) grid with no extraneous jogs or notches. This style permits use of larger diffusion regions, eliminates need for OPC/RET, and enables use of lower resolution and lower cost lithographic systems, e.g., i-line illumination at 365 nm. It should be appreciated that the n+ mask region 416 and the p+ mask region 410, as depicted in FIG. 4, are for an embodiment that does not employ well-biasing. In an alternative embodiment where well-biasing is to be used, the n+ mask region 416 shown in FIG. 4 will actually be defined as a p+ mask region. Also, in this alternative embodiment, the p+ mask region 410 shown in FIG. 4 will actually be defined as a n+ mask region.

Figure 5:
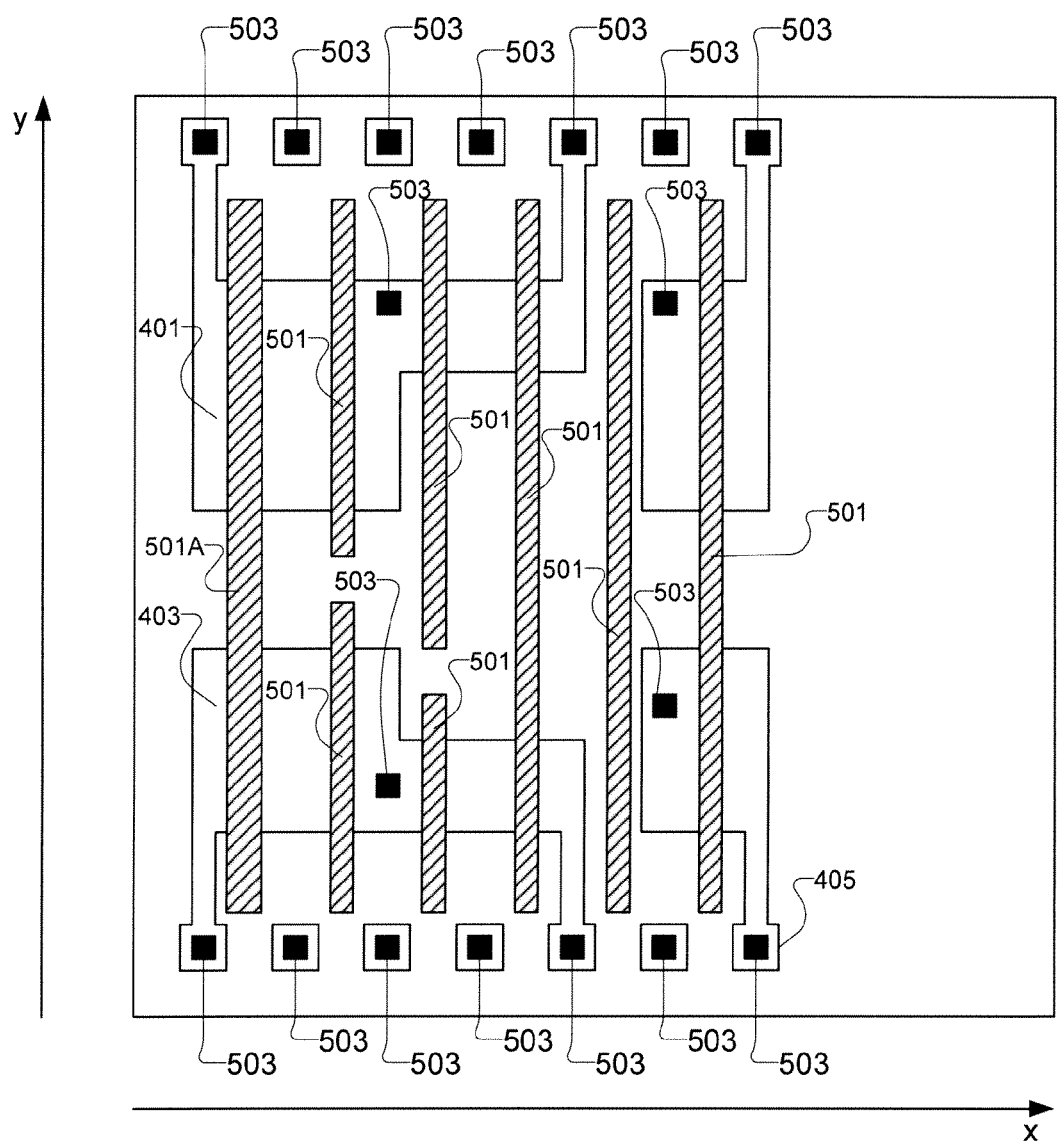
FIG. 5 is an illustration showing a gate electrode layer and a diffusion contact layer above and adjacent to the diffusion layer of FIG. 4, in accordance with one embodiment of the present invention.

FIG. 5 is an illustration showing a gate electrode layer and a diffusion contact layer above and adjacent to the diffusion layer of FIG. 4, in accordance with one embodiment of the present invention. As those skilled in the CMOS arts will appreciate, the gate electrode features 501 define the transistor gates. The gate electrode features 501 are defined as linear shaped features extending in a parallel relationship across the dynamic array in the second reference direction (y). In one embodiment, the gate electrode features 501 are defined to have a common width. However, in another embodiment, one or more of the gate electrode features can be defined to have a different width. For example, FIG. 5 shows a gate electrode features 501A that has a larger width relative to the other gate electrode features 501. The pitch (center-to-center spacing) of the gate electrode features 501 is minimized while ensuring optimization of lithographic reinforcement, i.e., resonant imaging, provided by neighboring gate electrode features 501. For discussion purposes, gate electrode features 501 extending across the dynamic array in a given line are referred to as a gate electrode track.

The gate electrode features 501 form n-channel and p-channel transistors as they cross the diffusion regions 403 and 401, respectively. Optimal gate electrode feature 501 printing is achieved by drawing gate electrode features 501 at every grid location, even though no diffusion region may be present at some grid locations. Also, long continuous gate electrode features 501 tend to improve line end shortening effects at the ends of gate electrode features within the interior of the dynamic array. Additionally, gate electrode printing is significantly improved when all bends are removed from the gate electrode features 501.

Each of the gate electrode tracks may be interrupted, i.e., broken, any number of times in linearly traversing across the dynamic array in order to provide required electrical connectivity for a particular logic function to be implemented. When a given gate electrode track is required to be interrupted, the separation between ends of the gate electrode track segments at the point of interruption is minimized to the extent possible taking into consideration the manufacturing capability and electrical effects. In one embodiment, optimal manufacturability is achieved when a common end-to-end spacing is used between features within a particular layer.

Minimizing the separation between ends of the gate electrode track segments at the points of interruption serves to maximize the lithographic reinforcement, and uniformity thereof, provided from neighboring gate electrode tracks. Also, in one embodiment, if adjacent gate electrode tracks need to be interrupted, the interruptions of the adjacent gate electrode tracks are made such that the respective points of interruption are offset from each other so as to avoid, to the extent possible, an occurrence of neighboring points of interruption. More specifically, points of interruption within adjacent gate electrode tracks are respectively positioned such that a line of sight does not exist through the points of interruption, wherein the line of sight is considered to extend perpendicularly to the direction in which the gate electrode tracks extend over the substrate. Additionally, in one embodiment, the gate electrodes may extend through the boundaries at the top and bottom of the cells, i.e., the PMOS or NMOS cells. This embodiment would enable bridging of neighboring cells.

With further regard to FIG. 5, diffusion contacts 503 are defined at each diffusion square 405 to enhance the printing of diffusion contacts via resonant imaging. The diffusion squares 405 are present around every diffusion contact 503 to enhance the printing of the power and ground connection polygons at the diffusion contacts 503.

The gate electrode features 501 and diffusion contacts 503 share a common grid spacing. More specifically, the gate electrode feature 501 placement is offset by one-half the grid spacing relative to the diffusion contacts 503. For example, if the gate electrode features 501 and diffusion contact 503 grid spacing is 0.36 μm, then the diffusion contacts are placed such that the x-coordinate of their center falls on an integer multiple of 0.36 μm, while the x-coordinate of the center of each gate electrode feature 501 minus 0.18 μm should be an integer multiple of 0.36 μm. In the present example, the x-coordinates are represented by the following:

Diffusion contact center x-coordinate=I*0.36 μm, where I is the grid number;

Gate electrode feature center x-coordinate=0.18 μm+I*0.36 μm, where I is the grid number.

The grid based system of the dynamic array ensures that all contacts (diffusion and gate electrode) will land on a horizontal grid that is equal to a multiple of one-half of the diffusion contact grid and a vertical grid that is set by the metal 1 pitch. In the example above, the gate electrode feature and diffusion contact grid is 0.36 μm. The diffusion contacts and gate electrode contacts will land on a horizontal grid that is a multiple of 0.18 μm. Also, the vertical grid for 90 nm process technologies is about 0.24 μm.

Figure 6:
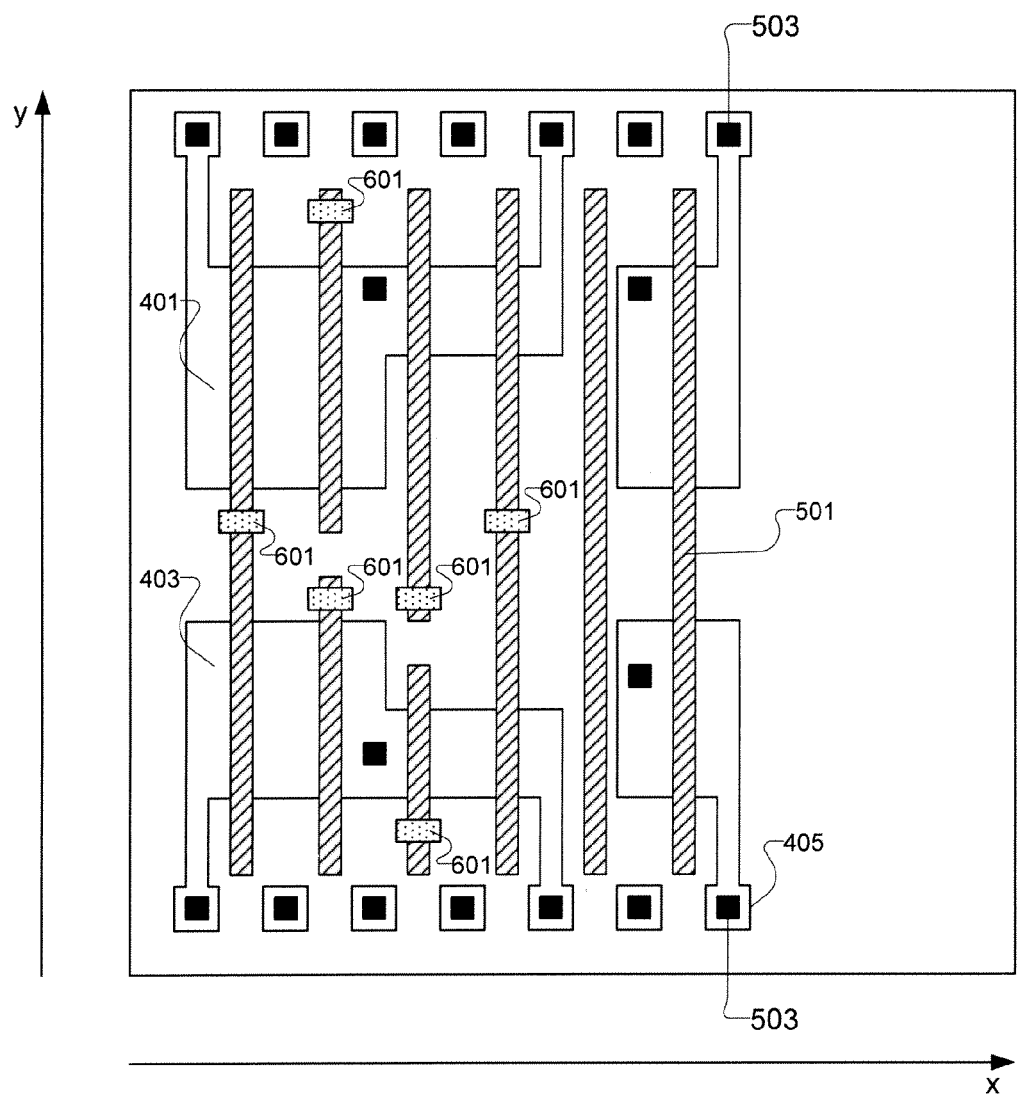
FIG. 6 is an illustration showing a gate electrode contact layer defined above and adjacent to the gate electrode layer of FIG. 5, in accordance with one embodiment of the present invention.

FIG. 6 is an illustration showing a gate electrode contact layer defined above and adjacent to the gate electrode layer of FIG. 5, in accordance with one embodiment of the present invention. In the gate electrode contact layer, gate electrode contacts 601 are drawn to enable connection of the gate electrode features 501 to the overlying metal conduction lines. In general, design rules will dictate the optimum placement of the gate electrode contacts 601. In one embodiment, the gate electrode contacts are drawn on top of the transistor endcap regions. This embodiment minimizes white space in the dynamic array when design rules specify long transistor endcaps. In some process technologies white space may be minimized by placing a number of gate electrode contacts for a cell in the center of the cell. Also, it should be appreciated that in the present invention, the gate electrode contact 601 is oversized in the direction perpendicular to the gate electrode feature 501 to ensure overlap between the gate electrode contact 601 and the gate electrode feature 501.

Figure 7A:
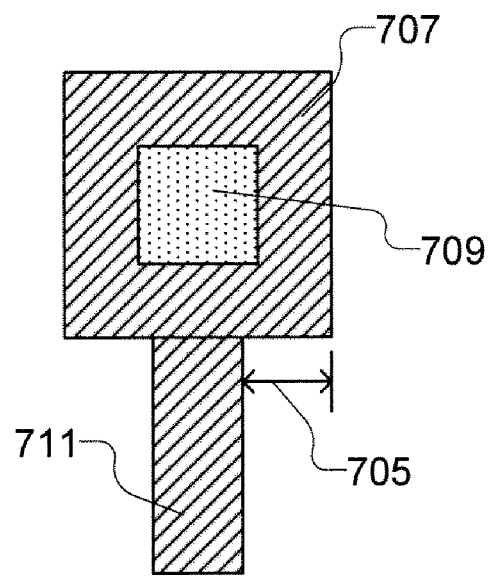
FIG. 7A is an illustration showing a traditional approach for making contact to the gate electrode.

FIG. 7A is an illustration showing a traditional approach for making contact to a gate electrode, e.g., polysilicon feature. In the traditional configuration of FIG. 7A, an enlarged rectangular gate electrode region 707 is defined where a gate electrode contact 709 is to be located. The enlarged rectangular gate electrode region 707 introduces a bend of distance 705 in the gate electrode. The bend associated with the enlarged rectangular gate electrode region 707 sets up undesirable light interactions and distorts the gate electrode line 711. Distortion of the gate electrode line 711 is especially problematic when the gate electrode width is about the same as a transistor length.

Figure 7B:
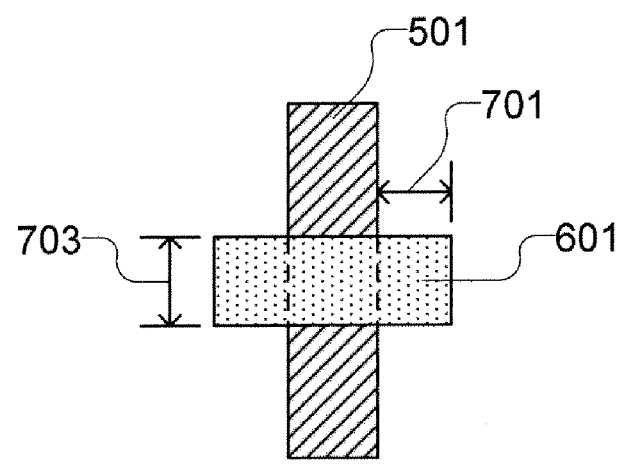
FIG. 7B is an illustration showing a gate electrode contact defined in accordance with one embodiment of the present invention.

FIG. 7B is an illustration showing a gate electrode contact 601, e.g., polysilicon contact, defined in accordance with one embodiment of the present invention. The gate electrode contact 601 is drawn to overlap the edges of the gate electrode feature 501, and extend in a direction substantially perpendicular to the gate electrode feature 501. In one embodiment, the gate electrode contact 601 is drawn such that the vertical dimension 703 is same as the vertical dimension used for the diffusion contacts 503. For example, if the diffusion contact 503 opening is specified to be 0.12 μm square then the vertical dimension of the gate electrode contact 601 is drawn at 0.12 μm. However, in other embodiments, the gate electrode contact 601 can be drawn such that the vertical dimension 703 is different from the vertical dimension used for the diffusion contacts 503.

In one embodiment, the gate electrode contact 601 extension 701 beyond the gate electrode feature 501 is set such that maximum overlap is achieved between the gate electrode contact 601 and the gate electrode feature 501. The extension 701 is defined to accommodate line end shortening of the gate electrode contact 601, and misalignment between the gate electrode contact layer and gate electrode feature layer. The length of the gate electrode contact 601 is defined to ensure maximum surface area contact between the gate electrode contact 601 and the gate electrode feature 501, wherein the maximum surface area contact is defined by the width of the gate electrode feature 501.

Figure 8A:
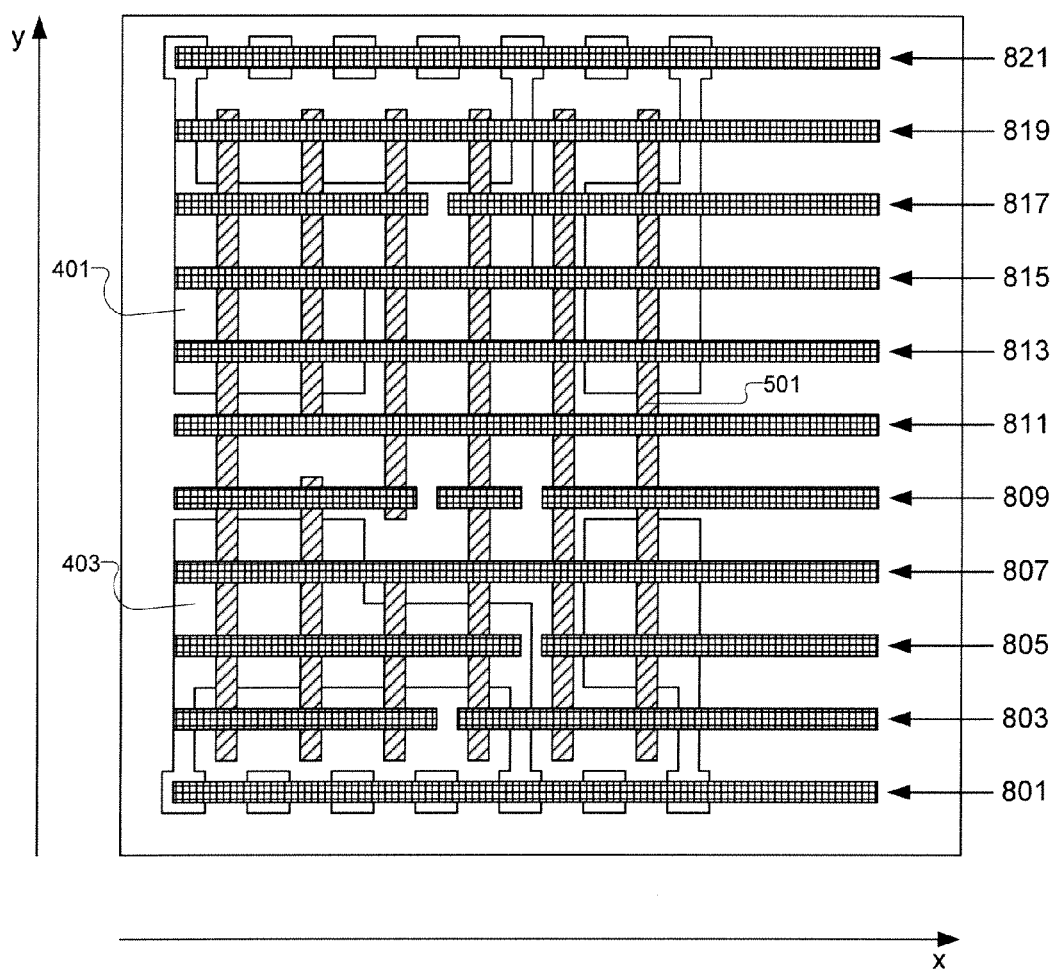
FIG. 8A is an illustration showing a metal 1 layer defined above and adjacent to the gate electrode contact layer of FIG. 6, in accordance with one embodiment of the present invention.

FIG. 8A is an illustration showing a metal 1 layer defined above the gate electrode contact layer of FIG. 6, in accordance with one embodiment of the present invention. The metal 1 layer includes a number of metal 1 tracks 801-821 defined to include linear shaped features extending in a parallel relationship across the dynamic array. The metal 1 tracks 801-821 extend in a direction substantially perpendicular to the gate electrode features 501 in the underlying gate electrode layer of FIG. 5. Thus, in the present example, the metal 1 tracks 801-821 extend linearly across the dynamic array in the first reference direction (x). The pitch (center-to-center spacing) of the metal 1 tracks 801-821 is minimized while ensuring optimization of lithographic reinforcement, i.e., resonant imaging, provided by neighboring metal 1 tracks 801-821. For example, in one embodiment, the metal 1 tracks 801-821 are centered on a vertical grid of about 0.24 μm for a 90 nm process technology.

Each of the metal 1 tracks 801-821 may be interrupted, i.e., broken, any number of times in linearly traversing across the dynamic array in order to provide required electrical connectivity for a particular logic function to be implemented. When a given metal 1 track 801-821 is required to be interrupted, the separation between ends of the metal 1 track segments at the point of interruption is minimized to the extent possible taking into consideration manufacturing capability and electrical effects. Minimizing the separation between ends of the metal 1 track segments at the points of interruption serves to maximize the lithographic reinforcement, and uniformity thereof, provided from neighboring metal 1 tracks. Also, in one embodiment, if adjacent metal 1 tracks need to be interrupted, the interruptions of the adjacent metal 1 tracks are made such that the respective points of interruption are offset from each other so as to avoid, to the extent possible, an occurrence of neighboring points of interruption. More specifically, points of interruption within adjacent metal 1 tracks are respectively positioned such that a line of sight does not exist through the points of interruption, wherein the line of sight is considered to extend perpendicularly to the direction in which the metal 1 tracks extend over the substrate.

Figure 8B:
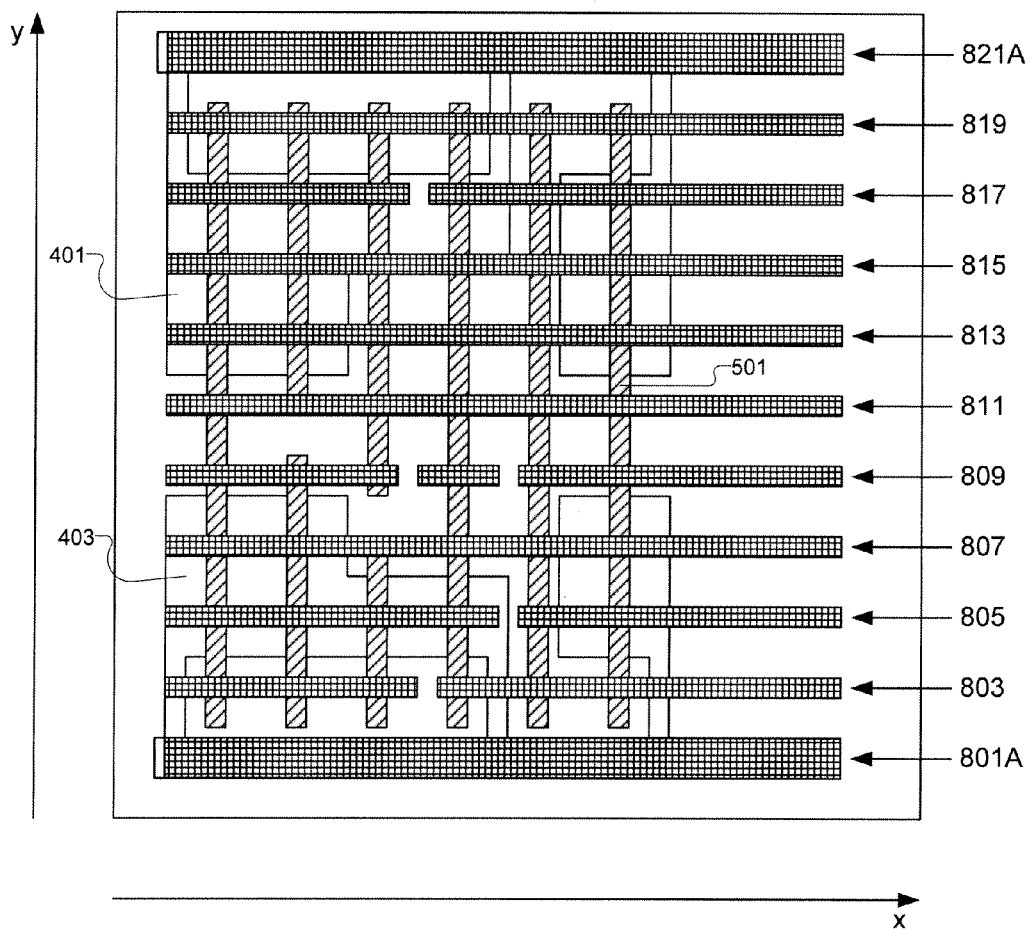
FIG. 8B is an illustration showing the metal 1 layer of FIG. 8A with larger track widths for the metal 1 ground and power tracks, relative to the other metal 1 tracks.

In the example of FIG. 8A, the metal 1 track 801 is connected to the ground supply, and the metal 1 track 821 is connected to the power supply voltage. In the embodiment of FIG. 8A, the widths of the metal 1 tracks 801 and 821 are the same as the other metal 1 tracks 803-819. However, in another embodiment, the widths of metal 1 tracks 801 and 821 are larger than the widths of the other metal 1 tracks 803-819. FIG. 8B is an illustration showing the metal 1 layer of FIG. 8A with larger track widths for the metal 1 ground and power tracks (801A and 821A), relative to the other metal 1 tracks 803-819.

The metal 1 track pattern is optimally configured to optimize the use of "white space" (space not occupied by transistors). The example of FIG. 8A includes the two shared metal 1 power tracks 801 and 821, and nine metal 1 signal tracks 803-819. Metal 1 tracks 803, 809, 811, and 819 are defined as gate electrode contact tracks in order to minimize white space. Metal 1 tracks 805 and 807 are defined to connect to n-channel transistor source and drains. Metal 1 tracks 813, 815, and 817 are defined to connect to p-channel source and drains. Also, any of the nine metal 1 signal tracks 803-819 can be used as a feed through if no connection is required. For example, metal 1 tracks 813 and 815 are configured as feed through connections.

Figure 9:
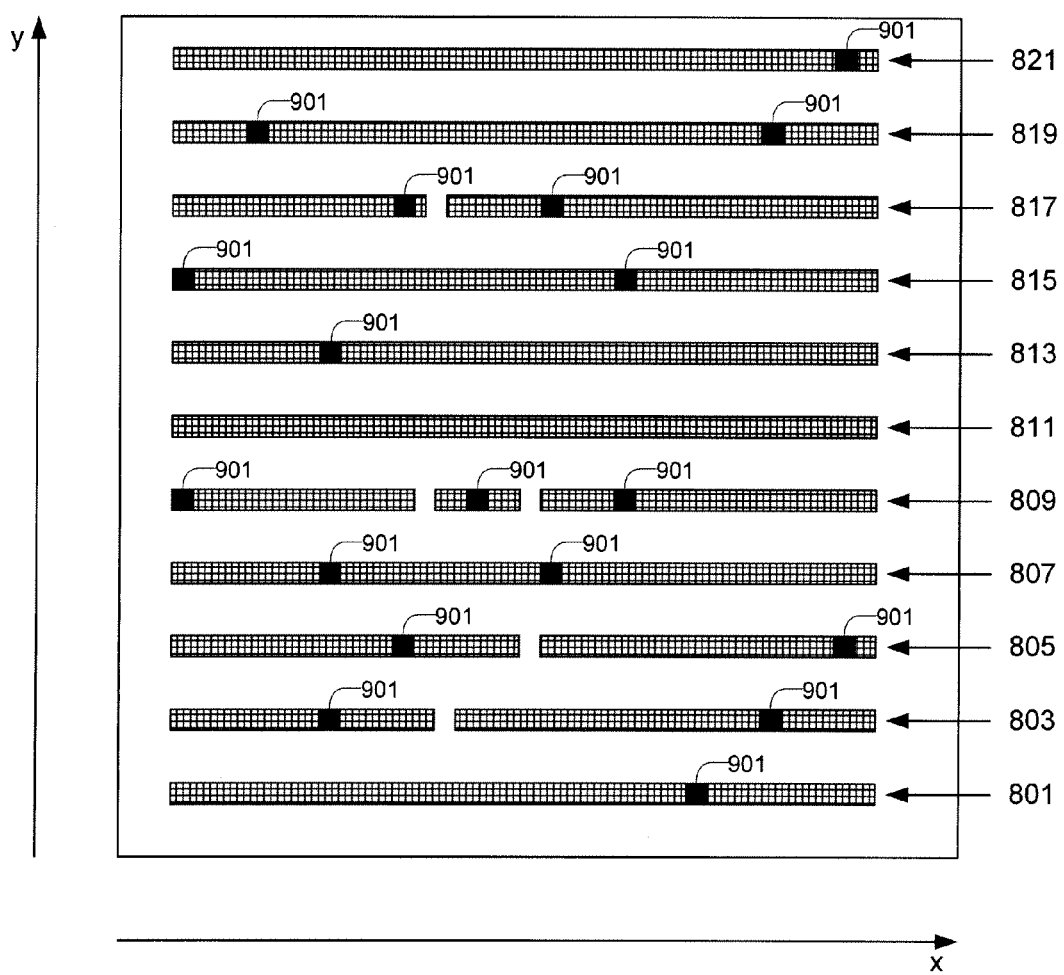
FIG. 9 is an illustration showing a via 1 layer defined above and adjacent to the metal 1 layer of FIG. 8A, in accordance with one embodiment of the present invention.

FIG. 9 is an illustration showing a via 1 layer defined above and adjacent to the metal 1 layer of FIG. 8A, in accordance with one embodiment of the present invention. Vias 901 are defined in the via 1 layer to enable connection of the metal 1 tracks 801-821 to higher level conduction lines.

Figure 10:
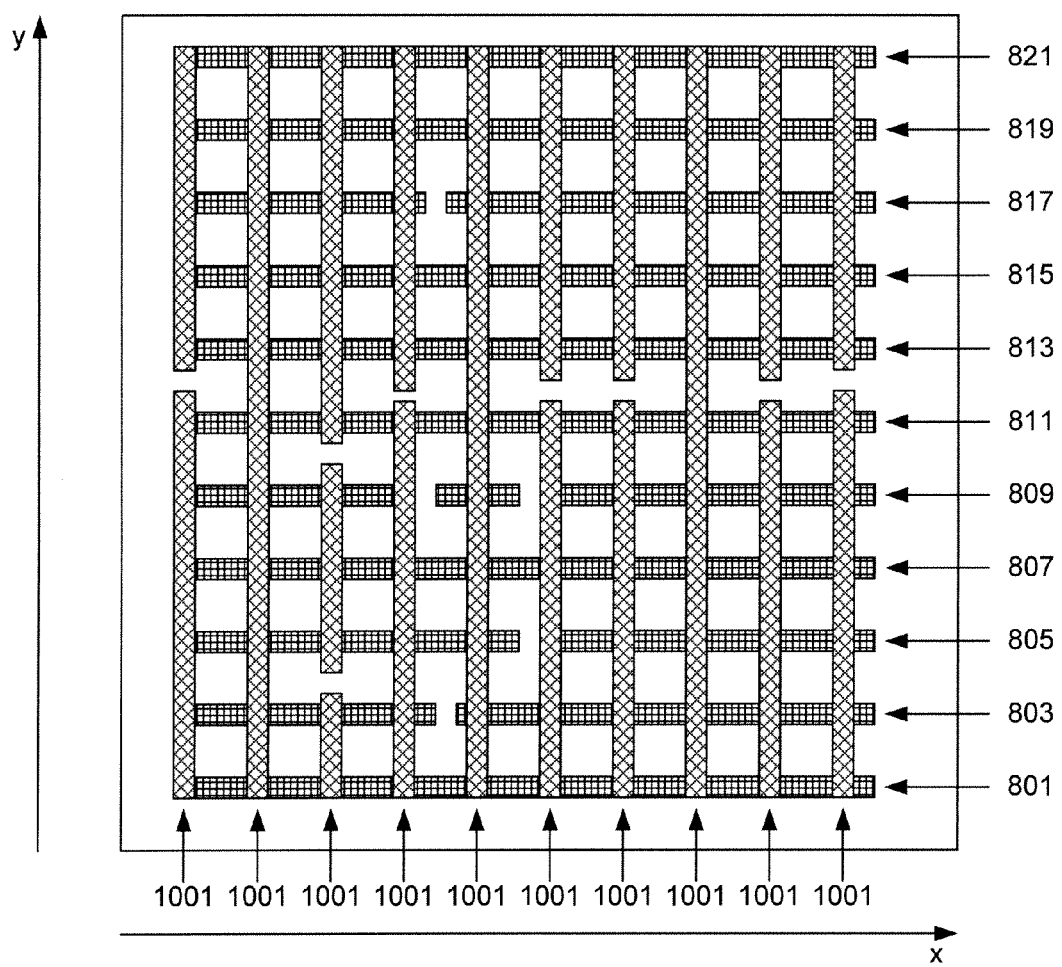
FIG. 10 is an illustration showing a metal 2 layer defined above and adjacent to the via 1 layer of FIG. 9, in accordance with one embodiment of the present invention.

FIG. 10 is an illustration showing a metal 2 layer defined above and adjacent to the via 1 layer of FIG. 9, in accordance with one embodiment of the present invention. The metal 2 layer includes a number of metal 2 tracks 1001 defined as linear shaped features extending in a parallel relationship across the dynamic array. The metal 2 tracks 1001 extend in a direction substantially perpendicular to the metal 1 tracks 801-821 in the underlying metal 1 layer of FIG. 8A, and in a direction substantially parallel to the gate electrode tracks 501 in the underlying gate electrode layer of FIG. 5. Thus, in the present example, the metal 2 tracks 1001 extend linearly across the dynamic array in the second reference direction (y).

The pitch (center-to-center spacing) of the metal 2 tracks 1001 is minimized while ensuring optimization of lithographic reinforcement, i.e., resonant imaging, provided by neighboring metal 2 tracks. It should be appreciated that regularity can be maintained on higher level interconnect layers in the same manner as implemented in the gate electrode and metal 1 layers. In one embodiment, the gate electrode feature 501 pitch and the metal 2 track pitch is the same. In another embodiment, the contacted gate electrode pitch (e.g., polysilicon-to-polysilicon space with a diffusion contact in between) is greater than the metal 2 track pitch. In this embodiment, the metal 2 track pitch is optimally set to be ⅔ or ¾ of the contacted gate electrode pitch. Thus, in this embodiment, the gate electrode track and metal 2 track align at every two gate electrode track pitches and every three metal 2 track pitches. For example, in a 90 nm process technology, the optimum contacted gate electrode track pitch is 0.36 µm, and the optimum metal 2 track pitch is 0.24 µm. In another embodiment, the gate electrode track and the metal 2 track align at every three gate electrode pitches and every four metal 2 pitches. For example, in a 90 nm process technology, the optimum contacted gate electrode track pitch is 0.36 µm, and the optimum metal 2 track pitch is 0.27 µm.

Each of the metal 2 tracks 1001 may be interrupted, i.e., broken, any number of times in linearly traversing across the dynamic array in order to provide required electrical connectivity for a particular logic function to be implemented. When a given metal 2 track 1001 is required to be interrupted, the separation between ends of the metal 2 track segments at the point of interruption is minimized to the extent possible taking into consideration manufacturing and electrical effects. Minimizing the separation between ends of the metal 2 track segments at the points of interruption serves to maximize the lithographic reinforcement, and uniformity thereof, provided from neighboring metal 2 tracks. Also, in one embodiment, if adjacent metal 2 tracks need to be interrupted, the interruptions of the adjacent metal 2 tracks are made such that the respective points of interruption are offset from each other so as to avoid, to the extent possible, an occurrence of neighboring points of interruption. More specifically, points of interruption within adjacent metal 2 tracks are respectively positioned such that a line of sight does not exist through the points of interruption, wherein the line of sight is considered to extend perpendicularly to the direction in which the metal 2 tracks extend over the substrate.

Figure 11:
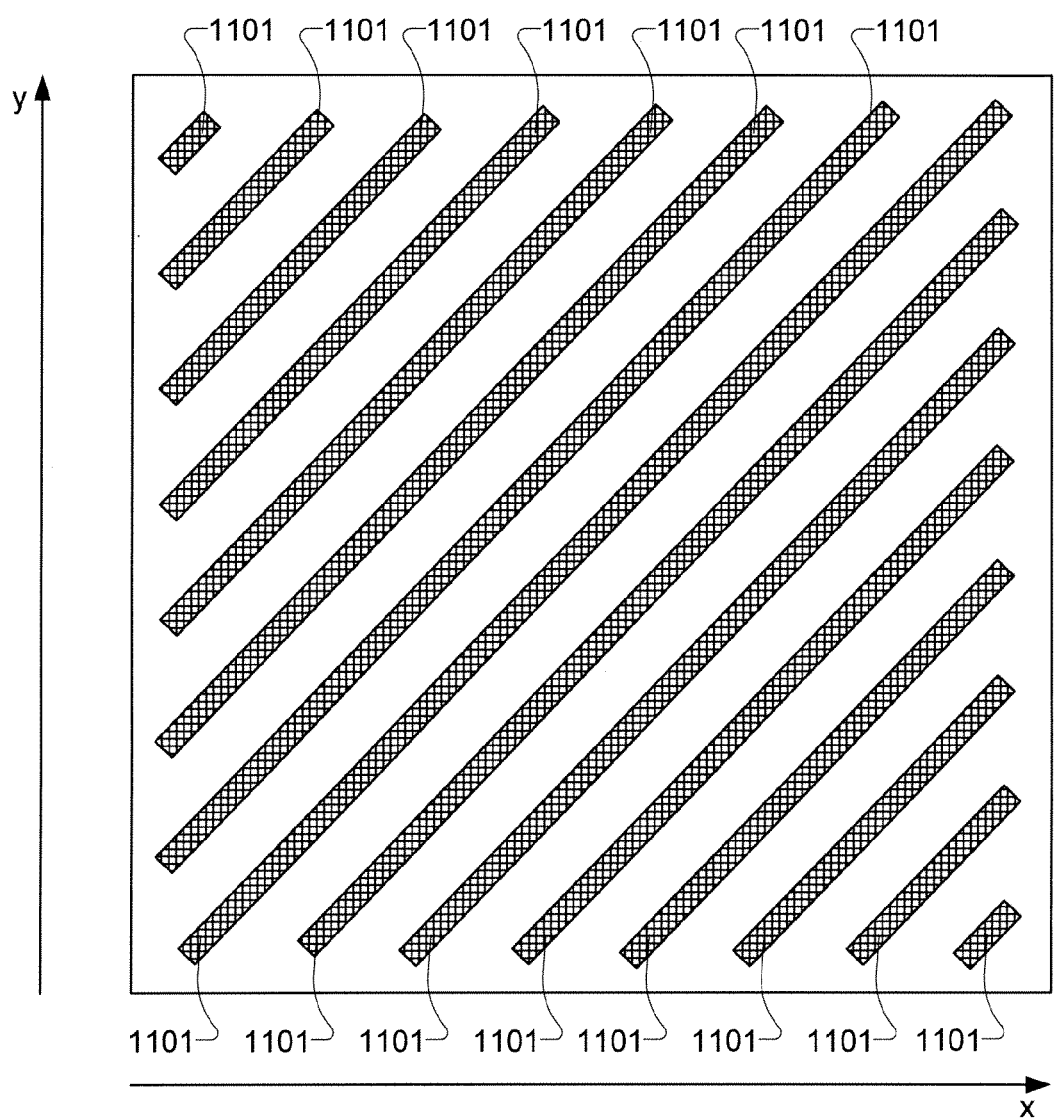
FIG. 11 is an illustration showing conductor tracks traversing the dynamic array in a first diagonal direction relative to the first and second reference directions (x) and (y), in accordance with one embodiment of the present invention.
Figure 12:
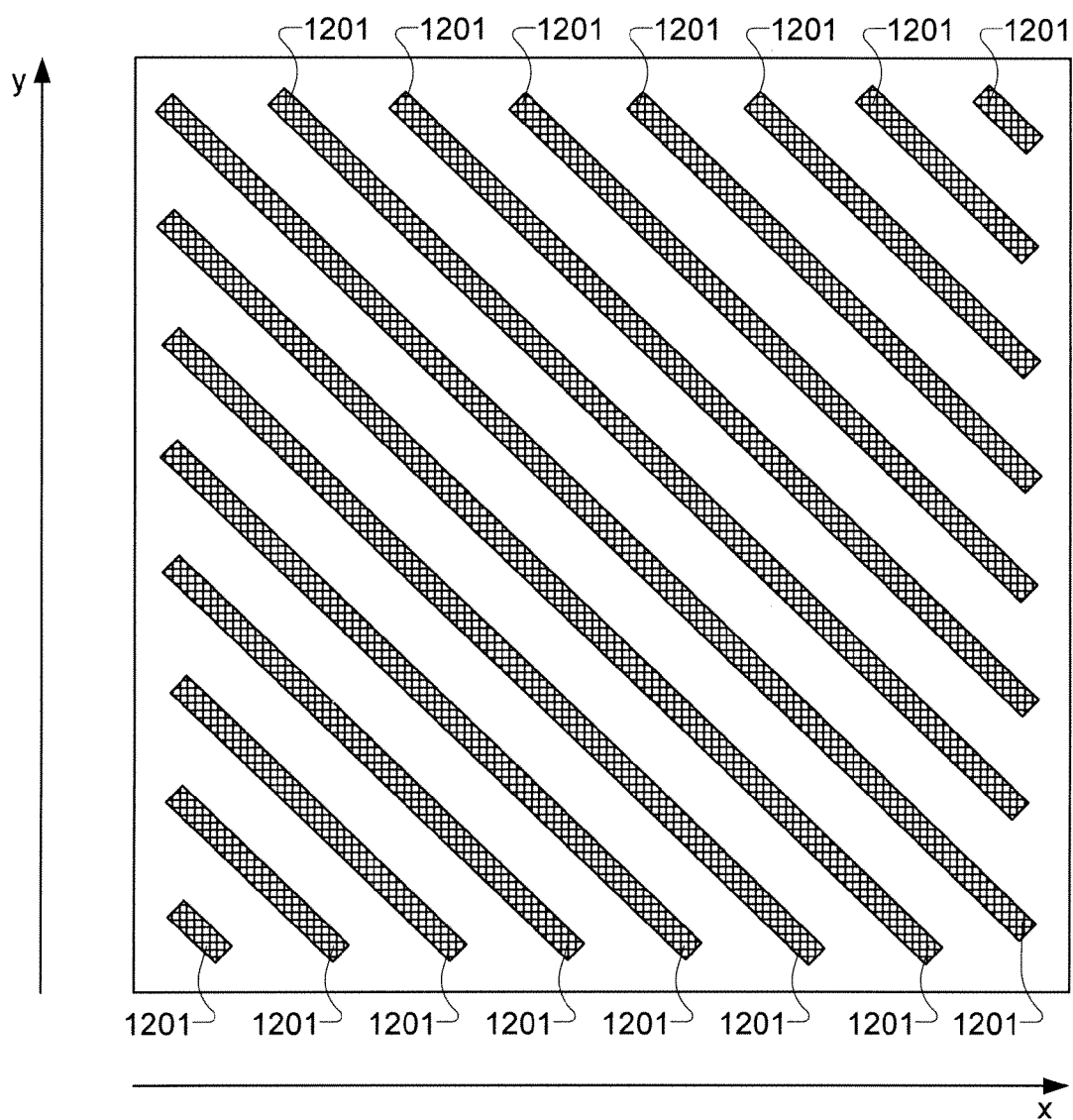
FIG. 12 is an illustration showing conductor tracks traversing the dynamic array in a second diagonal direction relative to the first and second reference directions (x) and (y), in accordance with one embodiment of the present invention.

As discussed above, the conduction lines in a given metal layer above the gate electrode layer may traverse the dynamic array in a direction coincident with either the first reference direction (x) or the second reference direction (y). It should be further appreciated that the conduction lines in a given metal layer above the gate electrode layer may traverse the dynamic array in a diagonal direction relative to the first and second reference directions (x) and (y). FIG. 11 is an illustration showing conductor tracks 1101 traversing the dynamic array in a first diagonal direction relative to the first and second reference directions (x) and (y), in accordance with one embodiment of the present invention. FIG. 12 is an illustration showing conductor tracks 1201 traversing the dynamic array in a second diagonal direction relative to the first and second reference directions (x) and (y), in accordance with one embodiment of the present invention.

As with the metal 1 and metal 2 tracks discussed above, the diagonal traversing conductor tracks 1101 and 1201 of FIGS. 11 and 12 may be interrupted, i.e., broken, any number of times in linearly traversing across the dynamic array in order to provide required electrical connectivity for a particular logic function to be implemented. When a given diagonal traversing conductor track is required to be interrupted, the separation between ends of the diagonal conductor track at the point of interruption is minimized to the extent possible taking into consideration manufacturing and electrical effects. Minimizing the separation between ends of the diagonal conductor track at the points of interruption serves to maximize the lithographic reinforcement, and uniformity thereof, provided from neighboring diagonal conductor tracks.

An optimal layout density within the dynamic array is achieved by implementing the following design rules:
- at least two metal 1 tracks be provided across the n-channel device area;
- at least two metal 1 tracks be provided across the p-channel device area;
- at least two gate electrode tracks be provided for the n-channel device; and
- at least two gate electrode tracks be provided for the p-channel device.

Contacts and vias are becoming the most difficult mask from a lithographic point of view. This is because the contacts and vias are getting smaller, more closely spaced, and are randomly distributed. The spacing and density of the cuts (contact or vias) makes it extremely difficult to reliably print the shapes. For example, cut shapes may be printed improperly due to destructive interference patterns from neighboring shapes or lack of energy on lone shapes. If a cut is properly printed, the manufacturing yield of the associated contact or via is extremely high. Sub-resolution contacts can be provided to reinforce the exposure of the actual contacts, so long as the sub-resolution contacts do not resolve. Also, the sub-resolution contacts can be of any shape so long as they are smaller than the resolution capability of the lithographic process.

Figure 13A:
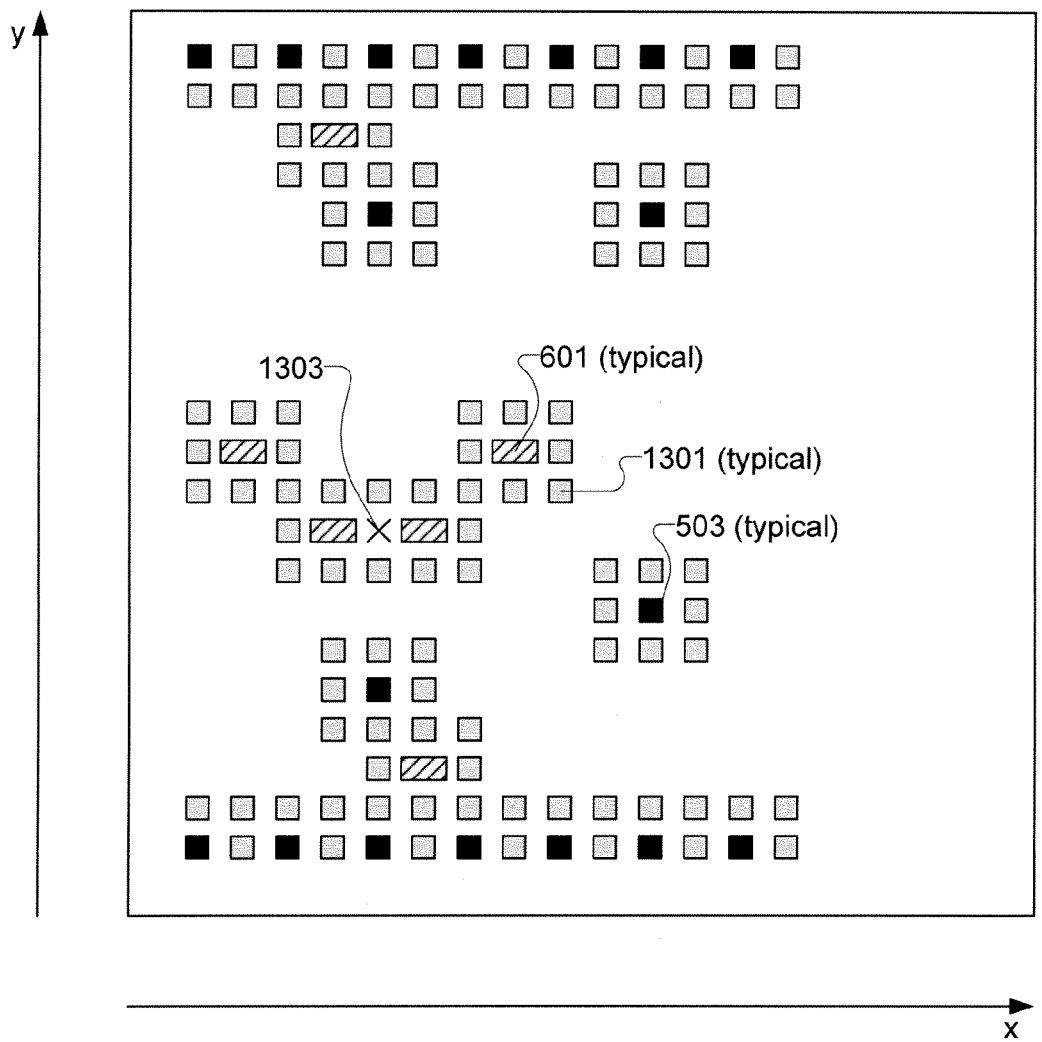
FIG. 13A is an illustration showing an example of a sub-resolution contact layout used to lithographically reinforce diffusion contacts and gate electrode contacts, in accordance with one embodiment of the present invention.

FIG. 13A is an illustration showing an example of a sub-resolution contact layout used to lithographically reinforce diffusion contacts and gate electrode contacts, in accordance with one embodiment of the present invention. Sub-resolution contacts 1301 are drawn such that they are below the resolution of the lithographic system and will not be printed. The function of the sub-resolution contacts 1301 is to increase the light energy at the desired contact locations, e.g., 503, 601, through resonant imaging. In one embodiment, sub-resolution contacts 1301 are placed on a grid such that both gate electrode contacts 601 and diffusion contacts 503 are lithographically reinforced. For example, sub-resolution contacts 1301 are placed on a grid that is equal to one-half the diffusion contact 503 grid spacing to positively impact both gate electrode contacts 601 and diffusion contacts 503. In one embodiment, a vertical spacing of the sub-resolution contacts 1301 follows the vertical spacing of the gate electrode contacts 601 and diffusion contacts 503.

Grid location 1303 in FIG. 13A denotes a location between adjacent gate electrode contacts 601. Depending upon the lithographic parameters in the manufacturing process, it is possible that a sub-resolution contact 1301 at this grid location would create an undesirable bridge between the two adjacent gate electrode contacts 601. If bridging is likely to occur, a sub-resolution contact 1301 at location 1303 can be omitted. Although FIG. 13A shows an embodiment where sub-resolution contacts are placed adjacent to actual features to be resolved and not elsewhere, it should be understood that another embodiment may place a sub-resolution contact at each available grid location so as to fill the grid.

Figure 13B:
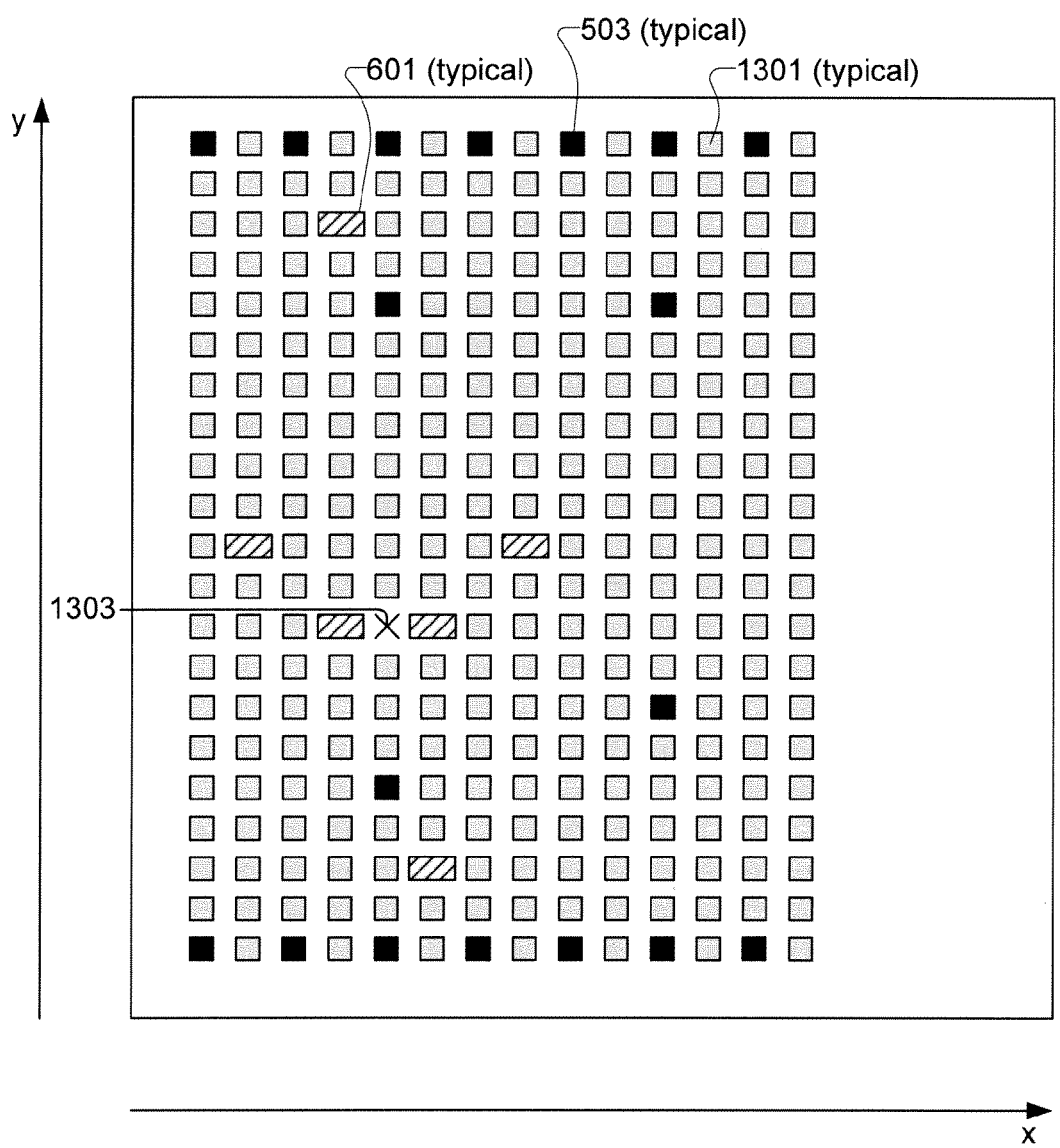
FIG. 13B is an illustration showing the sub-resolution contact layout of FIG. 13A with sub-resolution contacts defined to fill the grid to the extent possible, in accordance with one embodiment of the present invention.

FIG. 13B is an illustration showing the sub-resolution contact layout of FIG. 13A with sub-resolution contacts defined to fill the grid to the extent possible, in accordance with one embodiment of the present invention. It should be appreciated that while the embodiment of FIG. 13B fills the grid to the extent possible with sub-resolution contacts, placement of sub-resolution contacts is avoided at locations that would potentially cause undesirable bridging between adjacent fully resolved features.

Figure 13C:
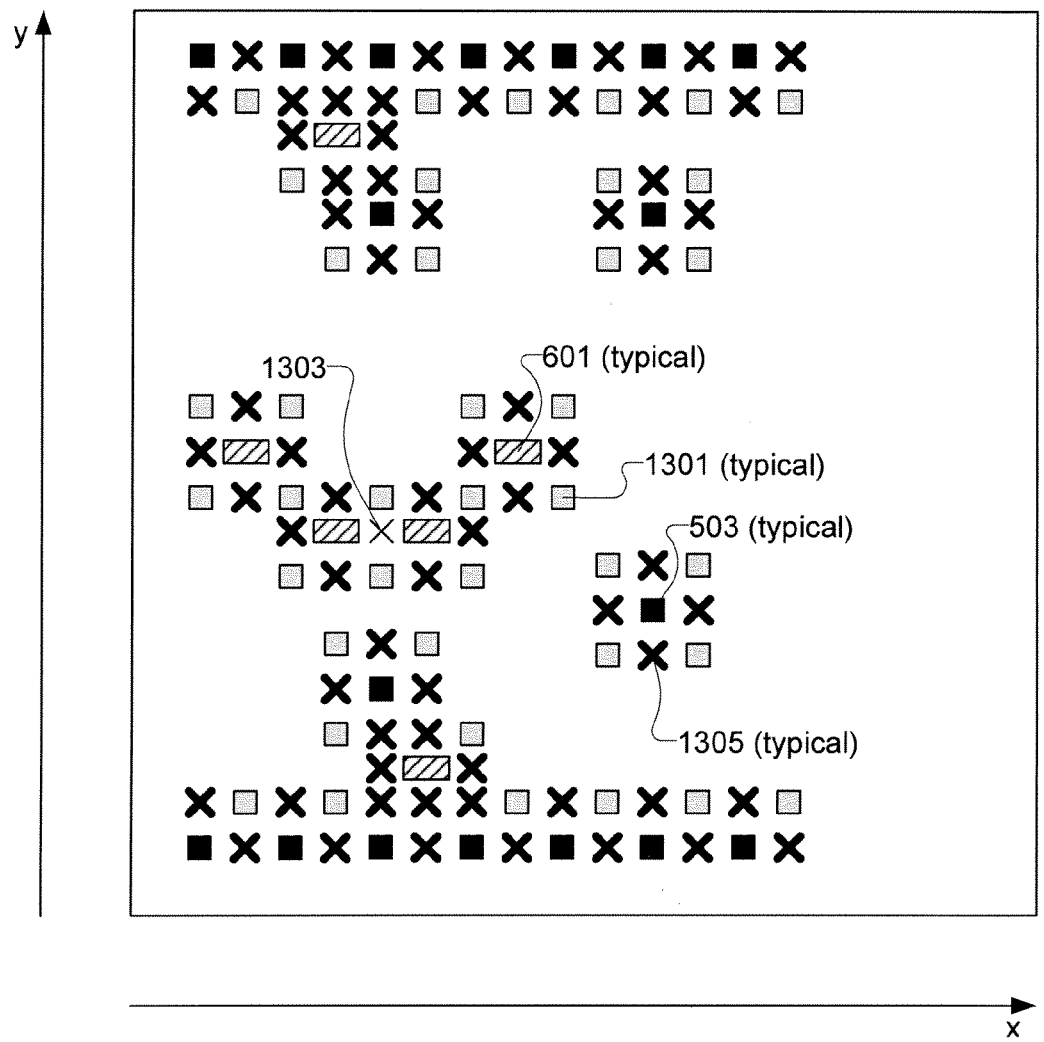
FIG. 13C is an illustration showing an example of a sub-resolution contact layout utilizing various shaped sub-resolution contacts, in accordance with one embodiment of the present invention.

FIG. 13C is an illustration showing an example of a sub-resolution contact layout utilizing various shaped sub-resolution contacts, in accordance with one embodiment of the present invention. Alternative sub-resolution contact shapes can be utilized so long as the sub-resolution contacts are below the resolution capability of the manufacturing process. FIG. 13C shows the use of "X-shaped" sub-resolution contacts 1305 to focus light energy at the corners of the adjacent contacts. In one embodiment, the ends of the X-shaped sub-resolution contact 1305 are extended to further enhance the deposition of light energy at the corners of the adjacent contacts.

Figure 13D:
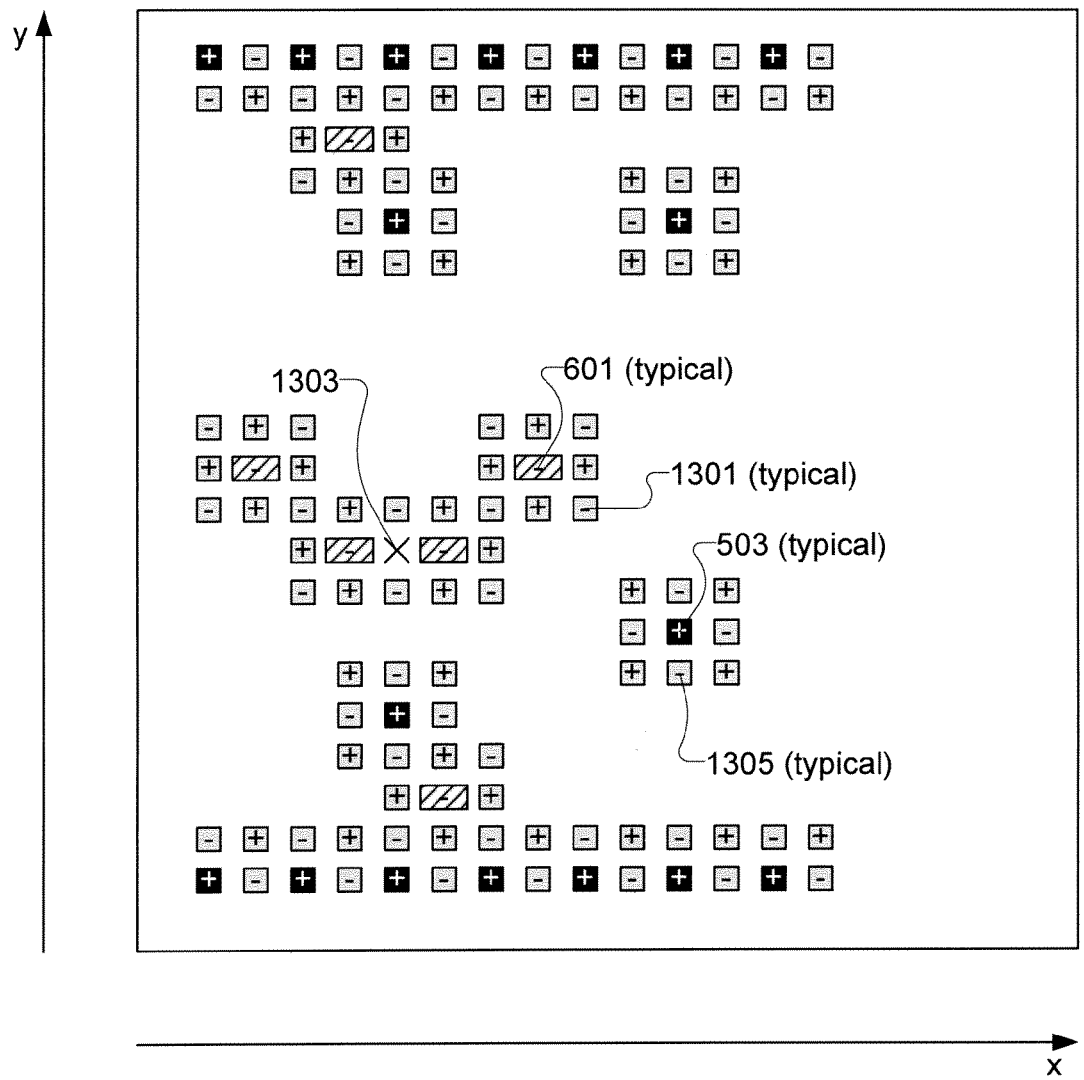
FIG. 13D is an illustration showing an exemplary implementation of alternate phase shift masking (APSM) with sub-resolution contacts, in accordance with one embodiment of the present invention.

FIG. 13D is an illustration showing an exemplary implementation of alternate phase shift masking (APSM) with sub-resolution contacts, in accordance with one embodiment of the present invention. As in FIG. 13A, sub-resolution contacts are utilized to lithographically reinforce diffusion contacts 503 and gate electrode contacts 601. APSM is used to improve resolution when neighboring shapes create destructive interference patterns. The APSM technique modifies the mask so that the phase of light traveling through the mask on neighboring shapes is 180 degrees out of phase. This phase shift serves to remove destructive interference and allowing for greater contact density. By way of example, contacts in FIG. 13D marked with a plus "+" sign represent contacts exposed with light waves of a first phase while contacts marked with a minus sign "−" represent contacts exposed with light waves that are shifted in phase by 180 degrees relative to the first phase used for the "+" sign contacts. It should be appreciated that the APSM technique is utilized to ensure that adjacent contacts are separated from each other.

As feature sizes decrease, semiconductor dies are capable of including more gates. As more gates are included, however, the density of the interconnect layers begins to dictate the die size. This increasing demand on the interconnect layers drives higher levels of interconnect layers. However, the stacking of interconnect layers is limited in part by the topology of the underlying layers. For example, as interconnect layers are built up, islands, ridges, and troughs can occur. These islands, ridges, and troughs can cause breaks in the interconnect lines that cross them.

To mitigate these islands and troughs, the semiconductor manufacturing process utilizes a chemical mechanical polishing (CMP) procedure to mechanically and chemically polish the surface of the semiconductor wafer such that each subsequent interconnect layer is deposited on a substantially flat surface. Like the photolithography process the quality of the CMP process is layout pattern dependent. Specifically, an uneven distribution of a layout features across a die or a wafer can cause too much material to be removed in some places and not enough material to be removed in other places, thus causing variations in the interconnect thickness and unacceptable variations in the capacitance and resistance of the interconnect layer. The capacitance and resistance variation within the interconnect layer may alter the timing of a critical net causing design failure.

The CMP process requires that dummy fill be added in the areas without interconnect shapes so that a substantially uniform wafer topology is provided to avoid dishing and improve center-to-edge uniformity. Traditionally, dummy fill is placed post-design. Thus, in the traditional approach the designer is not aware of the dummy fill characteristics. Consequently, the dummy fill placed post-design may adversely influence the design performance in a manner that has not been evaluated by the designer. Also, because the conventional topology prior to the dummy fill is unconstrained, i.e., nonuniform, the post-design dummy fill will not be uniform and predictable. Therefore, in the conventional process, the capacitive coupling between the dummy fill regions and the neighboring active nets cannot be predicted by the designer.

As previously discussed, the dynamic array disclosed herein provides optimal regularity by maximally filling all interconnect tracks from gate electrode layer upward. If multiple nets are required in a single interconnect track, the interconnect track is split with a minimally spaced gap. For example, track 809 representing the metal 1 conduction line in FIG. 8A represents three separate nets in the same track, where each net corresponds to a particular track segment. More specifically, there are two poly contact nets and a floating net to fill the track with minimal spacing between the track segments. The substantially complete filling of tracks maintains the regular pattern that creates resonant images across the dynamic array. Also, the regular architecture of the dynamic array with maximally filled interconnect tracks ensures that the dummy fill is placed in a uniform manner across the die. Therefore, the regular architecture of the dynamic array assists the CMP process to produce substantially uniform results across the die/wafer. Also, the regular gate pattern of the dynamic array assists with gate etching uniformity (microloading). Additionally, the regular architecture of the dynamic array combined with the maximally filled interconnect tracks allows the designer to analyze the capacitive coupling effects associated with the maximally filled tracks during the design phase and prior to fabrication.

Because the dynamic array sets the size and spacing of the linearly shaped features, i.e., tracks and contacts, in each mask layer, the design of the dynamic array can be optimized for the maximum capability of the manufacturing equipment and processes. That is to say, because the dynamic array is restricted to the regular architecture for each layer above diffusion, the manufacturer is capable of optimizing the manufacturing process for the specific characteristics of the regular architecture. It should be appreciated that with the dynamic array, the manufacturer does not have to be concerned with accommodating the manufacture of a widely varying set of arbitrarily-shaped layout features as is present in conventional unconstrained layouts.

An example of how the capability of manufacturing equipment can be optimized is provided as follows. Consider that a 90 nm process has a metal 2 pitch of 280 nm. This metal 2 pitch of 280 nm is not set by the maximum capability of equipment. Rather, this metal 2 pitch of 280 nm is set by the lithography of the vias. With the via lithography issues removed, the maximum capability of the equipment allows for a metal 2 pitch of about 220 nm. Thus, the design rules for metal 2 pitch include about 25% margin to account for the light interaction unpredictability in the via lithography.

The regular architecture implemented within the dynamic array allows the light interaction unpredictability in the via lithography to be removed, thus allowing for a reduction in the metal 2 pitch margin. Such a reduction in the metal 2 pitch margin allows for a more dense design, i.e., allows for optimization of chip area utilization. Additionally, with the restricted, i.e., regular, topology afforded by the dynamic array, the margin in the design rules can be reduced. Moreover, not only can the excess margin beyond the capability of the process be reduced, the restricted topology afforded by the dynamic array also allows the number of required design rules to be substantially reduced. For example, a typical design rule set for an unconstrained topology could have more than 600 design rules. A design rule set for use with the dynamic array may have about 45 design rules. Therefore, the effort required to analyze and verify the design against the design rules is decreased by more than a factor of ten with the restricted topology of the dynamic array.

When dealing with line end-to-line end gaps (i.e., track segment-to-track segment gaps) in a given track of a mask layer in the dynamic array, a limited number of light interactions exist. This limited number of light interactions can be identified, predicted, and accurately compensated for ahead of time, dramatically reducing or completely eliminating the requirement for OPC/RET. The compensation for light interactions at line end-to-line end gaps represents a lithographic modification of the as-drawn feature, as opposed to a correction based on modeling of interactions, e.g., OPC/RET, associated with the as-drawn feature.

Also, with the dynamic array, changes to the as-drawn layout are only made where needed. In contrast, OPC is performed over an entire layout in a conventional design flow. In one embodiment, a correction model can be implemented as part of the layout generation for the dynamic array. For example, due to the limited number of possible line end gap interactions, a router can be programmed to insert a line break having characteristics defined as a function of its surroundings, i.e., as a function of its particular line end gap light interactions. It should be further appreciated that the regular architecture of the dynamic array allows the line ends to be adjusted by changing vertices rather than by adding vertices. Thus, in contrast with unconstrained topologies that rely on the OPC process, the dynamic array significantly reduces the cost and risk of mask production. Also, because the line end gap interactions in the dynamic array can be accurately predicted in the design phase, compensation for the predicted line end gap interactions during the design phase does not increase risk of design failure.

In conventional unconstrained topologies, designers are required to have knowledge of the physics associated with the manufacturing process due to the presence of design dependent failures. With the grid-based system of the dynamic array as disclosed herein, the logical design can be separated from the physical design. More specifically, with the regular architecture of the dynamic array, the limited number of light interactions to be evaluated within the dynamic array, and the design independent nature of the dynamic array, designs can be represented using a grid point based netlist, as opposed to a physical netlist.

With the dynamic array, the design is not required to be represented in terms of physical information. Rather, the design can be represented as a symbolic layout. Thus, the designer can represent the design from a pure logic perspective without having to represent physical characteristics, e.g., sizes, of the design. It should be understood that the grid-based netlist, when translated to physical, matches the optimum design rules exactly for the dynamic array platform. When the grid-based dynamic array moves to a new technology, e.g., smaller technology, a grid-based netlist can be moved directly to the new technology because there is no physical data in the design representation. In one embodiment, the grid-based dynamic array system includes a rules database, a grid-based (symbolic) netlist, and the dynamic array architecture.

It should be appreciated that the grid-based dynamic array eliminates topology related failures associated with conventional unconstrained architectures. Also, because the manufacturability of the grid-based dynamic array is design independent, the yield of the design implemented on the dynamic array is independent of the design. Therefore, because the validity and yield of the dynamic array is preverified, the grid-based netlist can be implemented on the dynamic array with preverified yield performance.

Figure 14:
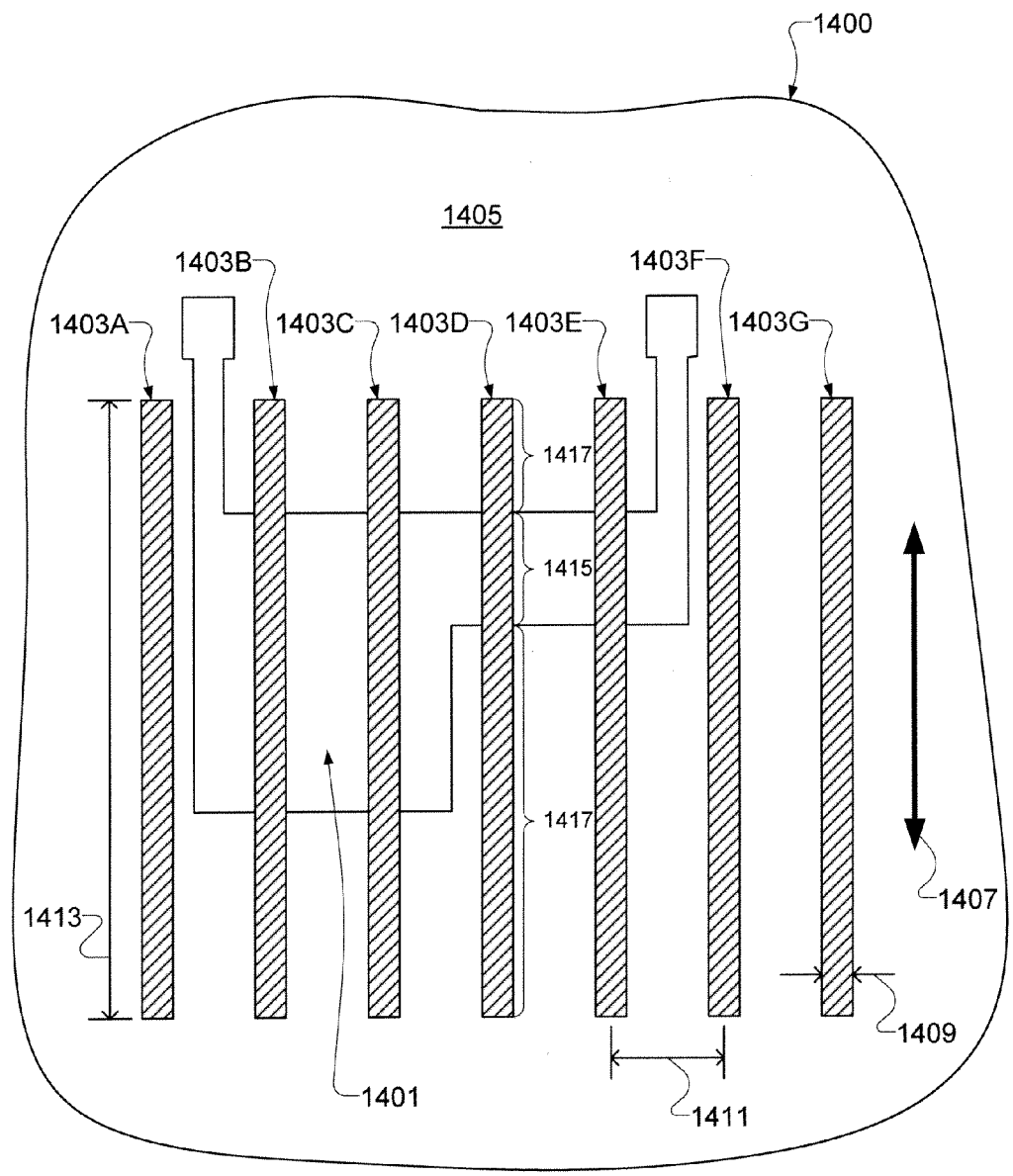
FIG. 14 is an illustration showing a semiconductor chip structure, in accordance with one embodiment of the present invention.

FIG. 14 is an illustration showing a semiconductor chip structure 1400, in accordance with one embodiment of the present invention. The semiconductor chip structure 1400 represents an exemplary portion of a semiconductor chip, including a diffusion region 1401 having a number of conductive lines 1403A-1403G defined thereover. The diffusion region 1401 is defined in a substrate 1405, to define an active region for at least one transistor device. The diffusion region 1401 can be defined to cover an area of arbitrary shape relative to the substrate 1405 surface.

The conductive lines 1403A-1403G are arranged to extend over the substrate 1405 in a common direction 1407. It should also be appreciated that each of the number of conductive lines 1403A-1403G are restricted to extending over the diffusion region 1401 in the common direction 1407. In one embodiment, the conductive lines 1403A-1403G defined immediately over the substrate 1405 are polysilicon lines. In one embodiment, each of the conductive lines 1403A-1403G is defined to have essentially the same width 1409 in a direction perpendicular to the common direction 1407 of extension. In another embodiment, some of the conductive lines 1403A-1403G are defined to have different widths relative to the other conductive lines. However, regardless of the width of the conductive lines 1403A-1403G, each of the conductive lines 1403A-1403G is spaced apart from adjacent conductive lines according to essentially the same center-to-center pitch 1411.

As shown in FIG. 14, some of the conductive lines (1403B-1403E) extend over the diffusion region 1401, and other conductive lines (1403A, 1403F, 1403G) extend over non-diffusion portions the substrate 1405. It should be appreciated that the conductive lines 1403A-1403G maintain their width 1409 and pitch 1411 regardless of whether they are defined over diffusion region 1401 or not. Also, it should be appreciated that the conductive lines 1403A-1403G maintain essentially the same length 1413 regardless of whether they are defined over diffusion region 1401 or not, thereby maximizing lithographic reinforcement between the conductive lines 1403A-1403G across the substrate. In this manner, some of the conductive lines, e.g., 1403D, defined over the diffusion region 1401 include a necessary active portion 1415, and one or more uniformity extending portions 1417.

It should be appreciated that the semiconductor chip structure 1400 represents a portion of the dynamic array described above with respect to FIGS. 2-13D. Therefore, it should be understood that the uniformity extending portions 1417 of the conductive lines (1403B-1403E) are present to provide lithographic reinforcement of neighboring conductive lines 1403A-1403G. Also, although they may not be required for circuit operation, each of conductive lines 1403A, 1403F, and 1403G are present to provide lithographic reinforcement of neighboring conductive lines 1403A-1403G.

The concept of the necessary active portion 1415 and the uniformity extending portions 1417 also applies to higher level interconnect layers. As previously described with regard to the dynamic array architecture, adjacent interconnect layers traverse over the substrate in transverse directions, e.g., perpendicular or diagonal directions, to enable routing/connectivity required by the logic device implemented within the dynamic array. As with the conductive lines 1403A-1403G, each of the conductive lines within an interconnect layer may include a required portion (necessary active portion) to enable required routing/connectivity, and a non-required portion (uniformity extending portion) to provide lithographic reinforcement to neighboring conductive lines. Also, as with the conductive lines 1403A-1403G, the conductive lines within an interconnect layer extend in a common direction over the substrate, have essentially the same width, and are spaced apart from each other according to an essentially constant pitch.

In one embodiment, conductive lines within an interconnect layer follow essentially the same ratio between line width and line spacing. For example, at 90 nm the metal 4 pitch is 280 nm with a line width and line spacing equal to 140 nm. Larger conductive lines can be printed on a larger line pitch if the line width is equal to the line spacing.

Figure 15:
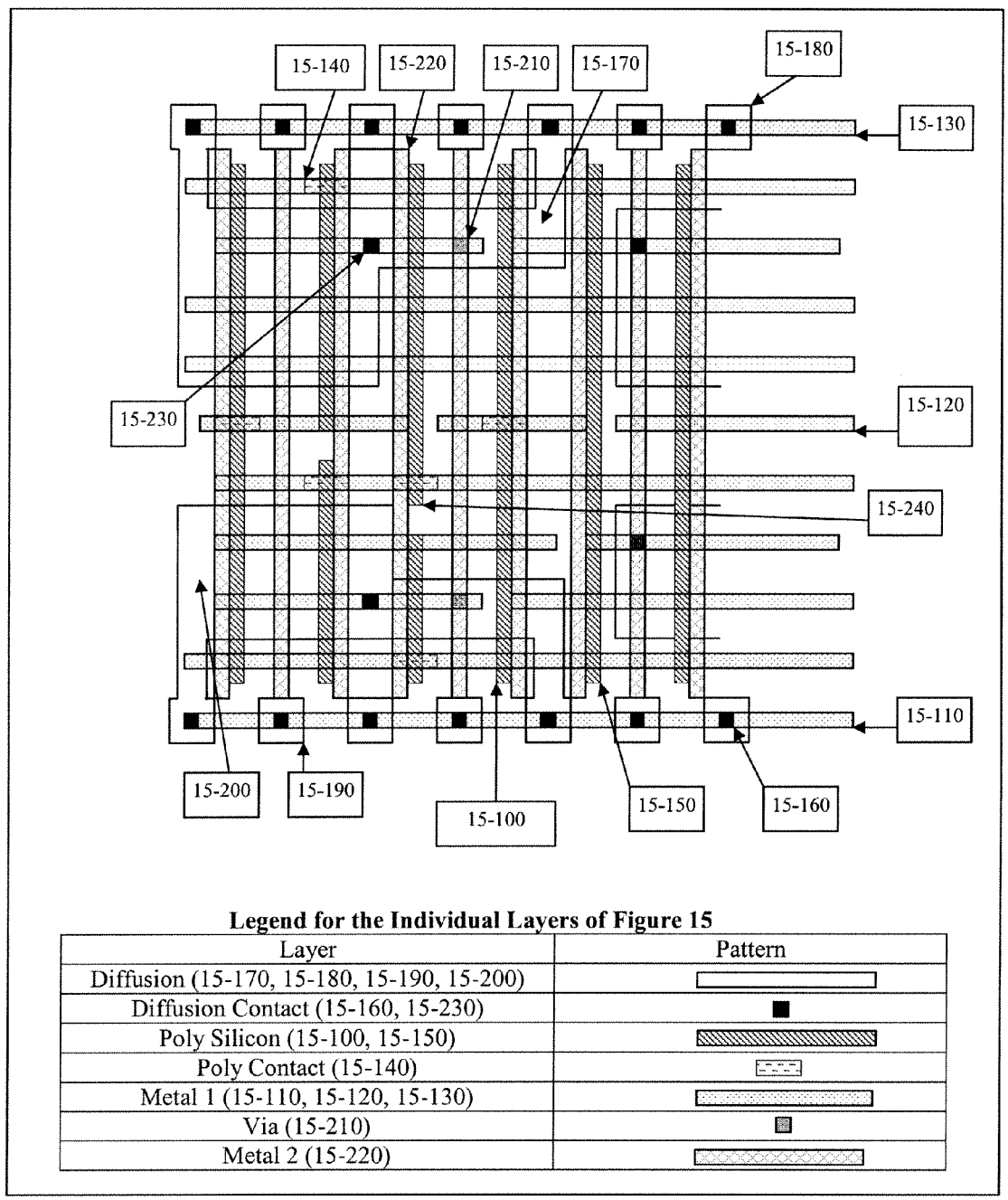
FIG. 15 shows an example layout architecture defined in accordance with one embodiment of the present invention.

FIG. 15 shows an example layout architecture defined in accordance with one embodiment of the present invention. The layout architecture follows a grid pattern and is based upon a horizontal grid and a vertical grid. The horizontal grid is set by the poly gate pitch. The vertical pitch is set by the metal 1/metal 3 pitch. All of the rectangular shapes should be centered on a grid point. The layout architecture minimizes the use of bends to eliminate unpredictable lithographic interactions. Bends are allowed on the diffusion layer to control transistor device sizes. Other layers should be rectangular in shape and fixed in one dimension.

The invention described herein can be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion. Additionally, a graphical user interface (GUI) implemented as computer readable code on a computer readable medium can be developed to provide a user interface for performing any embodiment of the present invention.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for creating a layout of an integrated circuit, comprising:
    operating a computer to define at least six linear conductive structure shapes in a gate electrode level region layout, the at least six linear conductive structure shapes each formed to extend lengthwise in a first direction, the at least six linear conductive structure shapes including
    a first linear conductive structure shape including a first gate portion that forms a gate electrode of a first transistor of a first transistor type and a second gate portion that forms a gate electrode of a first transistor of a second transistor type,
    a second linear conductive structure shape including a gate portion that forms a gate electrode of a second transistor of the first transistor type,
    a third linear conductive structure shape including a gate portion that forms a gate electrode of a second transistor of the second transistor type,
    a fourth linear conductive structure shape including a gate portion that forms a gate electrode of a third transistor of the first transistor type,
    a fifth linear conductive structure shape including a gate portion that forms a gate electrode of a third transistor of the second transistor type, and
    a sixth linear conductive structure shape including a first gate portion that forms a gate electrode of a fourth transistor of the first transistor type and a second gate portion that forms a gate electrode of a fourth transistor of the second transistor type,
    wherein at least two of the second, third, fourth, and fifth linear conductive structure shapes have different lengths as measured in the first direction.

2. A method for fabricating an integrated circuit, comprising:
fabricating a substrate region; and
fabricating a gate electrode level region above the substrate region to include at least six linear-shaped conductive structures each formed to extend lengthwise in a first direction, the at least six linear-shaped conductive structures fabricated to include
a first linear-shaped conductive structure including a first gate portion that forms a gate electrode of a first transistor of a first transistor type and a second gate portion that forms a gate electrode of a first transistor of a second transistor type,
a second linear-shaped conductive structure including a gate portion that forms a gate electrode of a second transistor of the first transistor type,
a third linear-shaped conductive structure including a gate portion that forms a gate electrode of a second transistor of the second transistor type,
a fourth linear-shaped conductive structure including a gate portion that forms a gate electrode of a third transistor of the first transistor type,
a fifth linear-shaped conductive structure including a gate portion that forms a gate electrode of a third transistor of the second transistor type,
a sixth linear-shaped conductive structure including a first gate portion that forms a gate electrode of a fourth transistor of the first transistor type and a second gate portion that forms a gate electrode of a fourth transistor of the second transistor type,
wherein at least two of the second, third, fourth, and fifth linear-shaped conductive structures have different lengths as measured in the first direction.

3. A method for fabricating an integrated circuit as recited in claim 2, wherein the at least six linear-shaped conductive structures within the gate electrode level region are fabricated to include a seventh linear-shaped conductive structure that does not form a gate electrode of a transistor and that is positioned between at least two gate forming linear-shaped conductive structures that each form at least one gate electrode of at least one transistor, wherein a size of the seventh linear-shaped conductive structure as measured in a second direction perpendicular to the first direction is substantially equal to a size of one or more of the at least two gate forming linear-shaped conductive structures as measured in the second direction.

4. A method for fabricating an integrated circuit as recited in claim 2, further comprising:
fabricating an interconnect level region above the substrate region to include a first linear-shaped conductive interconnect structure formed to extend lengthwise in a second direction perpendicular to the first direction.

5. A method for fabricating an integrated circuit as recited in claim 4, wherein the interconnect level region is fabricated to include a second linear-shaped conductive interconnect structure formed to extend lengthwise in the second direction, the second linear-shaped conductive interconnect structure positioned next to and spaced apart from the first linear-shaped conductive interconnect structure.

6. A method for fabricating an integrated circuit as recited in claim 5, wherein each of the second, third, fourth, and fifth linear-shaped conductive structures is positioned between the first and sixth linear-shaped conductive structures in the second direction perpendicular to the first direction.

7. A method for fabricating an integrated circuit as recited in claim 2, wherein the at least six linear-shaped conductive structures within the gate electrode level region are fabricated to include a seventh linear-shaped conductive structure that does not form a gate electrode of a transistor, wherein the seventh linear-shaped conductive structure is positioned next to and spaced apart from either the first linear-shaped conductive structure or the sixth linear-shaped conductive structure.

8. A method for fabricating an integrated circuit as recited in claim 7, wherein the at least six linear-shaped conductive structures within the gate electrode level region are fabricated to include an eighth linear-shaped conductive structure positioned next to and spaced apart from the seventh linear-shaped conductive structure, wherein the eighth linear-shaped conductive structure includes a first gate portion that forms a gate electrode of a fifth transistor of the first transistor type and a second gate portion that forms a gate electrode of a fifth transistor of the second transistor type.

9. A method for fabricating an integrated circuit as recited in claim 7, wherein a size of the seventh linear-shaped conductive structure as measured in a second direction perpendicular to the first direction is substantially equal to a size of a neighboring linear-shaped conductive structure as measured in the second direction, wherein the neighboring linear-shaped conductive structure is either the first linear-shaped conductive structure or the sixth linear-shaped conductive structure.

10. A method for fabricating an integrated circuit as recited in claim 2, further comprising:
fabricating an interconnect level region above the substrate region to include a first linear-shaped conductive interconnect structure formed to extend lengthwise in the first direction.

11. A method for fabricating an integrated circuit as recited in claim 10, wherein fabricating the interconnect level region includes fabricating a second linear-shaped conductive interconnect structure formed to extend lengthwise in the first direction, the second linear-shaped conductive interconnect structure positioned next to and spaced apart from the first linear-shaped conductive interconnect structure.

12. A method for fabricating an integrated circuit as recited in claim 11, wherein each of the at least six linear-shaped conductive structures is fabricated to have a lengthwise centerline, the at least six linear-shaped conductive structures positioned according to a first equal centerline-to-centerline pitch as measured in a second direction perpendicular to the first direction, such that a distance as measured in the second direction between lengthwise centerlines of different ones of the at least six linear-shaped conductive structures is an integer multiple of the first equal centerline-to-centerline pitch, and
wherein the first and second linear-shaped conductive interconnect structures are positioned in a side-by-side manner according to a second equal centerline-to-centerline pitch as measured in the second direction, the second equal centerline-to-centerline pitch defined as a fractional multiple of the first equal centerline-to-centerline pitch.

13. A method for fabricating an integrated circuit as recited in claim 12, wherein the second equal centerline-to-centerline pitch is less than or equal to the first equal centerline-to-centerline pitch.

14. A method for fabricating an integrated circuit as recited in claim 13, wherein the fractional multiple of the first equal centerline-to-centerline pitch is one.

15. A method for fabricating an integrated circuit as recited in claim 14, wherein the gate electrode level region is fabricated to include at least one non-gate forming linear-shaped conductive structure that does not form a gate electrode of a transistor.

16. A method for fabricating an integrated circuit as recited in claim 15, wherein each of the second, third, fourth, and fifth linear-shaped conductive structures is positioned between the first and sixth linear-shaped conductive structures in the second direction perpendicular to the first direction.

17. A method for fabricating an integrated circuit as recited in claim 11, further comprising:
fabricating a third linear-shaped conductive interconnect structure to extend lengthwise in a second direction perpendicular to the first direction.

18. A method for fabricating an integrated circuit as recited in claim 17, wherein the gate electrode level region is fabricated to include at least one non-gate forming linear-shaped conductive structure that does not form a gate electrode of a transistor.

19. A method for fabricating an integrated circuit as recited in claim 18, wherein the third linear-shaped conductive interconnect structure is fabricated within an interconnect level region different from the interconnect level region that includes the first and second linear-shaped conductive interconnect structures.

20. A method for fabricating an integrated circuit as recited in claim 18, wherein each of the second, third, fourth, and fifth linear-shaped conductive structures is positioned between the first and sixth linear-shaped conductive structures in the second direction perpendicular to the first direction.

21. A method for fabricating an integrated circuit as recited in claim 2, wherein each of the at least six linear-shaped conductive structures is fabricated to have a lengthwise centerline, wherein the first, second, fourth, and sixth linear-shaped conductive structures are positioned according to an equal pitch as measured in a second direction perpendicular to the first direction, such that a distance as measured in the second direction between lengthwise centerlines of different ones of the first, second, fourth, and sixth linear-shaped conductive structures is an integer multiple of the equal pitch, and
wherein the first, third, fifth, and sixth linear-shaped conductive structures are positioned according to the equal pitch as measured in the second direction, such that a distance as measured in the second direction between lengthwise centerlines of different ones of the first, third, fifth and sixth linear-shaped conductive structures is an integer multiple of the equal pitch,
wherein the second linear-shaped conductive structure is fabricated to be substantially co-aligned with the third linear-shaped conductive structure along a common line of extent in the first direction, and wherein the second linear-shaped conductive structure is fabricated to be separated from the third linear-shaped conductive structure by a first line end spacing distance,
wherein the fourth linear-shaped conductive structure is fabricated to be substantially co-aligned with the fifth linear-shaped conductive structure along another common line of extent in the first direction, and wherein the fourth linear-shaped conductive structure is fabricated to be separated from the fifth linear-shaped conductive structure by a second line end spacing distance,
wherein the second linear-shaped conductive structure is positioned next to and spaced apart from the first linear-shaped conductive structure, and
wherein the fourth linear-shaped conductive structure is positioned next to and spaced apart from the sixth linear-shaped conductive structure.

22. A method for fabricating an integrated circuit as recited in claim 21, further comprising:
electrically connecting the third and fourth linear-shaped conductive structures to each other through one or more conductive structures located within a level of the integrated circuit other than a gate electrode level, wherein the gate electrode level includes the gate electrode level region.

23. A method for fabricating an integrated circuit as recited in claim 22, wherein the third linear-shaped conductive structure is positioned within 360 nanometers of the fourth linear-shaped conductive structure.

24. A method for fabricating an integrated circuit as recited in claim 21, wherein the at least six linear-shaped conductive structures within the gate electrode level region are fabricated to include a seventh linear-shaped conductive structure that does not form a gate electrode of a transistor.

25. A method for fabricating an integrated circuit as recited in claim 24, wherein the at least six linear-shaped conductive structures within the gate electrode level region are fabricated to include an eighth linear-shaped conductive structure positioned next to and spaced apart from the seventh linear-shaped conductive structure, wherein the eighth linear-shaped conductive structure includes a first gate portion that forms a gate electrode of a fifth transistor of the first transistor type and a second gate portion that forms a gate electrode of a fifth transistor of the second transistor type.

26. A method for fabricating an integrated circuit as recited in claim 24, wherein the seventh linear-shaped conductive structure is fabricated to have a size as measured in a second direction perpendicular to the first direction that is substantially equal to a size of a neighboring linear-shaped conductive structure as measured in the second direction, wherein the neighboring linear-shaped conductive structure is positioned next to and spaced apart from the seventh linear-shaped conductive structure.

27. A method for fabricating an integrated circuit as recited in claim 21, wherein the first line end spacing distances is less than or equal to 240 nanometers.

28. A method for fabricating an integrated circuit as recited in claim 27, wherein the second line end spacing distances is less than or equal to 240 nanometers.

29. A method for fabricating an integrated circuit as recited in claim 28, wherein each of the second and third transistors of the first transistor type is formed in part by a shared diffusion region of a first diffusion type,
wherein each of the second and third transistors of the second transistor type is formed in part by a shared diffusion region of a second diffusion type, and
wherein the shared diffusion region of the first diffusion type is electrically connected to the shared diffusion region of the second diffusion type.

30. A method for fabricating an integrated circuit as recited in claim 29, further comprising:
electrically connecting the shared diffusion region of the first diffusion type to the shared diffusion region of the second diffusion type through a first linear-shaped conductive interconnect structure formed to extend lengthwise in the second direction.

31. A method for fabricating an integrated circuit as recited in claim 30, further comprising:
electrically connecting the shared diffusion region of the first diffusion type to the shared diffusion region of the second diffusion type through a second linear-shaped conductive interconnect structure formed to extend lengthwise in the first direction.

32. A method for fabricating an integrated circuit as recited in claim 21, wherein two of the second, third, fourth, and fifth linear-shaped conductive structures are fabricated to have different lengths as measured in the first direction.

33. A method for fabricating an integrated circuit as recited in claim 32, wherein one of the first and sixth linear-shaped conductive structures is fabricated to have a respective end aligned to a first position in the first direction, and wherein two of the second, third, fourth, and fifth linear-shaped conductive structures each is fabricated to have a respective end aligned to the first position in the first direction.

34. A method for fabricating an integrated circuit as recited in claim 33, wherein the at least six linear-shaped conductive structures within the gate electrode level region are fabricated to include a seventh linear-shaped conductive structure that does not form a gate electrode of a transistor.

35. A method for fabricating an integrated circuit as recited in claim 34, wherein each of the second, third, fourth, and fifth linear-shaped conductive structures is positioned between the first and sixth linear-shaped conductive structures in the second direction perpendicular to the first direction.

36. A method for fabricating an integrated circuit as recited in claim 34, wherein the seventh linear-shaped conductive structure is positioned next to and spaced apart from either the first linear-shaped conductive structure or the sixth linear-shaped conductive structure.

37. A method for fabricating an integrated circuit as recited in claim 36, wherein the at least six linear-shaped conductive structures within the gate electrode level region are fabricated to include an eighth linear-shaped conductive structure positioned next to and spaced apart from the seventh linear-shaped conductive structure, wherein the eighth linear-shaped conductive structure includes a first gate portion that forms a gate electrode of a fifth transistor of the first transistor type and a second gate portion that forms a gate electrode of a fifth transistor of the second transistor type.

38. A method for fabricating an integrated circuit as recited in claim 21, wherein three of the second, third, fourth, and fifth linear-shaped conductive structures are fabricated to have different lengths as measured in the first direction.

39. A method for fabricating an integrated circuit as recited in claim 38, wherein one of the first and sixth linear-shaped conductive structures is fabricated to have a respective end aligned to a first position in the first direction, and wherein two of the second, third, fourth, and fifth linear-shaped conductive structures each is fabricated to have a respective end aligned to the first position in the first direction.

40. A method for fabricating an integrated circuit as recited in claim 39, wherein the at least six linear-shaped conductive structures within the gate electrode level region are fabricated to include a seventh linear-shaped conductive structure that does not form a gate electrode of a transistor.

41. A method for fabricating an integrated circuit as recited in claim 40, wherein each of the second, third, fourth, and fifth linear-shaped conductive structures is positioned between the first and sixth linear-shaped conductive structures in the second direction perpendicular to the first direction.

42. A method for fabricating an integrated circuit as recited in claim 40, wherein the seventh linear-shaped conductive structure is positioned next to and spaced apart from either the first linear-shaped conductive structure or the sixth linear-shaped conductive structure.

43. A method for fabricating an integrated circuit as recited in claim 42, wherein the at least six linear-shaped conductive structures within the gate electrode level region are fabricated to include an eighth linear-shaped conductive structure positioned next to and spaced apart from the seventh linear-shaped conductive structure, wherein the eighth linear-shaped conductive structure includes a first gate portion that forms a gate electrode of a fifth transistor of the first transistor type and a second gate portion that forms a gate electrode of a fifth transistor of the second transistor type.

44. A method for fabricating an integrated circuit as recited in claim 21, further comprising:
fabricating a first conductive contacting structure to physically connect to the second linear-shaped conductive segment, wherein the first conductive contacting structure is positioned a first connection distance away from the gate portion that forms the gate electrode of the second transistor of the first transistor type as measured in the first direction;
fabricating a second conductive contacting structure to physically connect to the third linear-shaped conductive segment, wherein the second conductive contacting structure is positioned a second connection distance away from the gate portion that forms the gate electrode of the second transistor of the second transistor type as measured in the first direction;
fabricating a third conductive contacting structure to physically connect to the fourth linear-shaped conductive segment, wherein the third conductive contacting structure is positioned a third connection distance away from the gate portion that forms the gate electrode of the third transistor of the first transistor type as measured in the first direction; and
fabricating a fourth conductive contacting structure to physically connect to the fifth linear-shaped conductive segment, wherein the fourth conductive contacting structure is positioned a fourth connection distance away from the gate portion that forms the gate electrode of the third transistor of the second transistor type as measured in the first direction,
wherein at least two of the first, second, third, and fourth connection distances are different.

45. A method for fabricating an integrated circuit as recited in claim 44, wherein two of the second, third, fourth, and fifth linear-shaped conductive structures are fabricated to have different lengths as measured in the first direction.

46. A method for fabricating an integrated circuit as recited in claim 45, wherein the at least six linear-shaped conductive structures within the gate electrode level region are fabricated to include a seventh linear-shaped conductive structure that does not form a gate electrode of a transistor.

47. A method for fabricating an integrated circuit as recited in claim 46, further comprising:
electrically connecting the third linear-shaped conductive structure connected to the fourth linear-shaped conductive structure through one or more conductive structures located within a level of the integrated circuit other than a gate electrode level, wherein the gate electrode level includes the gate electrode level region.

48. A method for fabricating an integrated circuit as recited in claim 47, wherein each of the second, third, fourth, and fifth linear-shaped conductive structures is positioned between the first and sixth linear-shaped conductive structures in the second direction perpendicular to the first direction.

49. A method for fabricating an integrated circuit as recited in claim 47, wherein the seventh linear-shaped conductive structure is positioned next to and spaced apart from either the first linear-shaped conductive structure or the sixth linear-shaped conductive structure.

50. A method for fabricating an integrated circuit as recited in claim 49, wherein the at least six linear-shaped conductive structures within the gate electrode level region are fabricated to include an eighth linear-shaped conductive structure positioned next to and spaced apart from the seventh linear-shaped conductive structure, wherein the eighth linear-shaped conductive structure includes a first gate portion that forms a gate electrode of a fifth transistor of the first transistor type and a second gate portion that forms a gate electrode of a fifth transistor of the second transistor type.

51. A method for fabricating an integrated circuit as recited in claim 50, wherein at least three of the first, second, third, and fourth connection distances are different.

52. A method for fabricating an integrated circuit as recited in claim 51, wherein two of the second, third, fourth, and fifth linear-shaped conductive structures have different lengths as measured in the first direction.

53. A method for fabricating an integrated circuit as recited in claim 52, wherein the at least six linear-shaped conductive structures within the gate electrode level region are fabricated to include a seventh linear-shaped conductive structure that does not form a gate electrode of a transistor.

54. A method for fabricating an integrated circuit as recited in claim 53, wherein each of the second, third, fourth, and fifth linear-shaped conductive structures is positioned between the first and sixth linear-shaped conductive structures in the second direction perpendicular to the first direction.

55. A method for fabricating an integrated circuit as recited in claim 53, wherein the seventh linear-shaped conductive structure is positioned next to and spaced apart from either the first linear-shaped conductive structure or the sixth linear-shaped conductive structure.

56. A method for fabricating an integrated circuit as recited in claim 55, wherein the at least six linear-shaped conductive structures within the gate electrode level region are fabricated to include an eighth linear-shaped conductive structure positioned next to and spaced apart from the seventh linear-shaped conductive structure, wherein the eighth linear-shaped conductive structure includes a first gate portion that forms a gate electrode of a fifth transistor of the first transistor type and a second gate portion that forms a gate electrode of a fifth transistor of the second transistor type.

* * * * *